(12) United States Patent
Liu

(10) Patent No.: US 10,310,609 B2
(45) Date of Patent: Jun. 4, 2019

(54) KEYSWITCH WITH ADJUSTABLE TACTILE FEEDBACK

(71) Applicant: DARFON ELECTRONICS CORP., Taoyuan (TW)

(72) Inventor: Chia-Hung Liu, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 150 days.

(21) Appl. No.: 15/697,438

(22) Filed: Sep. 6, 2017

(65) Prior Publication Data
US 2018/0074587 A1     Mar. 15, 2018

(30) Foreign Application Priority Data

Sep. 13, 2016    (TW) .............................. 105129748 A

(51) Int. Cl.
| | |
|---|---|
| *G06F 3/01* | (2006.01) |
| *H03K 17/96* | (2006.01) |
| *G06F 3/02* | (2006.01) |
| *H01H 13/85* | (2006.01) |

(52) U.S. Cl.
CPC ............ *G06F 3/016* (2013.01); *G06F 3/0202* (2013.01); *H01H 13/85* (2013.01); *H03K 17/9643* (2013.01); *H01H 2215/028* (2013.01); *H01H 2227/034* (2013.01); *H01H 2231/008* (2013.01); *H01H 2233/002* (2013.01)

(58) Field of Classification Search
CPC ....... G06F 3/016; G06F 3/0202; H01H 13/85; H03K 17/9643
USPC .......................................................... 200/521
See application file for complete search history.

(56) References Cited

U.S. PATENT DOCUMENTS

| | | | | | |
|---|---|---|---|---|---|
| 5,173,578 | A | * | 12/1992 | Tama .................... | H01H 13/705 200/250 |
| 5,380,970 | A | * | 1/1995 | Mizuno ................ | H01H 13/562 200/517 |
| 5,442,152 | A | * | 8/1995 | Huang ................. | H01H 13/705 200/341 |
| 5,938,009 | A | * | 8/1999 | Huang ................. | H01H 13/705 200/345 |

(Continued)

FOREIGN PATENT DOCUMENTS

| | | |
|---|---|---|
| CN | 203536260 U | 4/2014 |
| CN | 103808498 A | 5/2014 |

*Primary Examiner* — Edwin A. Leon
*Assistant Examiner* — Iman Malakooti
(74) *Attorney, Agent, or Firm* — Winston Hsu

(57) ABSTRACT

A keyswitch includes a cap, internal and external sleeves, a resilient arm, a base having a pillar, and an elastic member abutting against the internal sleeve and the base. The internal sleeve jackets the pillar, abuts against the cap and has a first outer annular surface with a transverse slot. The external sleeve jackets the internal sleeve and has a protruding block movably inserted into the transverse slot for guiding the external sleeve to rotate and a second outer annular surface having concave and convex portions and an arc-shaped bar. When the resilient arm abuts against a second position on the convex portion and the cap presses the external sleeve, the resilient arm crosses the arc-shaped bar. When the resilient arm abuts against a first position on the convex portion and the cap presses the external sleeve, the resilient arm does not need to cross the arc-shaped bar.

24 Claims, 49 Drawing Sheets

(56) References Cited

U.S. PATENT DOCUMENTS 6,445,279 B1 *  9/2002  Lin .................... H01C 10/32
                                              338/162

* cited by examiner

KEYSWITCH WITH ADJUSTABLE TACTILE FEEDBACK

BACKGROUND OF THE INVENTION

1. Field of the Invention

The present invention relates to a keyswitch, and more specifically, to a keyswitch with an adjustable tactile feedback via rotation of an external sleeve relative to a base.

2. Description of the Prior Art

A keyboard, which is the most common input device, can be found in variety of electronic apparatuses for users to input characters, symbols, numerals and so on. Furthermore, consumer electronic products to industrial machine tools are all equipped with a keyboard for performing input operations.

In practical application, there are various kinds of keyswitches for providing different tactile feedbacks. For example, a gaming keyboard would indicate that it has red, brown or black keyswitches installed thereon on its packing box to remind the user of what kind of tactile feedback (e.g. high or low triggering position, long or short travel distance, required actuation force, tactile or linear feedback, clicky or non-clicky tactile feedback, etc.) the gaming keyboard can provide. That is to say, a conventional mechanical keyswitch can only provide one single kind of tactile feedback without a tactile feedback adjusting function. Thus, if the user wants to experience different kinds of tactile feedbacks, the user must buy a new keyboard or replace the original keyswitches on the gaming keyboard with new keyswitches for providing another kind of tactile feedback. In such a manner, it would cause a high replacement cost, greatly limiting flexibility in use and operational convenience of the mechanical keyswitch.

SUMMARY OF THE INVENTION

The present invention provides a keyswitch. The keyswitch includes a cap, a base, a resilient arm, an internal sleeve, an external sleeve, and an elastic member. The base has a pillar extending along a Z-axis. The Z-axis, an X-axis and a Y-axis are perpendicular to each other. The resilient arm is adjacent to the pillar. The internal sleeve jackets the pillar and has a first outer annular surface. A top end of the internal sleeve abuts against the cap. A transverse slot is formed on the first outer annular surface and extends substantially along a plane containing the X-axis and the Y-axis. The elastic member is disposed between the internal sleeve and the base for driving the internal sleeve to move away from the base. The external sleeve has a second outer annular surface and an inner annular surface and jackets the internal sleeve via the inner annular surface. The second outer annular surface has a convex portion, a concave portion, and a first arc-shaped bar. The convex portion, the concave portion, and the first arc-shaped bar extend substantially along the plane containing the X-axis and the Y-axis. A protruding block is formed on the inner annular surface and is movably inserted into the transverse slot for guiding the external sleeve to rotate around the Z-axis to make the resilient arm selectively abutting against a first position or a second position on the convex portion. The first arc-shaped bar extends above the second position without extending above the first position. When the resilient arm initially abuts against the second position and the cap is pressed, the cap makes the external sleeve move downward along the Z-axis, and then the resilient arm needs to cross the first arc-shaped bar as the resilient arm moves from the second position to the concave portion. When the resilient arm initially abuts against the first position and the cap is pressed, the cap makes the external sleeve move downward along the Z-axis, and then the resilient arm does not need to cross the first arc-shaped bar during movement of the resilient arm from the first position to the concave portion. When the cap is released, the elastic member drives the internal sleeve to move upward, and the internal sleeve makes the external sleeve move upward simultaneously to make a location where the resilient arm abuts against the external sleeve return to one of the first position and the second position.

The present invention provides a keyswitch. The keyswitch includes a cap, a base, a resilient arm, an internal sleeve, an external sleeve, and an elastic member. The base has a pillar, a top surface, and a first block. The pillar extends along a Z-axis. The first block is adjacent to the pillar and is higher than the top surface along the Z-axis. The Z-axis, an X-axis and a Y-axis are perpendicular to each other. The resilient arm is adjacent to the pillar. The internal sleeve jackets the pillar. An upper end of the internal sleeve abuts against the cap. The internal sleeve has a first outer annular surface. A transverse slot is formed on the first outer annular surface and extends substantially along a plane containing the X-axis and the Y-axis. The elastic member is disposed between the internal sleeve and the base for driving the internal sleeve to move away from the base. The external sleeve has a second outer annular surface and an inner annular surface and jackets the internal sleeve via the inner annular surface. A bottom end of the external sleeve has a bottom annular edge. A protruding point extends from the bottom annular edge toward the base. The second outer annular surface has a convex portion and a concave portion. The convex portion and the concave portion extend substantially along the plane containing the X-axis and the Y-axis. A protruding block is formed on the inner annular surface and is movably inserted into the transverse slot for guiding the external sleeve to rotate around the Z-axis to make the protruding block selectively located above the first block or the top surface. When the protruding point is located above the first block and the cap is pressed, the protruding block makes the external sleeve move downward with the internal sleeve until the protruding point abuts against the first block, so that a maximum movable distance of the cap along the Z-axis is set as a first travel distance. When the protruding point is located above the top surface and the cap is pressed, the protruding block makes the external sleeve move downward with the internal sleeve until the protruding point abuts against the top surface, so that the maximum movable distance of the cap along the Z-axis is set as a second travel distance larger than the first travel distance. When the cap is released, the elastic member drives the internal sleeve to move upward with the external sleeve along the Z-axis relative to the pillar to make the cap move upward.

The present invention further provides a keyswitch. The keyswitch includes a cap, a base, a switch unit, an internal sleeve, an elastic member, and an external sleeve. The base has a pillar extending along a Z-axis. The Z-axis, an X-axis and a Y-axis are perpendicular to each other. The switch unit is adjacent to the pillar. The switch unit has a resilient arm and a contact point opposite to the resilient arm. The contact point and the resilient arm extend toward the cap respectively. The switch unit is electrically connected to a circuit board. The internal sleeve jackets the pillar. An upper end of the internal sleeve abuts against the cap. The internal sleeve has a first outer annular surface. A transverse slot is formed on the first outer annular surface and extends substantially along a plane containing the X-axis and the Y-axis. The elastic member is disposed between the internal sleeve and the base for driving the internal sleeve to move away from the base. The external sleeve has a second outer annular surface and an inner annular surface and jackets the internal sleeve via the inner annular surface. The second outer annular surface has a first convex portion, a first concave portion, a second convex portion, a second concave portion, a first transition portion, and a second transition portion higher than the first transition portion along the Z-axis. The first convex portion, the first transition portion and the first concave portion are arranged from down to up along the Z-axis. The second convex portion, the second transition portion and the second concave portion are arranged from down to up along the Z-axis. A protruding block is formed on the inner annular surface and is movably inserted into the transverse slot for guiding the external sleeve to rotate around the Z-axis to make the resilient arm selectively abutting against the first convex portion or the second convex portion. When the resilient arm abuts against the first convex portion and the cap is pressed, the protruding block makes the external sleeve move downward with the internal sleeve to make the resilient arm move from the first convex portion to the first concave portion along the first transition portion for reducing deformation of the resilient arm to make the resilient arm be located at a first triggering position for triggering the contact point. When the resilient arm abuts against the second convex portion and the cap is pressed, the protruding block makes the external sleeve move downward with the internal sleeve to make the resilient arm move from the second convex portion to the second concave portion along the second transition portion for reducing deformation of the resilient arm to make the resilient arm be located at a second triggering position for triggering the contact point. When the cap is released, the elastic member drives the internal sleeve to move upward with the external sleeve relative to the pillar to make the resilient arm abut against the first convex portion or the second convex portion to be separate from the contact point.

The present invention further provides a keyswitch. The keyswitch includes a cap, a base, a resilient arm, an internal resilient arm, an external resilient arm, and an elastic member. The base has a pillar extending along a Z-axis. The Z-axis, an X-axis and a Y-axis are perpendicular to each other. The resilient arm is adjacent to the pillar. The internal sleeve jackets the pillar. An upper end of the internal sleeve abuts against the cap. The internal sleeve has a first outer annular surface. An oblique slot is formed on the first outer annular surface and has a first slot section and a second slot section higher than the first slot section along the Z-axis. The elastic member is disposed between the internal sleeve and the base for driving the internal sleeve to move away from the base. The external sleeve has a second outer annular surface and an inner annular surface and jackets the internal sleeve via the inner annular surface. The second outer annular surface has a convex portion and a concave portion. A protruding block is formed from the external sleeve toward the oblique slot and is movably inserted into the oblique slot for guiding the external sleeve to rotate around the Z-axis to make the resilient arm selectively abutting against a first position or a second position on the convex portion. When the resilient arm abuts against the first position, the protruding block is located at the first slot section to make the internal sleeve prepress the elastic member at a first length for generating a first preload. When the cap is pressed along the Z-axis to move the external sleeve downward with the internal sleeve via the protruding block, the resilient arm moves from the first position to the concave portion. When the resilient arm abuts against the second position, the protruding block is located at the second slot section to make the internal sleeve prepress the elastic member at a second length for generating a second preload, the first length is larger than the second length to make the first preload smaller than the second preload. When the cap is pressed along the Z-axis to move the external sleeve downward with the internal sleeve via the protruding block, the resilient arm moves from the second position to the concave portion. When the cap is released, the elastic member drives the internal sleeve to move upward with the external sleeve relative to the pillar to make the resilient arm abut against the first position or the second position on the convex portion.

The present invention further provides a keyswitch. The keyswitch includes a cap, a base, a resilient arm, an internal resilient arm, an external resilient arm, and an elastic member. The base has a pillar extending along a Z-axis. The Z-axis, an X-axis and a Y-axis are perpendicular to each other. The resilient arm is adjacent to the pillar. The internal sleeve jackets the pillar. An upper end of the internal sleeve abuts against the cap. The internal sleeve has a first outer annular surface. A transverse slot and a longitudinal slot are formed on the first outer annular surface. The transverse slot extends substantially along a plane containing the X-axis and the Y-axis. The longitudinal slot has a top portion and a bottom portion. The top portion of the longitudinal slot is interconnected with the transverse slot. The elastic member is disposed between the internal sleeve and the base for driving the internal sleeve to move away from the base. The external sleeve has a second outer annular surface and an inner annular surface and jackets the internal sleeve via the inner annular surface. The second outer annular surface has a convex portion, a concave portion, and an arc-shaped bar. The convex portion, the concave portion, and the arc-shaped bar extend along the plane containing the X-axis and the Y-axis. A protruding block is formed on the inner annular surface and is movably inserted into the transverse slot for guiding the external sleeve to rotate on the pillar around the Z-axis to make the resilient arm selectively abut against a first position or a second position on the convex portion. The arc-shaped bar extends above the second position and has a bottom edge surface and an upper edge surface. When the resilient arm abuts against the first position and the cap is pressed to move the external sleeve downward along the Z-axis, the protruding block is located in the transverse slot to make the external sleeve and the internal sleeve move downward during as the resilient arm moves from the first position to the concave portion to prevent the external sleeve from colliding with the internal sleeve to make a sound. When the resilient arm abuts against the second position and the cap is pressed to move the external sleeve downward along the Z-axis, the resilient arm abuts against the bottom edge surface to make the protruding block abut against the top portion of the longitudinal slot. When the resilient arm crosses the arc-shaped bar to abut against the upper edge surface, the resilient arm moves the external sleeve downward to collide with the bottom portion of the longitudinal slot for making a sound. When the cap is released, the elastic member drives the internal sleeve to move upward with the external sleeve relative to the pillar to make the resilient arm abut against the first position or the second position on the convex portion.

The present invention further provides a keyswitch. The keyswitch includes a cap, a base, a resilient arm, an internal resilient arm, an external resilient arm, and an elastic member. The base has a positioning structure extending along a Z-axis. The Z-axis, an X-axis and a Y-axis are perpendicular to each other. The resilient arm is adjacent to the positioning structure. The internal sleeve jackets the positioning structure. An upper end of the internal sleeve abuts against the cap. The internal sleeve has a first outer annular surface. A guide slot is formed on the first outer annular surface. The elastic member is disposed between the internal sleeve and the base for driving the internal sleeve to move away from the base. The external sleeve has a second outer annular surface and an inner annular surface and jackets the internal sleeve via the inner annular surface to be movable upwardly and downwardly between a high position and a low position along the Z-axis. The second outer annular surface has a first large radius portion, a first small radius portion, a second large radius portion, and a second small radius portion. A protruding block is formed on the inner annular surface and is movably inserted into the guide slot for guiding the external sleeve to rotate on the pillar around the Z-axis. The resilient arm selectively abuts against the first large radius portion or the second large radius portion when the external sleeve is located at the high position. When the resilient arm abuts against the first large radius portion and the cap is pressed to move the external sleeve downward along the Z-axis, the resilient arm moves from the first large radius portion to the first small radius portion along a first path and the first path interacts with the resilient arm to generate a first tactile feedback. When the resilient arm abuts against the second large radius portion and the cap is pressed to move the external sleeve downward along the Z-axis, the resilient arm moves from the second large radius portion to the second small radius portion along a second path and the second path interacts with the resilient arm to generate a second tactile feedback. The second path is different from the first path to make the first tactile feedback different from the second tactile feedback. When the cap is released, the elastic member drives the internal sleeve to move upward relative to the positioning structure along the Z-axis to make the resilient arm move back to abut against the first large radius portion or the second large radius portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
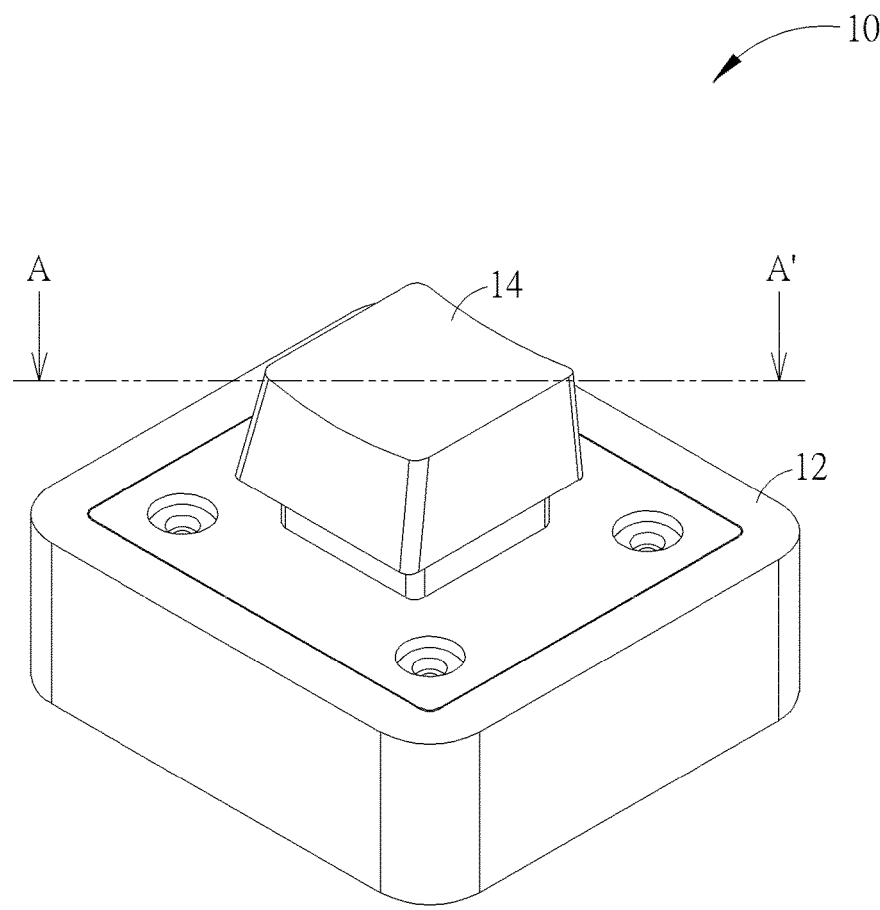
FIG. 1 is a diagram of a keyswitch according to an embodiment of the present invention.
Figure 2:
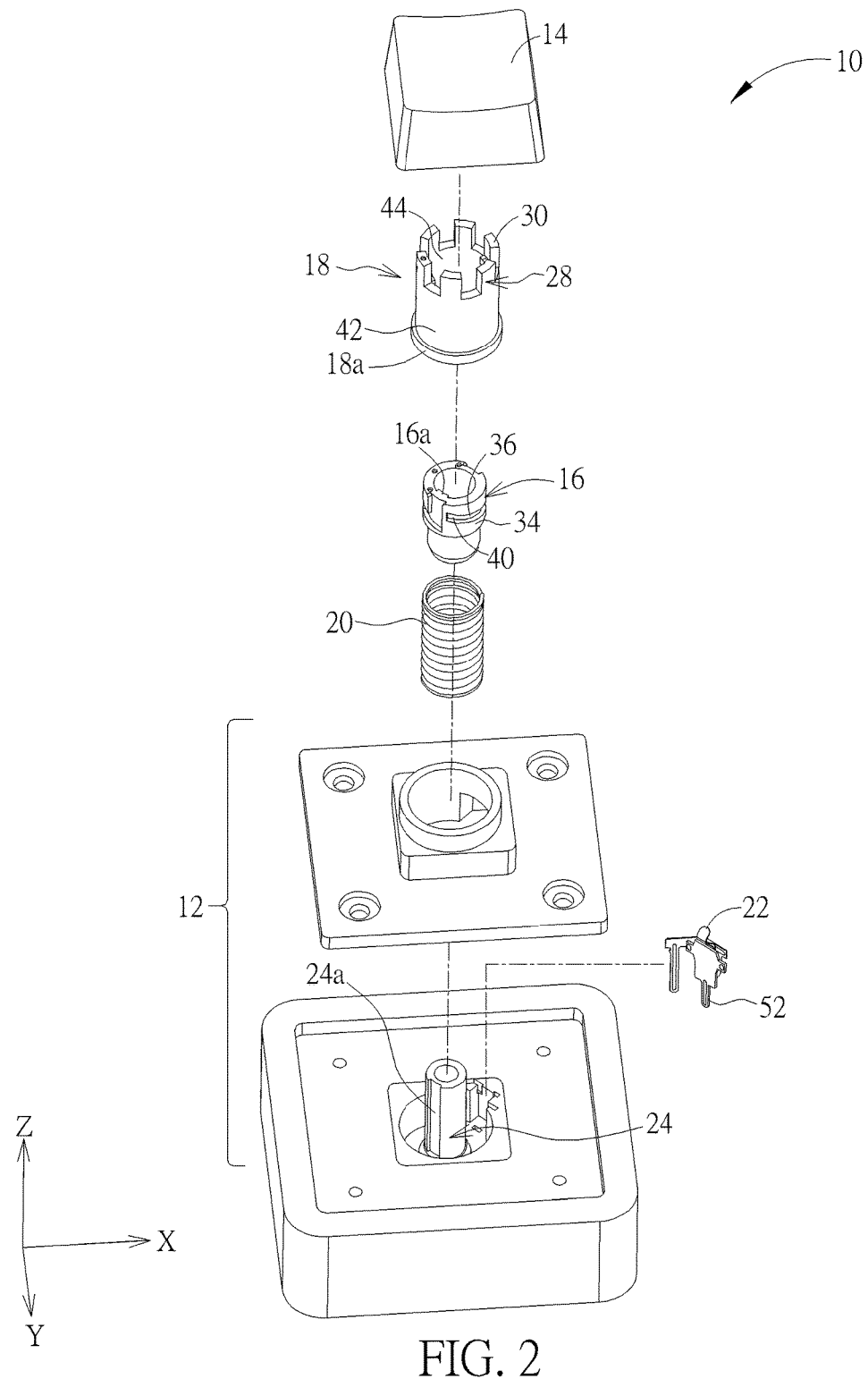
FIG. 2 is an exploded diagram of the keyswitch in FIG. 1.
Figure 3:
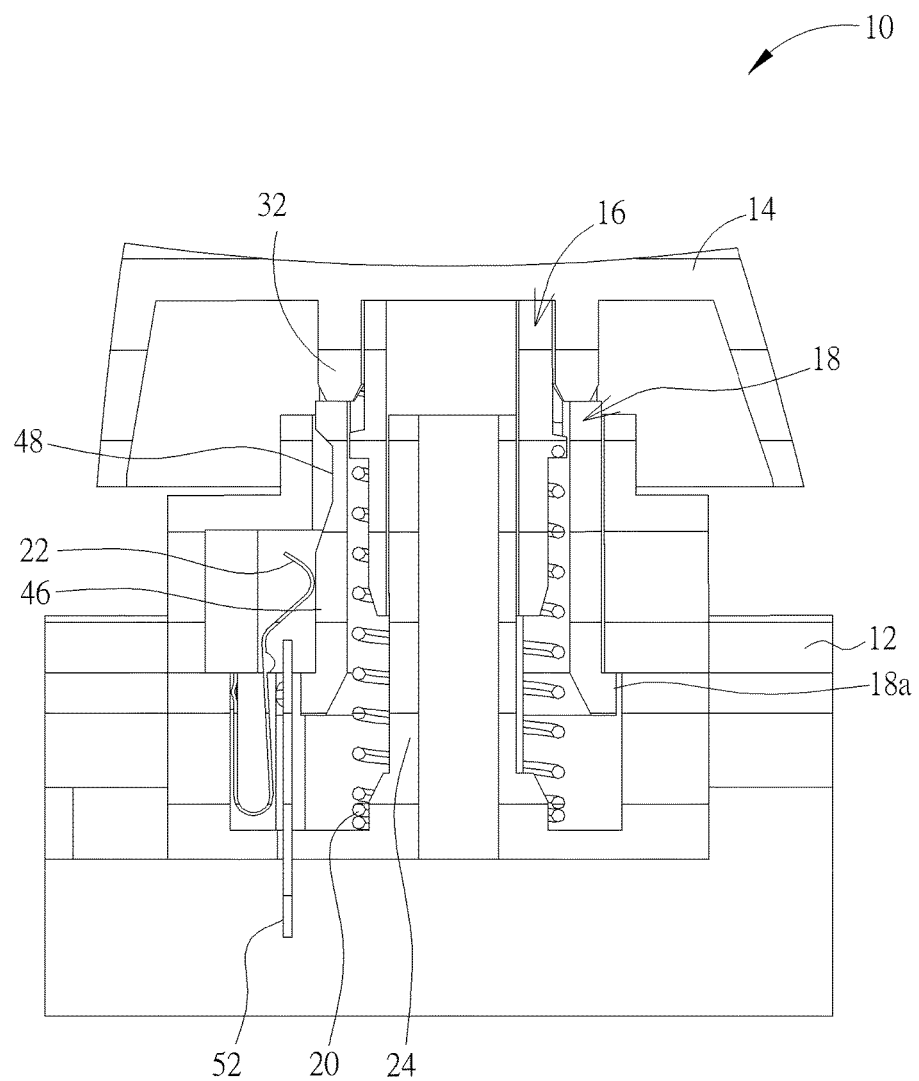
FIG. 3 is a cross-sectional diagram of the keyswitch in FIG. 1 along a cross-sectional line A-A'.
Figure 4:
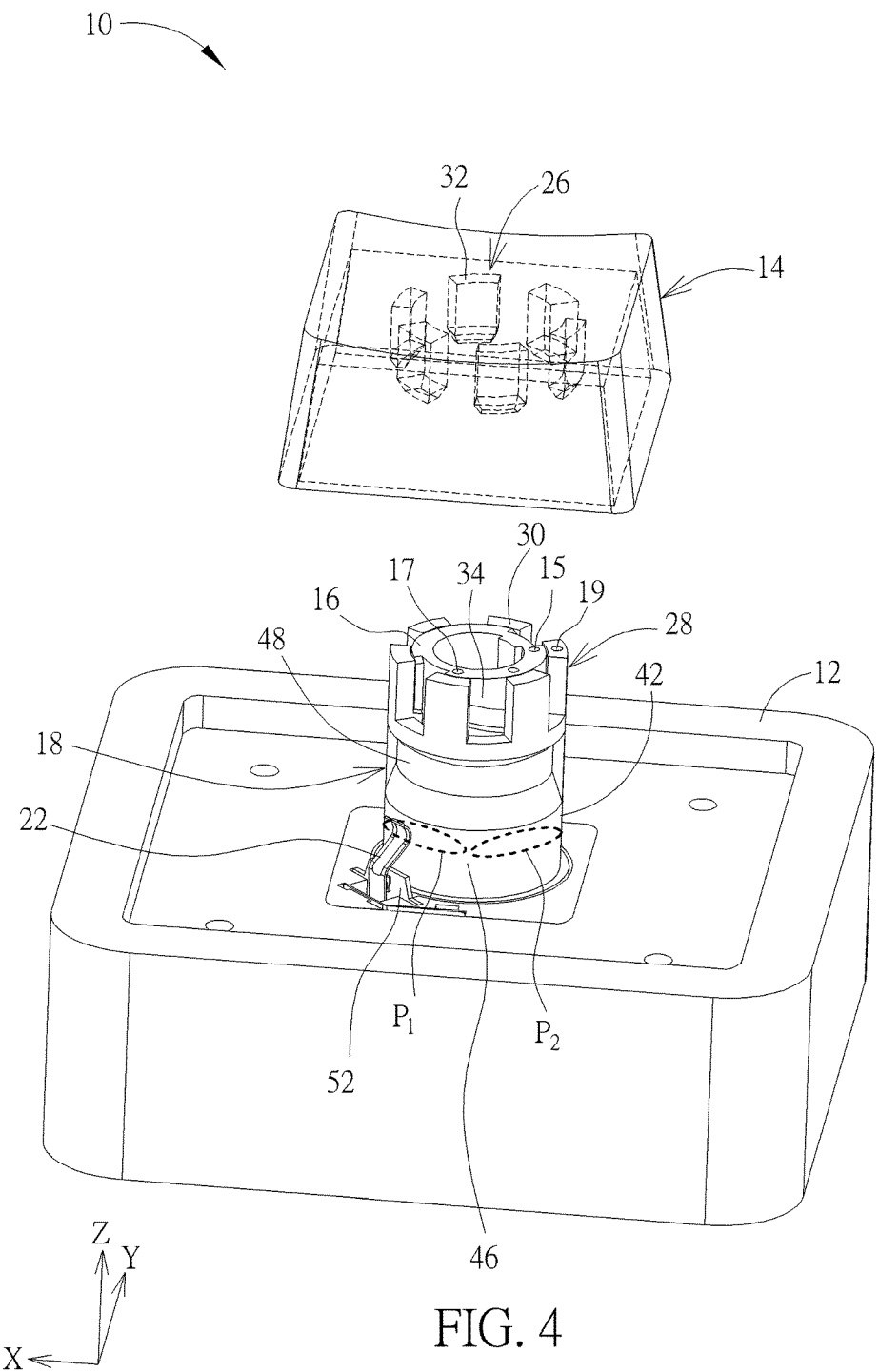
FIG. 4 is a partial exploded diagram of the keyswitch in FIG. 1.
Figure 5:
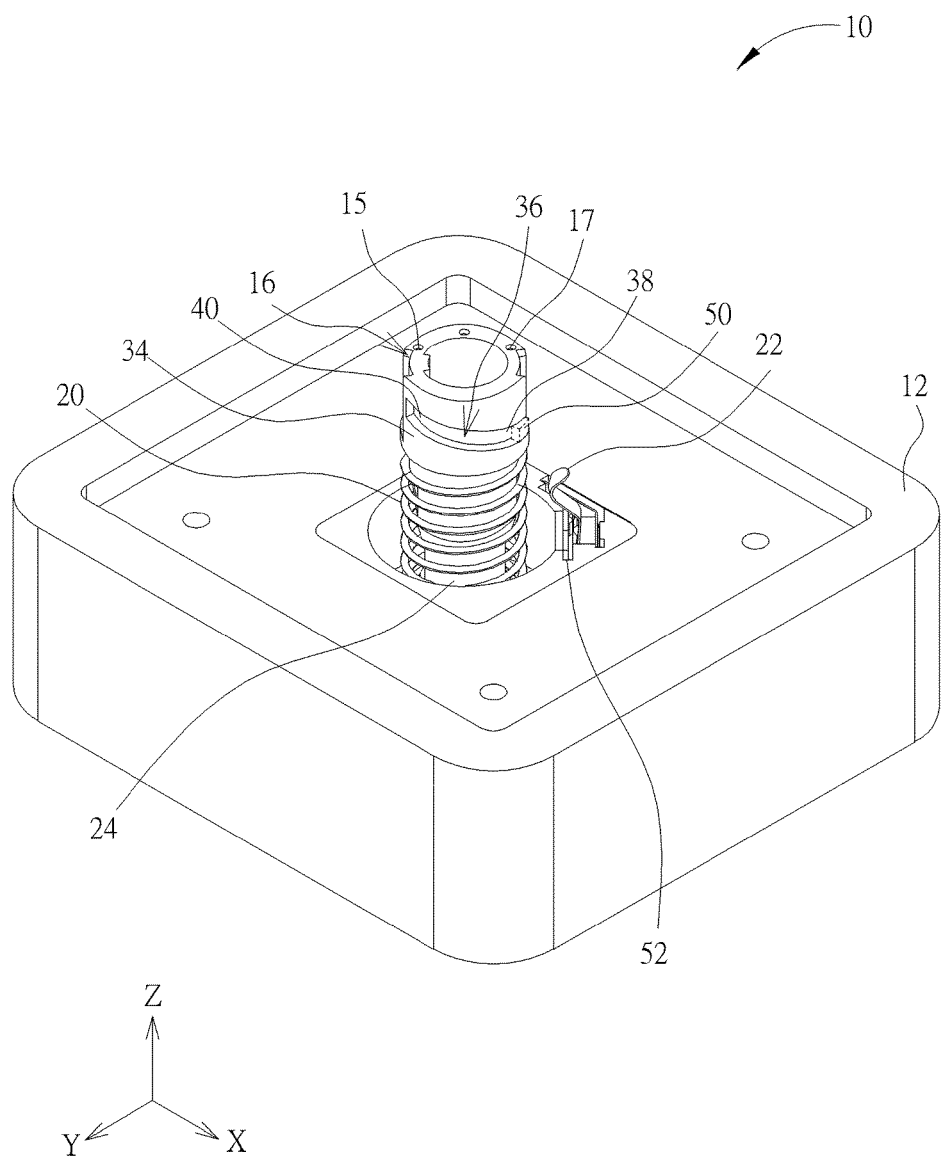
FIG. 5 is an internal diagram of the keyswitch in FIG. 1.
Figure 5A:
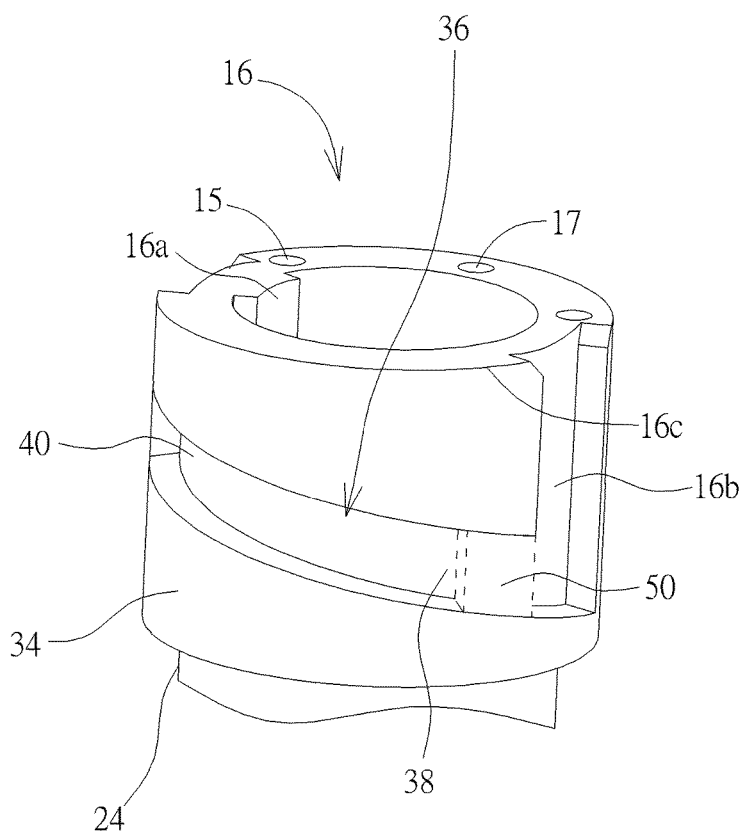
FIG. 5A is an enlarged diagram of a protruding block in FIG. 5 being inserted into an oblique slot 36.
Figure 5B:
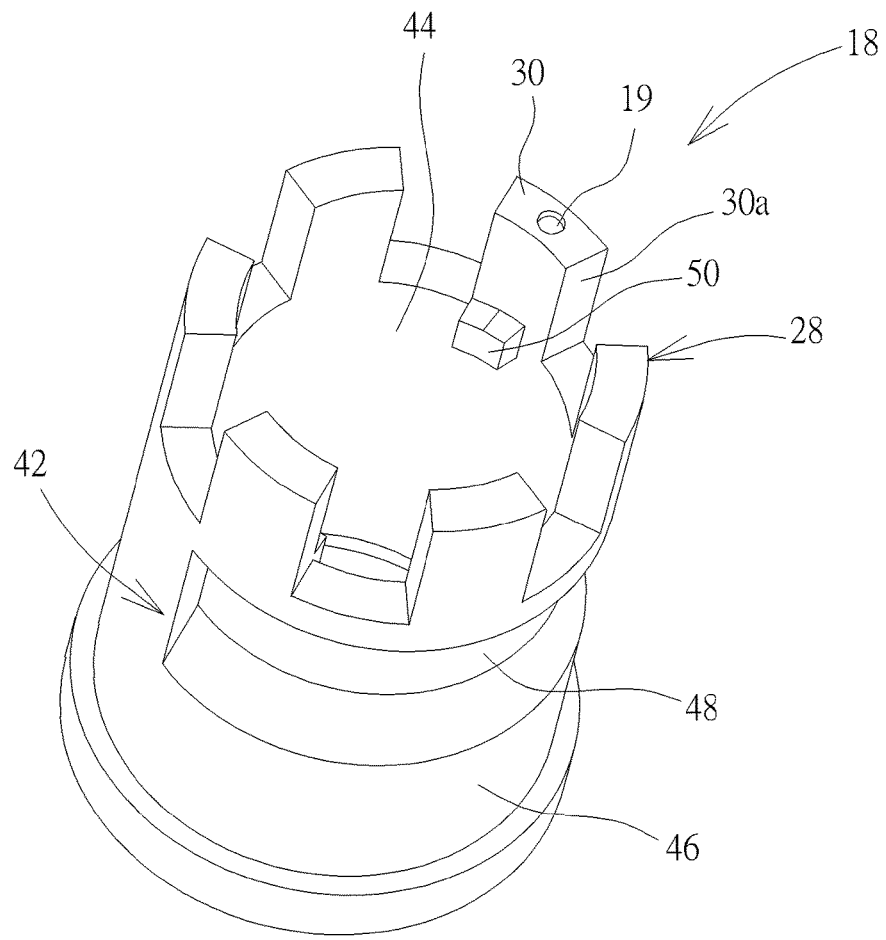
FIG. 5B is an enlarged diagram of an external sleeve in FIG. 2 from another viewing angle.
Figure 5C:
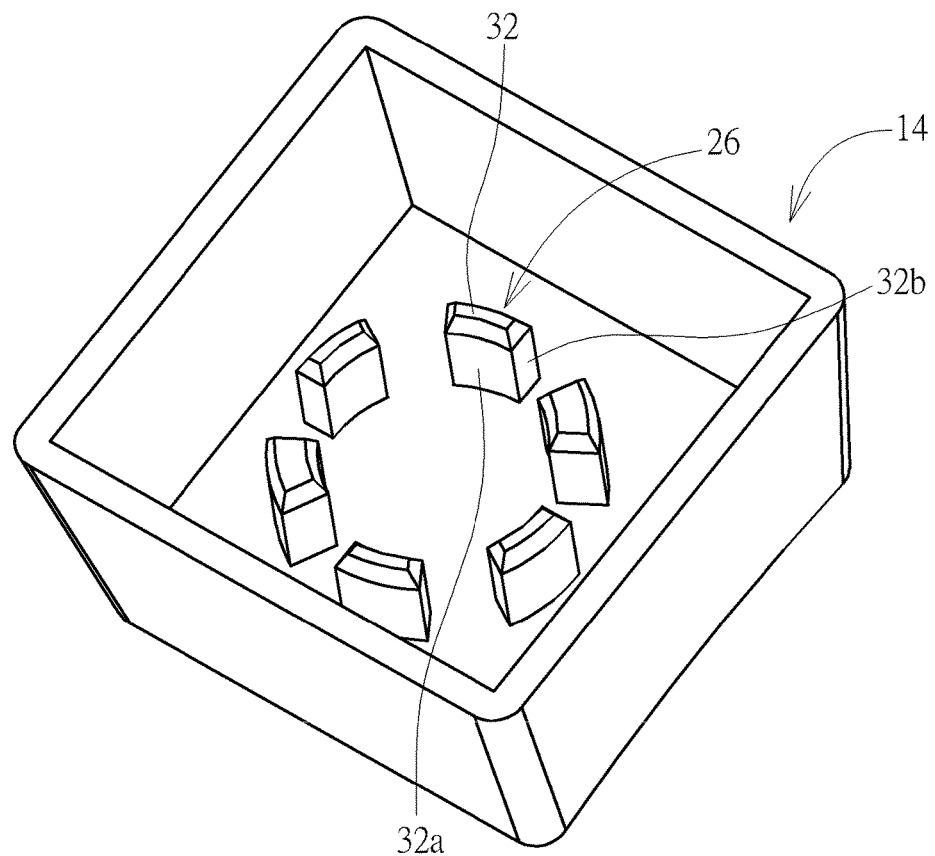
FIG. 5C is an enlarged diagram of a cap in FIG. 2 from another viewing angle.
Figure 5D:
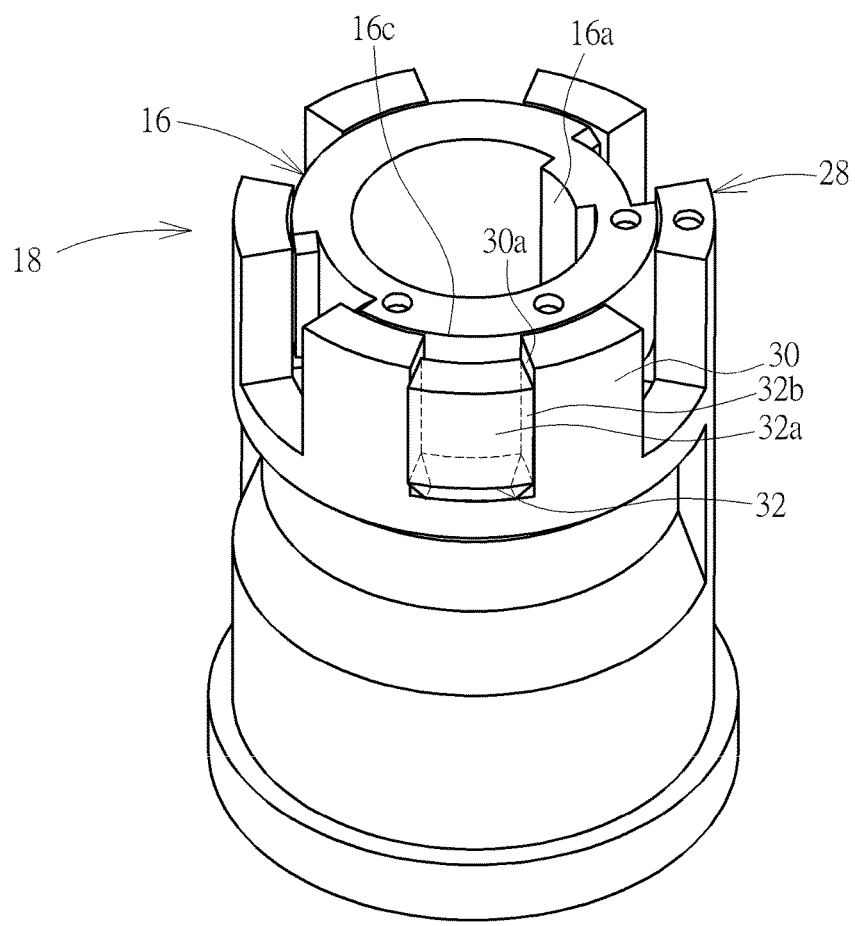
FIG. 5D is an assembly diagram of the cap, an internal sleeve, and the external sleeve in FIG. 2.
Figure 6:
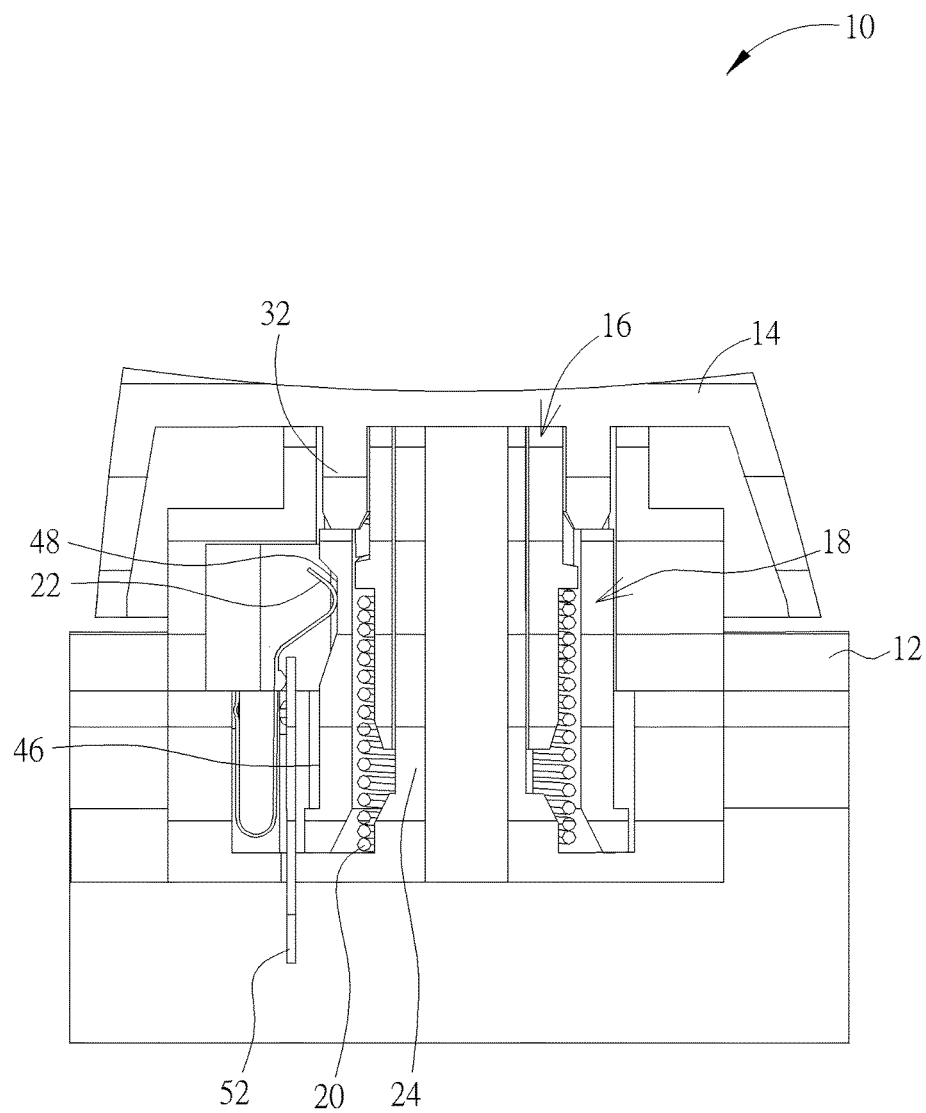
FIG. 6 is a cross-sectional diagram of the cap in FIG. 3 being pressed.

Please refer to FIG. 1, FIG. 2, FIG. 3, FIG. 4, FIG. 5, FIG. 5A, FIG. 5B, FIG. 5C, FIG. 5D, and FIG. 6. FIG. 1 is a diagram of a keyswitch 10 according to an embodiment of the present invention. FIG. 2 is an exploded diagram of the keyswitch 10 in FIG. 1. FIG. 3 is a cross-sectional diagram of the keyswitch 10 in FIG. 1 along a cross-sectional line A-A'. FIG. 4 is a partial exploded diagram of the keyswitch 10 in FIG. 1. FIG. 5 is an internal diagram of the keyswitch 10 in FIG. 1. FIG. 5A is an enlarged diagram of a protruding block 50 in FIG. 5 being inserted into an oblique slot 36. FIG. 5B is an enlarged diagram of an external sleeve 18 in FIG. 2 from another viewing angle. FIG. 5C is an enlarged diagram of a cap 14 in FIG. 2 from another viewing angle. FIG. 5D is an assembly diagram of the cap 14, an internal sleeve 16, and the external sleeve 18 in FIG. 2. For clearly showing the structural design of the internal sleeve 16 and the external sleeve 18, only one single comb tooth 32 is briefly depicted for the cap 14 in FIG. 5D. FIG. 6 is a cross-sectional diagram of the cap 14 in FIG. 3 being pressed. For clearly showing the internal mechanical design of the keyswitch 10, only bottom half structure is briefly depicted for a base 12 in FIGS. 4 and 5, and only the protruding block 50 is briefly depicted by dotted lines for the external sleeve 18 in FIG. 5.

As shown in FIG. 1, FIG. 2, FIG. 3, FIG. 4, FIG. 5, FIG. 5A, FIG. 5B, FIG. 5C, FIG. 5D, and FIG. 6, the keyswitch 10 includes the base 12, the cap 14, the internal sleeve 16, the external sleeve 18, an elastic member 20, and a resilient arm 22. The base 12 has a pillar 24 extending along a Z-axis as shown in FIG. 2. The Z-axis, an X-axis and a Y-axis are perpendicular to each other. The resilient arm 22 is adjacent to the pillar 24. The internal sleeve 16 and the elastic member 20 jacket the pillar 24. The internal sleeve 16 has an internal block 16a, an assembly opening 16b, and an upper outer edge 16c. As shown in FIG. 2, FIG. 5A and FIG. 5C, via coupling of the internal block 16a of the internal sleeve 16 with a groove 24a of the pillar 24, the internal sleeve 16 can only move relative to the pillar 24 along the Z-axis. The elastic member 20 abuts against the internal sleeve 16 and the base 12 respectively to drive the internal sleeve 16 to move away from the base 12.

As shown in FIGS. 2 and 3, a protruding edge 18a is formed on a bottom end of the external sleeve 18 for engaging with the base 12, to prevent the external sleeve 18 from falling out of the base 12 and constrain a height of the external sleeve 18 along the Z-axis. A cap engaging structure 26 is formed under the cap 14 and the external sleeve 18 has an upper engaging structure 28 formed thereon, so that the external sleeve 18 can be assembled with the cap 14 via engagement of the cap engaging structure 26 and the upper engaging structure 28. The cap engaging structure 26 could be preferably a first annular comb structure protruding downward from the cap 14 and can have a plurality of comb teeth 32. Each comb tooth 32 has an internal surface 32a and a side surface 32b. The upper engaging structure 28 could preferably be a second annular comb structure protruding upward from the external sleeve 18 and could have a plurality of comb teeth 30. Each comb tooth 30 has a side surface 30a.

When the cap engaging structure 26 (i.e. the first annular comb structure) is engaged with the upper engaging structure 28 (i.e. the second annular comb structure), the internal surface 32a of the first annular comb structure abuts against the upper outer edge 16c of the internal sleeve 16, and the side surface 32b of the first annular comb structure abuts against the side surface 30a of the second annular comb structure (as shown in FIG. 5D). Accordingly, the user could detach the cap 14 from the internal sleeve 16 and the external sleeve 18 conveniently. Moreover, via the aforesaid design, when downward moving distance of the internal sleeve 16 along the Z-axis is larger than downward moving distance of the external sleeve 18 along the Z-axis, the cap 14 could be assembled with the external sleeve 18 steadily, and when downward moving distance of the external sleeve 18 along the Z-axis is larger than downward moving distance of the internal sleeve 16 along the Z-axis, the cap 14 could be assembled with the internal sleeve 16 steadily.

In this embodiment, comb teeth 30 of the upper engaging structure 28 could be arranged symmetrically and spaced apart from each other at 60°, comb teeth 32 of the cap engaging structure 26 could be arranged symmetrically and spaced apart from each other at 60°, and the cap 14 could have a parallelogram contour. Accordingly, when the external sleeve 18 rotates 60°, the upper engaging structure 28 could still be engaged with the cap engaging structure 26 to ensure that the parallelogram contour of the cap 14 could be parallel to the X-axis and the Y-axis for preventing assembly of the cap 14 on the base 12 at a wrong angle.

Figure 9:
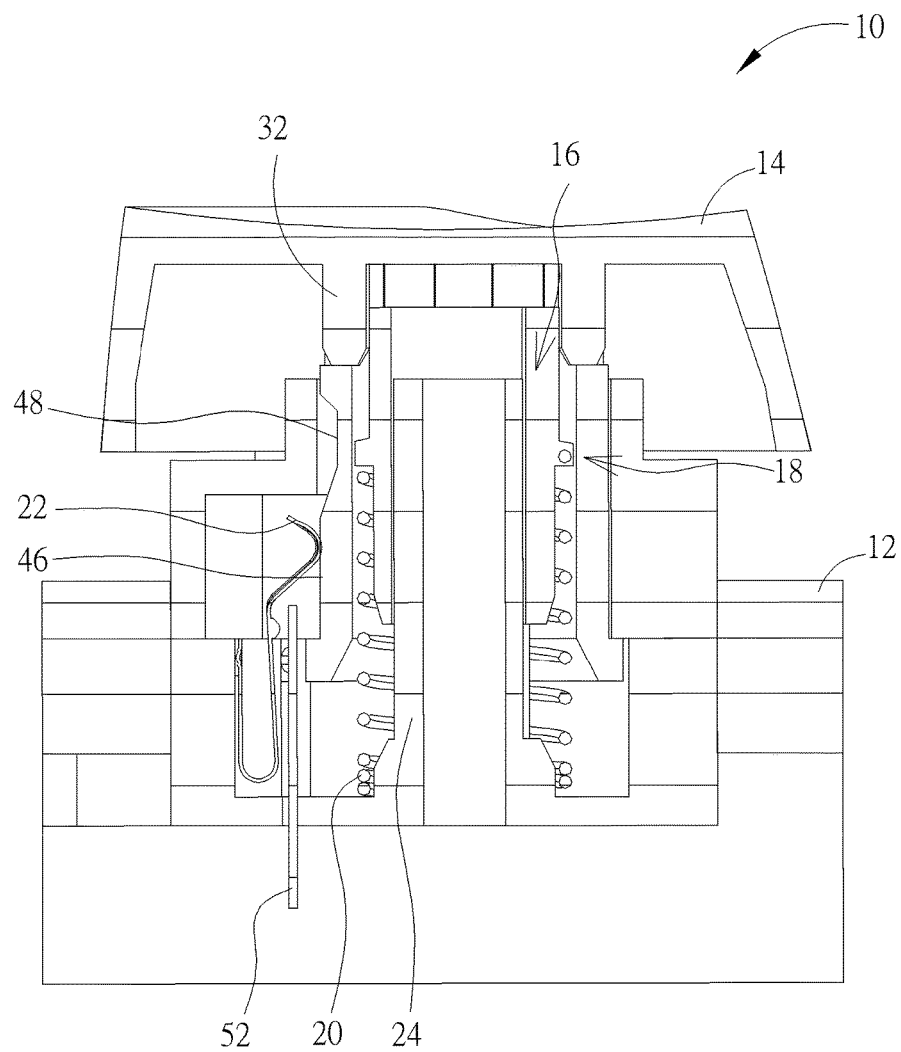
FIG. 9 is a cross-sectional diagram of keyswitch in FIG. 7 along a cross-sectional line B-B' when the cap is assembled with a base.

As shown in FIG. 3 and FIG. 9, when the cap 14 is not pressed, an initial height of the internal sleeve 16 along the Z-axis could be adjusted to change the length of the elastic member 20 for performing the preload adjustment operation of the keyswitch 10, and the external sleeve 18 and the cap 14 could remain the original height along the Z-axis via the aforesaid assembly of the cap 14 on the external sleeve 18. That is to say, even if the preload adjustment operation of the keyswitch 10 is performed, the height of each cap on a keyboard along the Z-axis could remain the same.

As shown in FIG. 4, FIG. 5, FIG. 5A, and FIG. 5B, the internal sleeve 16 has a first outer annular surface 34, and an oblique slot 36 is formed on the first outer annular surface 34. The oblique slot 36 has a first slot section 38 and a second slot section 40 higher than the first slot section 38 along the Z-axis. The external sleeve 18 has a second outer annular surface 42 and an inner annular surface 44. The external sleeve 18 jackets the internal sleeve 16 via the inner annular surface 44. A convex portion 46 and a concave portion 48 are formed on the second outer annular surface 42. A protruding block 50 protrudes from the external sleeve 18 toward the oblique slot 36 (as shown in FIG. 5B). The protruding block 50 is movably inserted into the oblique slot 36 (e.g. via guidance of the assembly opening 16b of the internal sleeve 16). Accordingly, the protruding block 50 could guide the external sleeve 18 to rotate around the Z-axis, to make the resilient arm 22 selectively abut against a first position $P_1$ or a second position $P_2$ on the convex portion 46.

Via the aforesaid designs, when the cap 14 is not pressed and the resilient arm 22 abuts against the first position $P_1$ (as shown in FIG. 4), the protruding block 50 is located at the first slot section 38 (as shown in FIG. 5 and FIG. 5A) to make the internal sleeve 16 prepress the elastic member 20 at a first length as shown in FIG. 3 for generating a first preload. Accordingly, when the user presses the cap 14, the keyswitch 10 could provide a tactile feedback with a relatively small preload.

In this embodiment, as shown in FIG. 3 and FIG. 6, the keyswitch 10 could further include a contact point 52 opposite to the resilient arm 22. The contact point 52 and the resilient arm 22 extend toward the cap 14 respectively and are electrically connected to a circuit board (not shown in the figures) of the keyswitch 10. To be more specific, when the cap 14 is located at a non-pressed position as shown in FIG. 3, the resilient arm 22 abuts against the first position $P_1$ on the convex portion 46 to cause outward deformation of the resilient arm 22 for generating a first amount of deformation to be separate from the contact point 52. When the cap 14 is pressed to a pressed position as shown in FIG. 6, the resilient arm 22 moves to abut against the concave portion 48. During this process, deformation of the resilient arm 22 is reduced to generate a second amount of deformation different from the first amount of deformation as shown in FIG. 3 to make the resilient arm 22 abut against the contact point 52. Accordingly, a corresponding input signal could be transmitted to the circuit board of the keyswitch 10, so that the keyswitch 10 could perform a corresponding input function.

Figure 7:
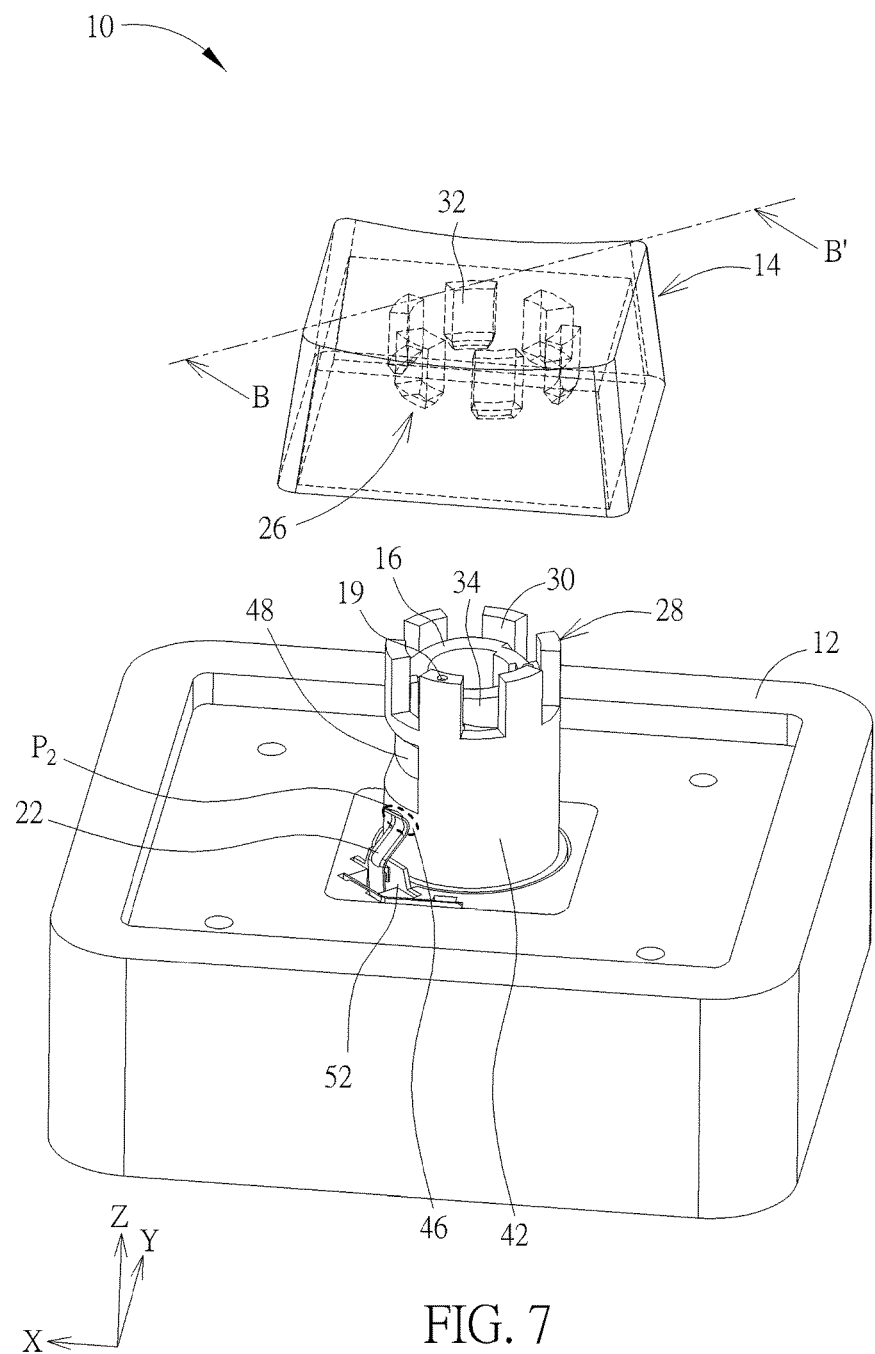
FIG. 7 is a diagram of the keyswitch when the external sleeve rotates (clockwise from a top view) to make a resilient arm abut against a second position on a convex portion.
Figure 8:
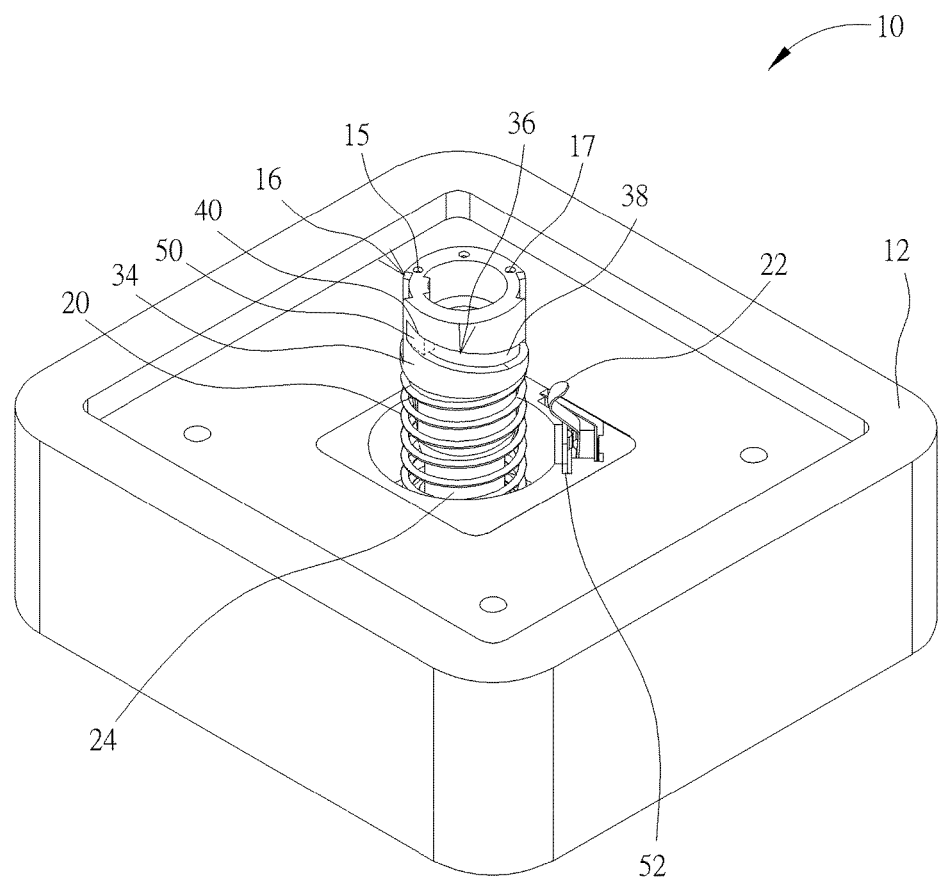
FIG. 8 is a diagram of the protruding block in FIG. 5 moving to a second slot section.

Furthermore, please refer to FIG. 3, FIG. 4, FIG. 5, FIG. 7, FIG. 8, and FIG. 9. FIG. 7 is a diagram of the keyswitch 10 when the external sleeve 18 rotates (clockwise from a top view) to make the resilient arm 22 abut against the second position $P_2$ on the convex portion 46. FIG. 8 is a diagram of the protruding block 50 in FIG. 5 moving to the second slot section 40. FIG. 9 is a cross-sectional diagram of keyswitch 10 in FIG. 7 along a cross-sectional line B-B' when the cap 14 is assembled with the base 12. As shown in FIG. 3, FIG. 4, FIG. 5, FIG. 7, FIG. 8, and FIG. 9, when the user wants to perform the preload adjustment operation of the keyswitch 10, the user just needs to detach the cap 14 from the base 12 and then utilizes an adjusting tool or pliers to rotate the external sleeve 18 on the pillar 24 around the Z-axis for making the resilient arm 22 abut against the second position $P_2$ on the convex portion 46 (as shown in FIG. 7) instead of abutting against the first position $P_1$ on the convex portion 46 (as shown in FIG. 4).

After the aforesaid sleeve rotating operation is completed and the cap 14 is assembled with the base 12, as shown in FIG. 2, FIG. 7, FIG. 8, and FIG. 9, the resilient arm 22 abuts against the second position $P_2$ (at this time, the internal sleeve 16 could not rotate around the Z-axis synchronously with the external sleeve since the internal sleeve 16 is constrained by coupling of the internal block 16a with the groove 24a of the pillar 24), and the protruding block 50 moves to the second slot section 40 along the oblique slot 36 accordingly to make the internal sleeve 16 prepress the elastic member 20 at a second length as shown in FIG. 9 for generating a second preload. As shown in FIG. 3 and FIG. 9, the first length of the elastic member 20 is larger than the second length of the elastic member 20. When the resilient arm 22 abuts against the first position $P_1$ on the convex portion 46 as shown in FIG. 4, the cap 14 can receive the first preload provided by the elastic member 20. When the external sleeve 18 rotates to make the resilient arm 22 abut against the second position $P_2$ on the convex portion 46 as shown in FIG. 7, the cap 14 can receive the second preload provided by the elastic member 20. The second preload is larger than the first preload, so as to provide a tactile feedback with a relatively large preload when the user presses the keyswitch 10.

On the other hand, when the cap 14 is located at the non-pressed position as shown in FIG. 9, the resilient arm 22 abuts against the second position $P_2$ on the convex portion 46 to deform outwardly so that the resilient arm 22 can be separate from the contact point 52. When the cap 14 is pressed, the resilient arm 22 moves to abut against the concave portion 48 accordingly. During this process, deformation of the resilient arm 22 is reduced to make the resilient arm 22 abut against the contact point 52. Accordingly, a corresponding input signal could be transmitted to the circuit board of the keyswitch 10 so that the keyswitch 10 could perform a corresponding input function.

To be noted, in this embodiment, the internal sleeve 16 can have a first mark 15 and a second mark 17, and the external sleeve 18 can have a third mark 19. The third mark 19 can be used for aligning with the first mark 15 to guide the external sleeve 18 and the internal sleeve 16 to rotate relatively to make the protruding block 50 move to the first slot section 38, and can be used for aligning with the second mark 17 to guide the external sleeve 18 and the internal sleeve 16 to rotate relatively to make the protruding block 50 move to the second slot section 40 so that the user could complete the aforesaid rotation operation of the external sleeve 18 more precisely and rapidly. The aforesaid mark design could also be applied to the following embodiments, and the related description could be reasoned by analogy according to this embodiment and omitted herein.

Figure 10:
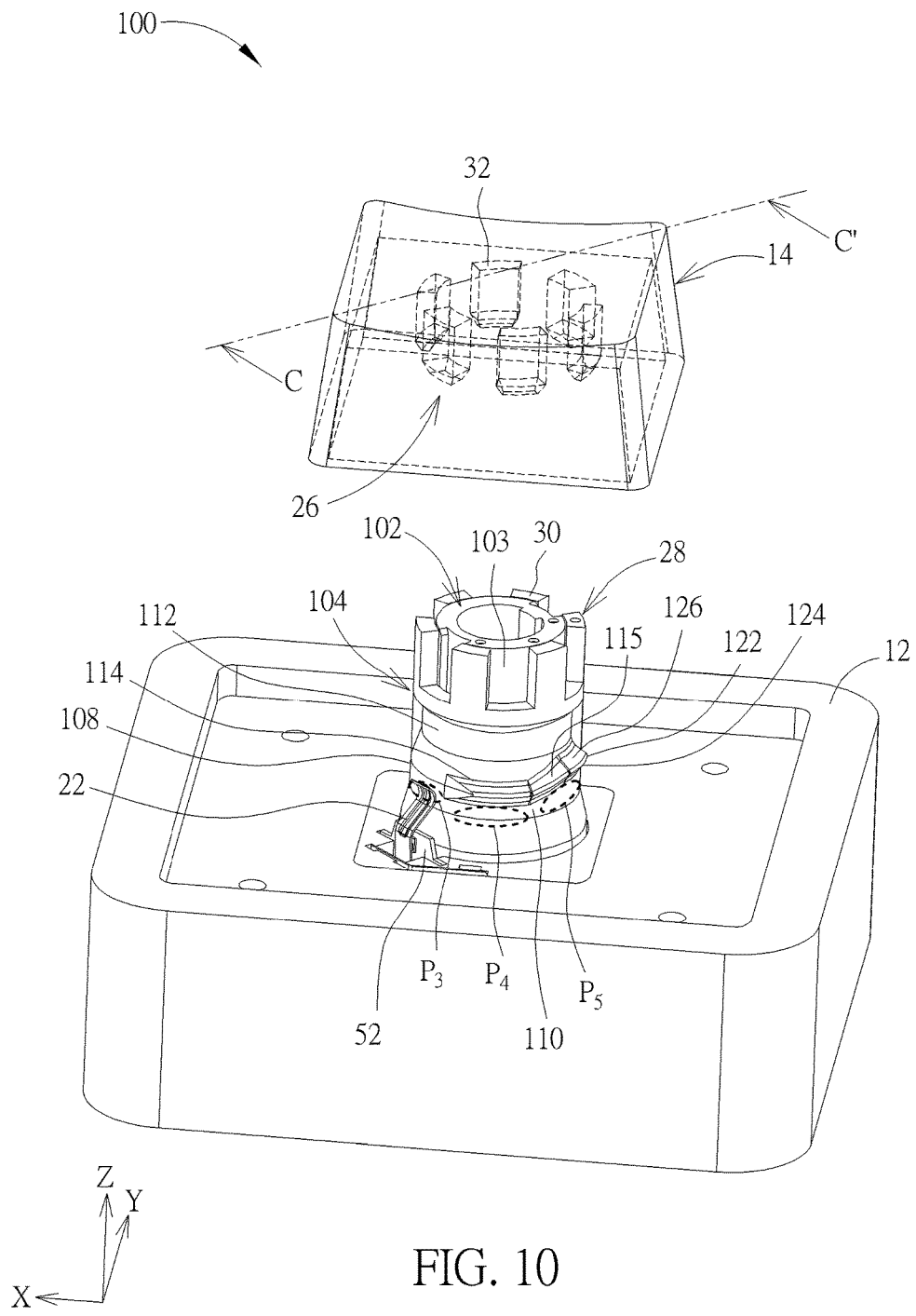
FIG. 10 is a partial exploded diagram of a keyswitch according to a second embodiment of the present invention.
Figure 10A:
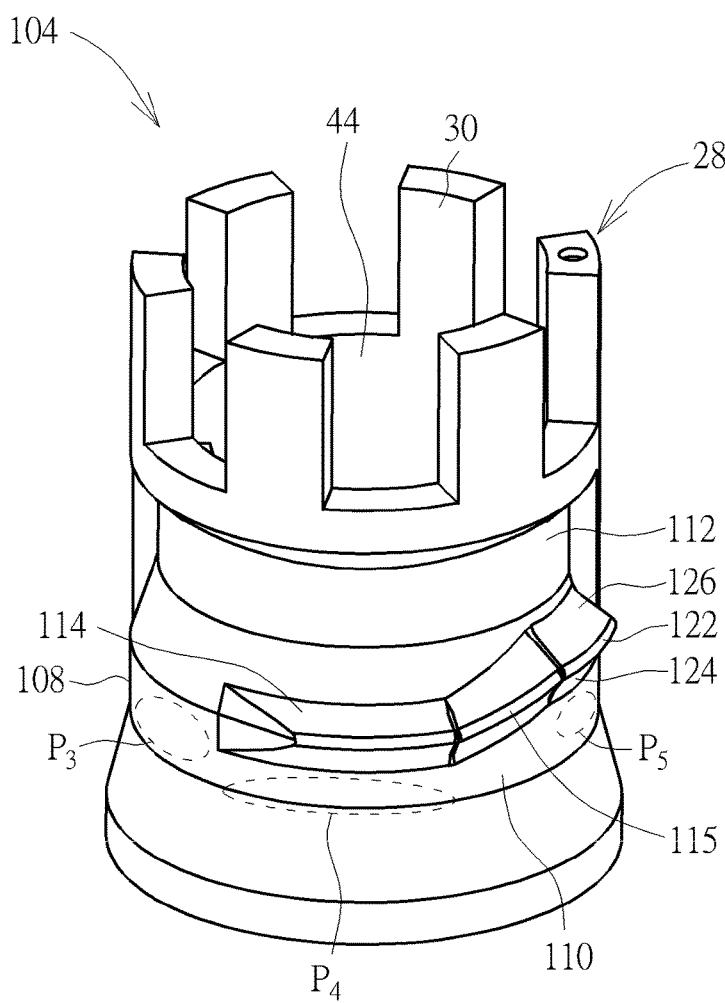
FIG. 10A is an enlarged diagram of an external sleeve in FIG. 10.
Figure 10B:
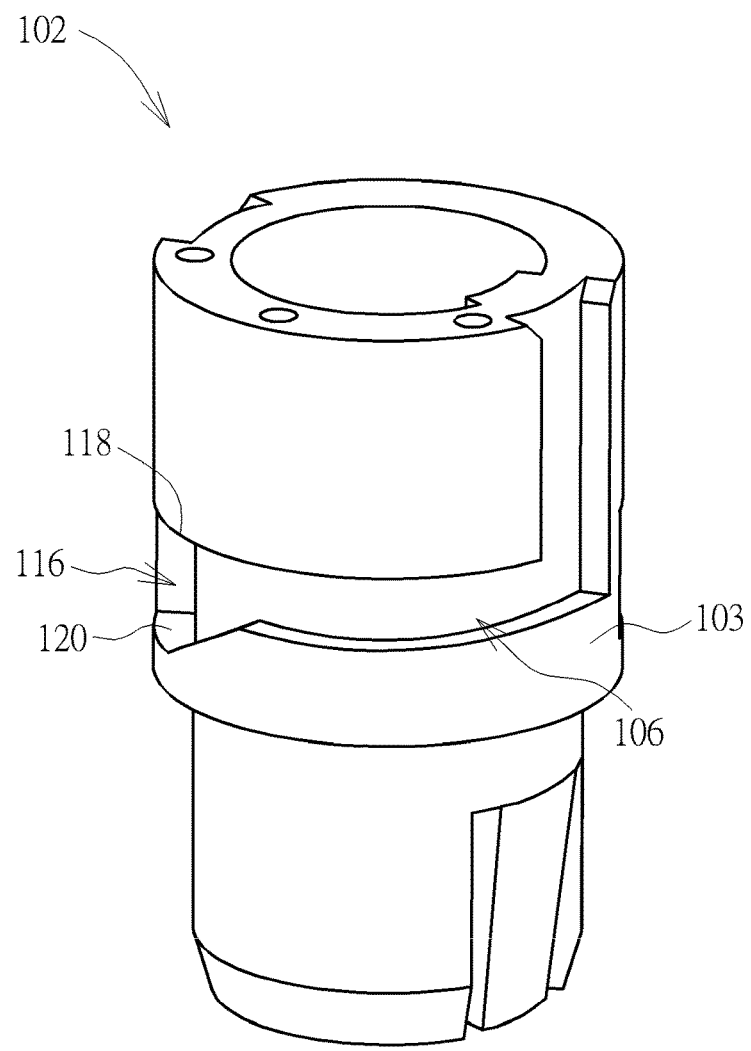
FIG. 10B is an enlarged diagram of an internal sleeve in FIG. 10.
Figure 11:
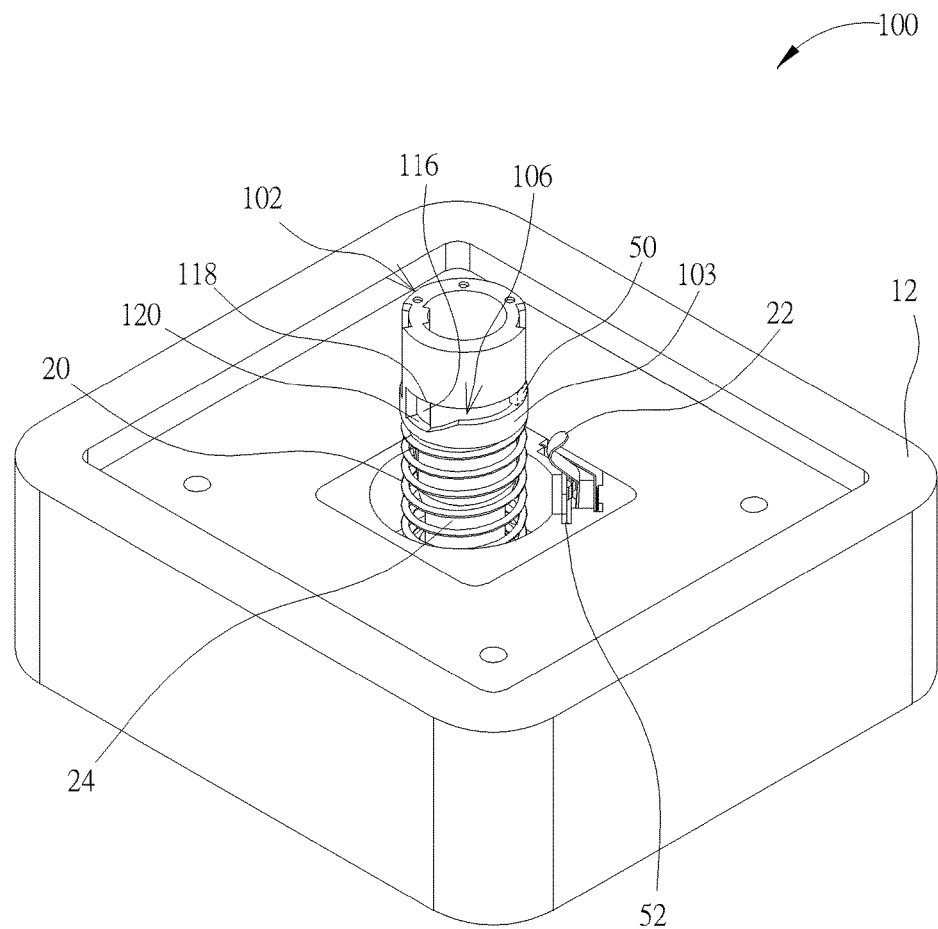
FIG. 11 is an internal diagram of the keyswitch in FIG. 10.
Figure 12:
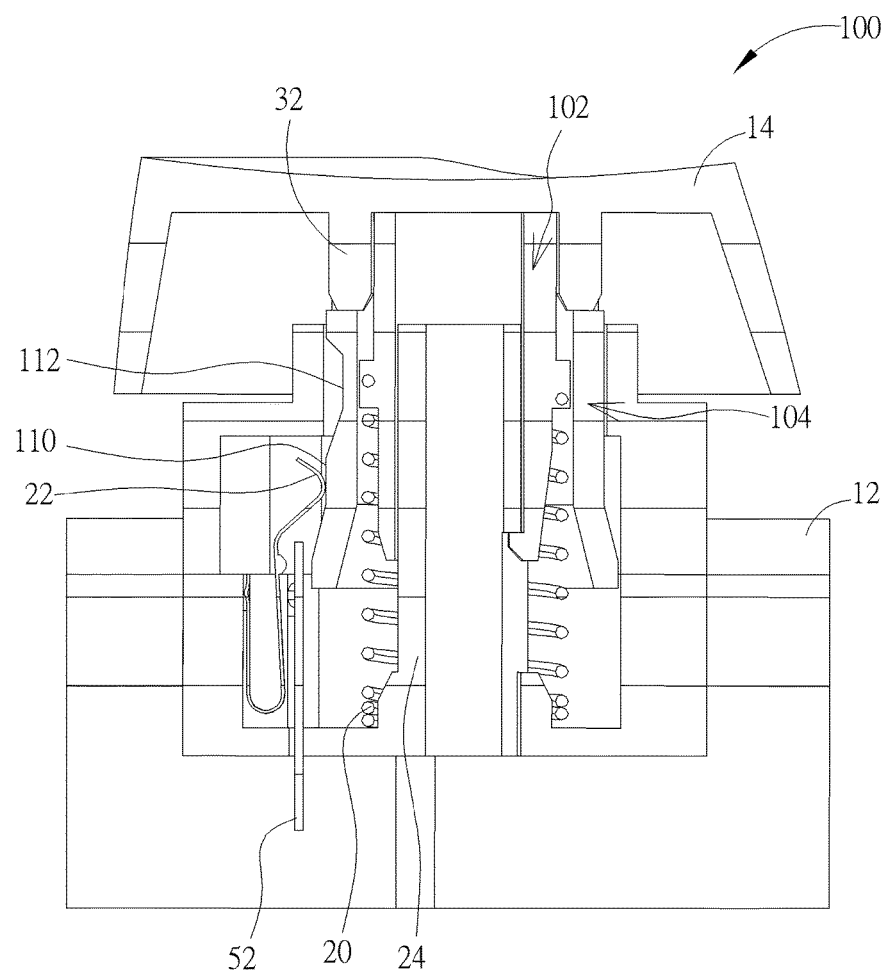
FIG. 12 is a cross-sectional diagram of the keyswitch in FIG. 10 along a cross-sectional line C-C' when the cap is assembled with the base.
Figure 13:
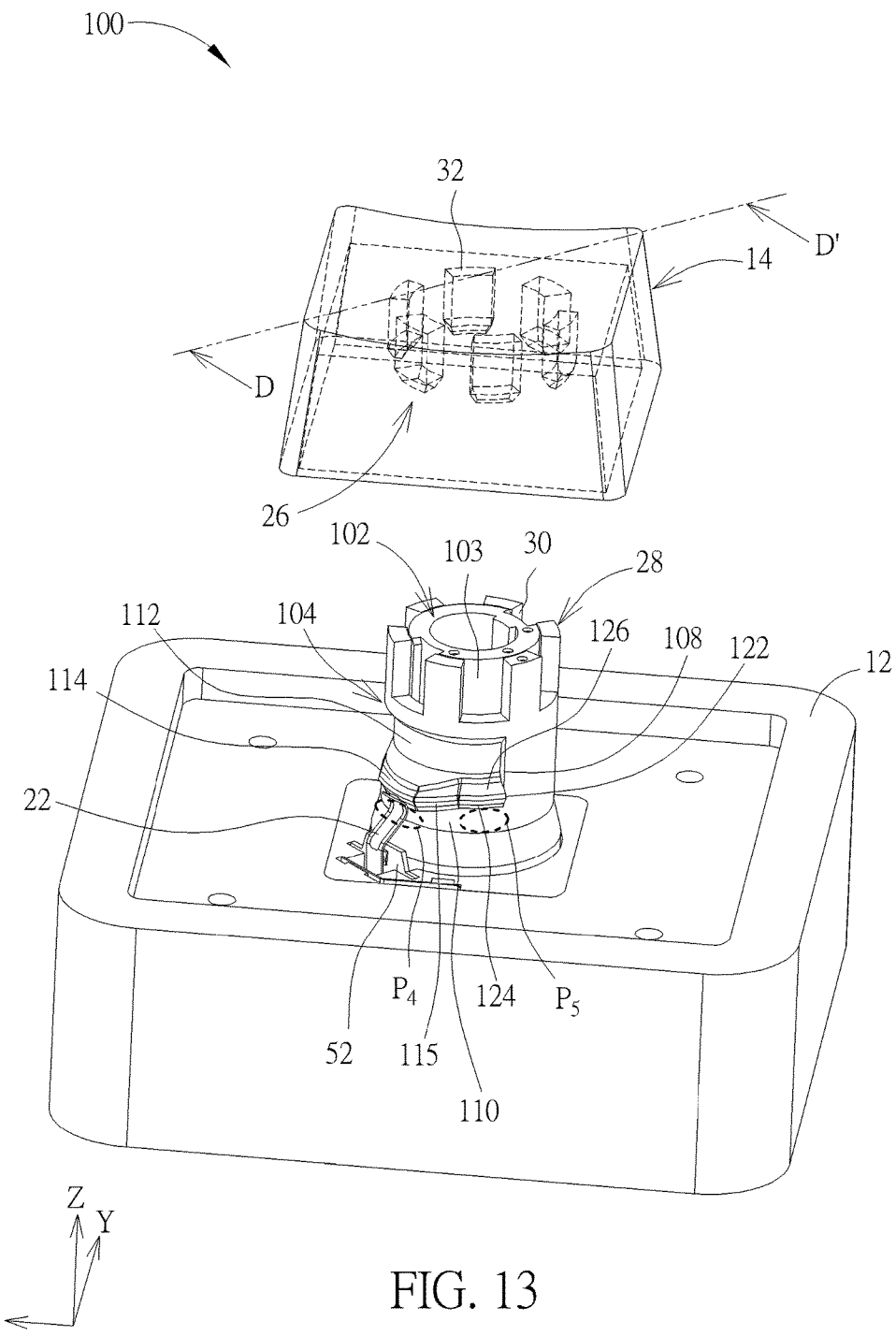
FIG. 13 is a partial exploded diagram of the keyswitch in FIG. 10 when the external sleeve continues rotating (clockwise from a top view) to make the resilient arm abut against a second position on a convex portion.
Figure 14:
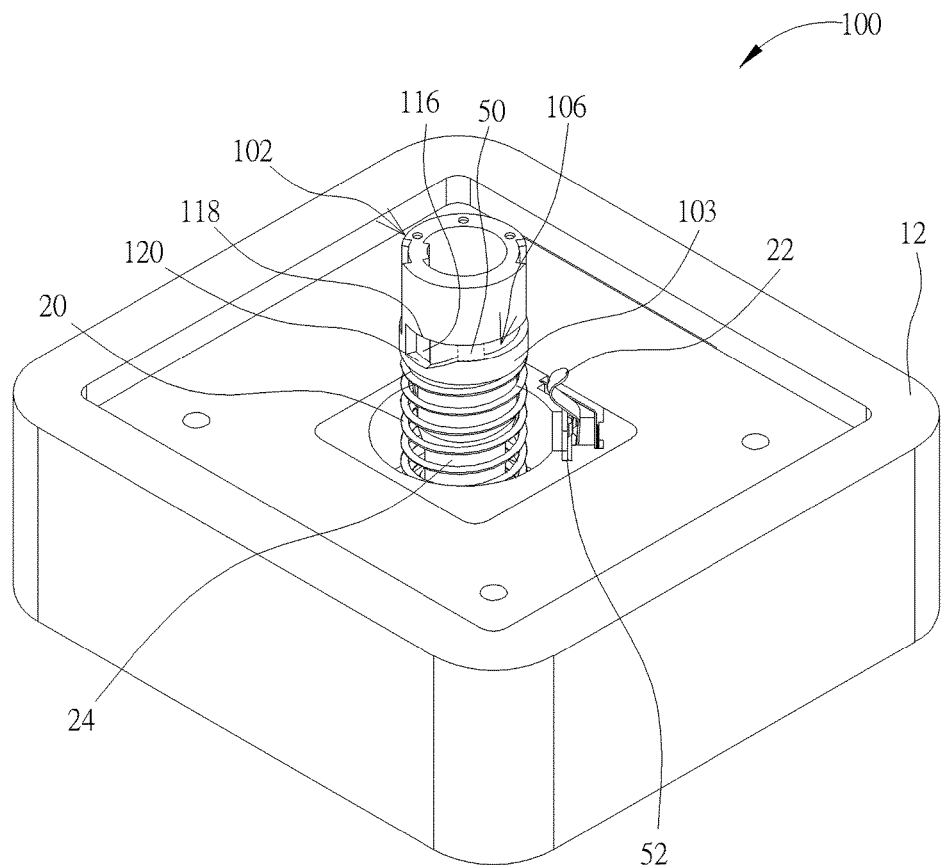
FIG. 14 is an internal diagram of the keyswitch in FIG. 13.
Figure 14:
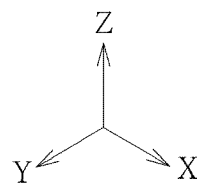
Figure 15:
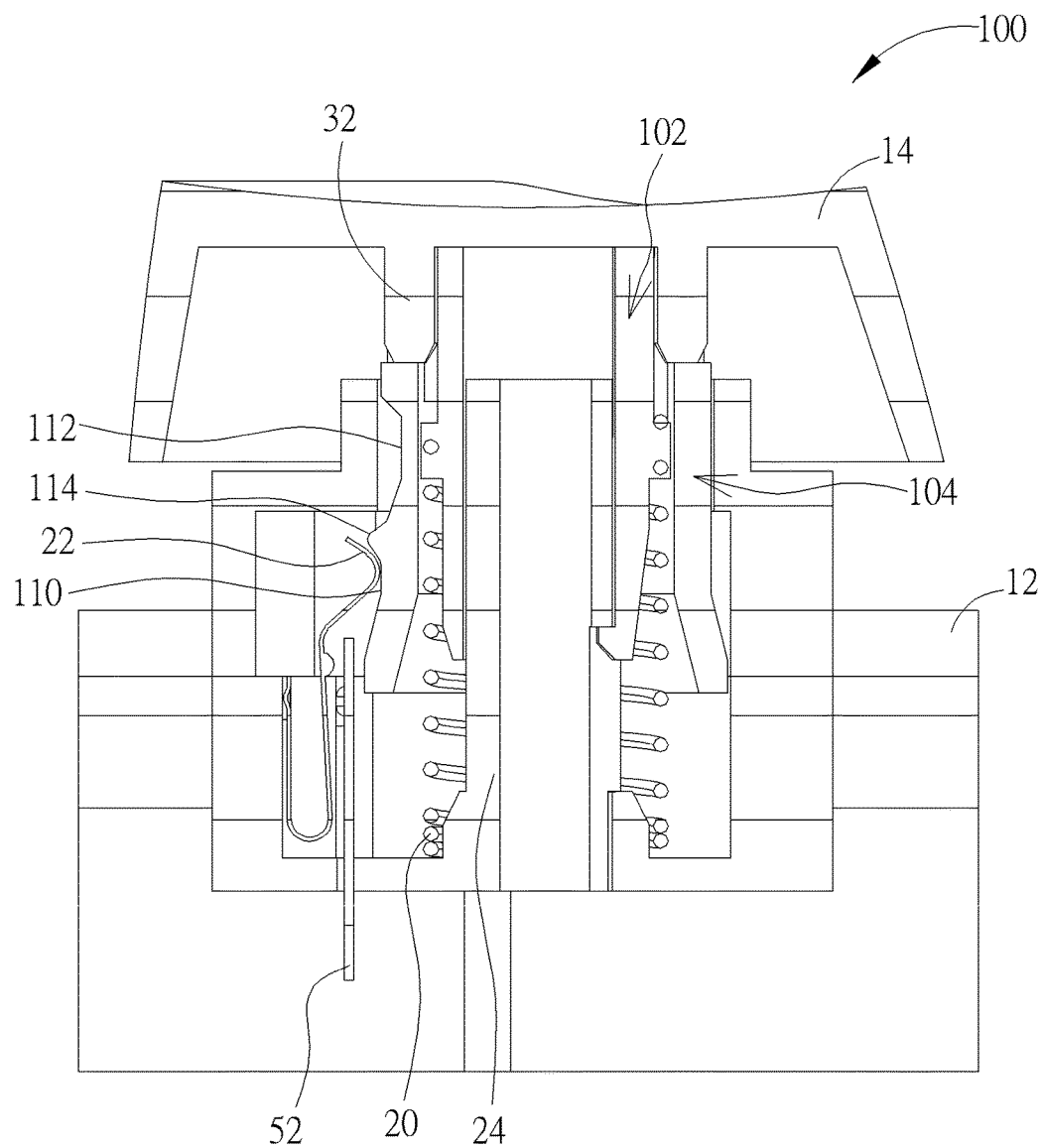
FIG. 15 is a cross-sectional diagram of the keyswitch in FIG. 13 along a cross-sectional line D-D' when the cap is assembled with the base.
Figure 16:
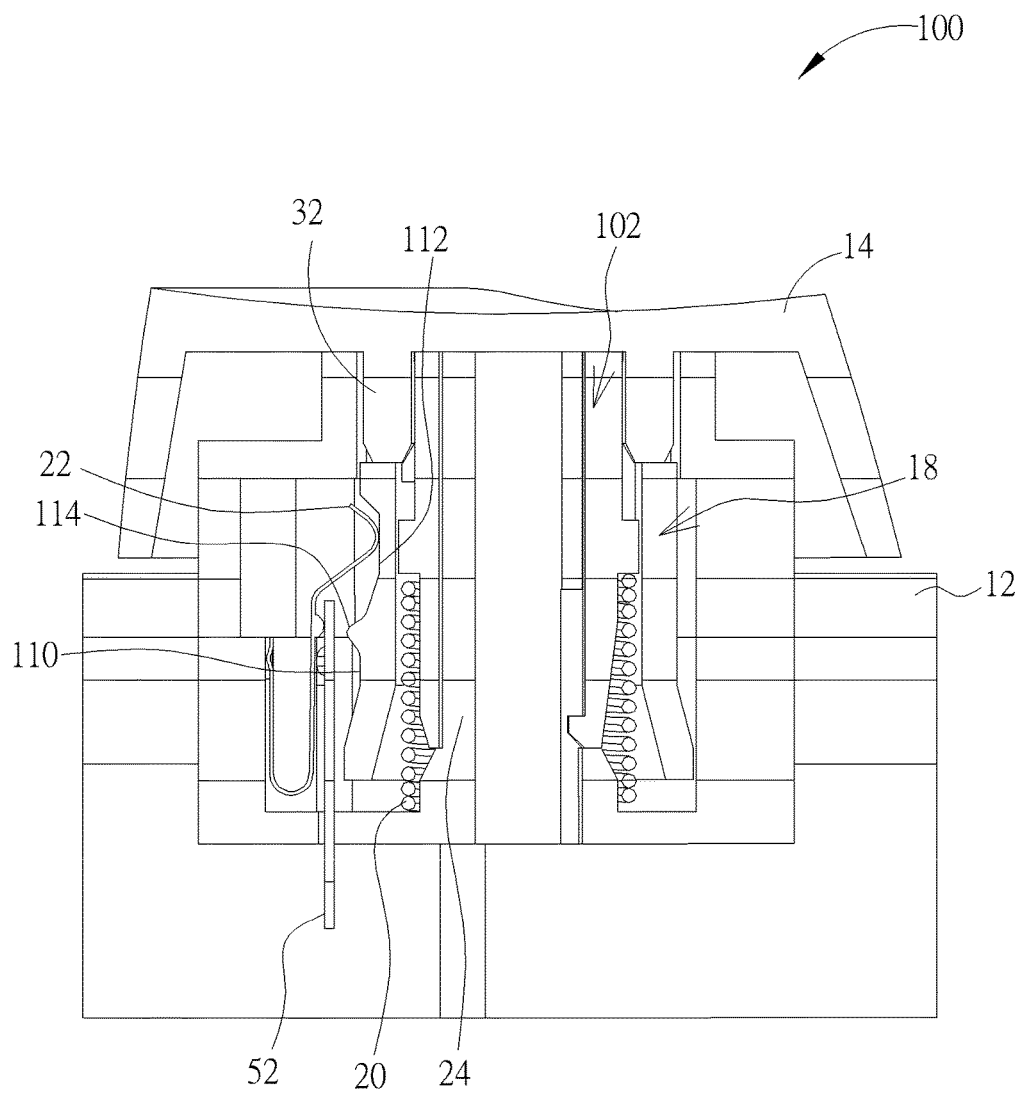
FIG. 16 is a cross-sectional diagram of the cap in FIG. 15 being pressed.

Please refer to FIG. 10, FIG. 10A, FIG. 10B, FIG. 11, FIG. 12, FIG. 13, FIG. 14, FIG. 15, and FIG. 16. FIG. 10 is a partial exploded diagram of a keyswitch 100 according to a second embodiment of the present invention. FIG. 10A is an enlarged diagram of an external sleeve 104 in FIG. 10. FIG. 10B is an enlarged diagram of an internal sleeve 102 in FIG. 10. FIG. 11 is an internal diagram of the keyswitch 100 in FIG. 10. FIG. 12 is a cross-sectional diagram of the keyswitch 100 in FIG. 10 along a cross-sectional line C-C' when the cap 14 is assembled with the base 12. FIG. 13 is a partial exploded diagram of the keyswitch 100 in FIG. 10 when the external sleeve 104 continues rotating (clockwise from a top view) to make the resilient arm abut against a second position $P_4$ on the convex portion 110. FIG. 14 is an internal diagram of the keyswitch 100 in FIG. 13. FIG. 15 is a cross-sectional diagram of the keyswitch 100 in FIG. 13 along a cross-sectional line D-D' when the cap 14 is assembled with the base 12. FIG. 16 is a cross-sectional diagram of the cap 14 in FIG. 15 being pressed. For clearly showing the internal mechanical design of the keyswitch 100, only bottom half structure is briefly depicted for the base 12 in FIGS. 10, 11, 13 and 14, and only the protruding block 50 is briefly depicted by dotted lines for the external sleeve 104 in FIGS. 11 and 14. Components mentioned both in this embodiment and the first embodiment represent components with similar structures or functions, and the related description is omitted herein.

The keyswitch 100 includes the base 12, the cap 14, the internal sleeve 102, the external sleeve 104, the elastic member 20, and the resilient arm 22 adjacent to the pillar 24 (disposal of the contact point 52 could be selectively applied to this embodiment). After the external sleeve 104 is assembled with the internal sleeve 102 via engagement of the upper engaging structure 28 and the cap engaging structure 26, the internal sleeve 102 and the external sleeve 104 can move relatively along the Z-axis or rotate relatively around the Z-axis, but relative movement between the internal sleeve 102 and the external sleeve 104 along the plane containing the X-axis and the Y-axis is constrained. The internal sleeve 102 can have a first outer annular surface 103 and a transverse slot 106 is formed on the first outer annular surface 103. If there is no need to perform the preload adjustment operation as mentioned in the first embodiment, the transverse slot 106 can extend along the plane containing the X-axis and the Y-axis to keep the length of the elastic member 20 unchanged when the external sleeve 104 rotates around the Z-axis.

The elastic member 20 jackets the pillar 24 and abuts against the internal sleeve 102 and the base 12 respectively to drive the internal sleeve 102 to move away from the base along the Z-axis. The external sleeve 104 has a second outer annular surface 108 and the inner annular surface 44. The external sleeve 104 jackets the internal sleeve 102 via the inner annular surface 44. A convex portion 110, a concave portion 112 and a first arc-shaped bar 114 are formed on the second outer annular surface 108. The convex portion 110, the concave portion 112, and the first arc-shaped bar 114 can substantially extend along the plane containing the X-axis and the Y-axis. A protruding block 50 protrudes from the external sleeve 104 toward the transverse slot 106. The protruding block 50 is movably inserted into the transverse slot 106. Accordingly, the protruding block 50 can guide the external sleeve 104 to rotate around the Z-axis, to make the resilient arm 22 selectively abut against a first position $P_3$ or the second position $P_4$ on the convex portion 110. The first arc-shaped bar 114 extends above the second position $P_4$, but does not extend above the first position $P_3$.

As shown in FIG. 10, when the resilient arm 22 abuts against the first position $P_3$ on the convex portion 110 and then the cap 14 is pressed to move the external sleeve 104 downward, the protruding block 50 abuts against the transverse slot 106 to make the external sleeve 104 move downward with the internal sleeve 102, so that the resilient arm 22 can move from the convex portion 110 to the concave portion 112. During the aforesaid process, the resilient arm 22 does not need to cross the first arc-shaped bar 114 to provide a non-clicky tactile feedback when the user presses the cap 14. That is, during the user presses the cap 14, the pressing resistance can substantially remain unchanged or is increased linearly.

When the user wants to switch the keyswitch 100 to provide a clicky tactile feedback, meaning that the pressing resistance can be increased to a maximum value during the time that the user presses the cap 14, and can be reduced after the keyswitch 100 is triggered, the user just needs to rotate the external sleeve 104 on the pillar 24 around the Z-axis (clockwise from a top view) to make the resilient arm 22 move from the first position $P_3$ on the convex portion 110 as shown in FIG. 10 to the second position $P_4$ on the convex portion 110 as shown in FIG. 13. During this process, the internal sleeve 102 cannot rotate around the Z-axis synchronously with the external sleeve 104 since the internal sleeve 102 is constrained by coupling of the internal block 16a with the groove 24a of the pillar 24 to force the protruding block 50 to move from a position as shown in FIG. 11 to a position as shown in FIG. 14 along the transverse slot 106.

After the rotational operation of the external sleeve 104 is completed and the cap 14 is assembled with the base 12, the keyswitch 100 can provide a clicky tactile feedback during the time that the user presses the cap 14. To be more specific, when the cap 14 is located at the non-pressed position as shown in FIGS. 13 and 15, the resilient arm 22 abuts against the convex position 110 to be separate from the contact point 52. Subsequently, when the cap 14 is pressed to the pressed position as shown in FIG. 16, the protruding block 50 abuts against the transverse slot 106 to make the external sleeve 104 move downward with the internal sleeve 102 to make the resilient arm 22 move from the convex portion 110 to the concave portion 112.

During the aforesaid process, the resilient arm 22 needs to cross the first arc-shaped bar 114. In such a manner, when the resilient arm 22 abuts against a bottom edge surface of the first arc-shaped bar 114, the keyswitch 100 can provide a higher pressing resistance. When the resilient arm 22 crosses the first arc-shaped bar 114 to abut against an upper edge surface of the first arc-shaped bar 114, the pressing resistance can be reduced greatly to provide a clicky tactile feedback during the user presses the cap 14, and deformation of the resilient arm 22 can be reduced accordingly to make the resilient arm 22 abut against the contact point 52 so that the keyswitch 100 can perform a corresponding input function.

Figure 17:
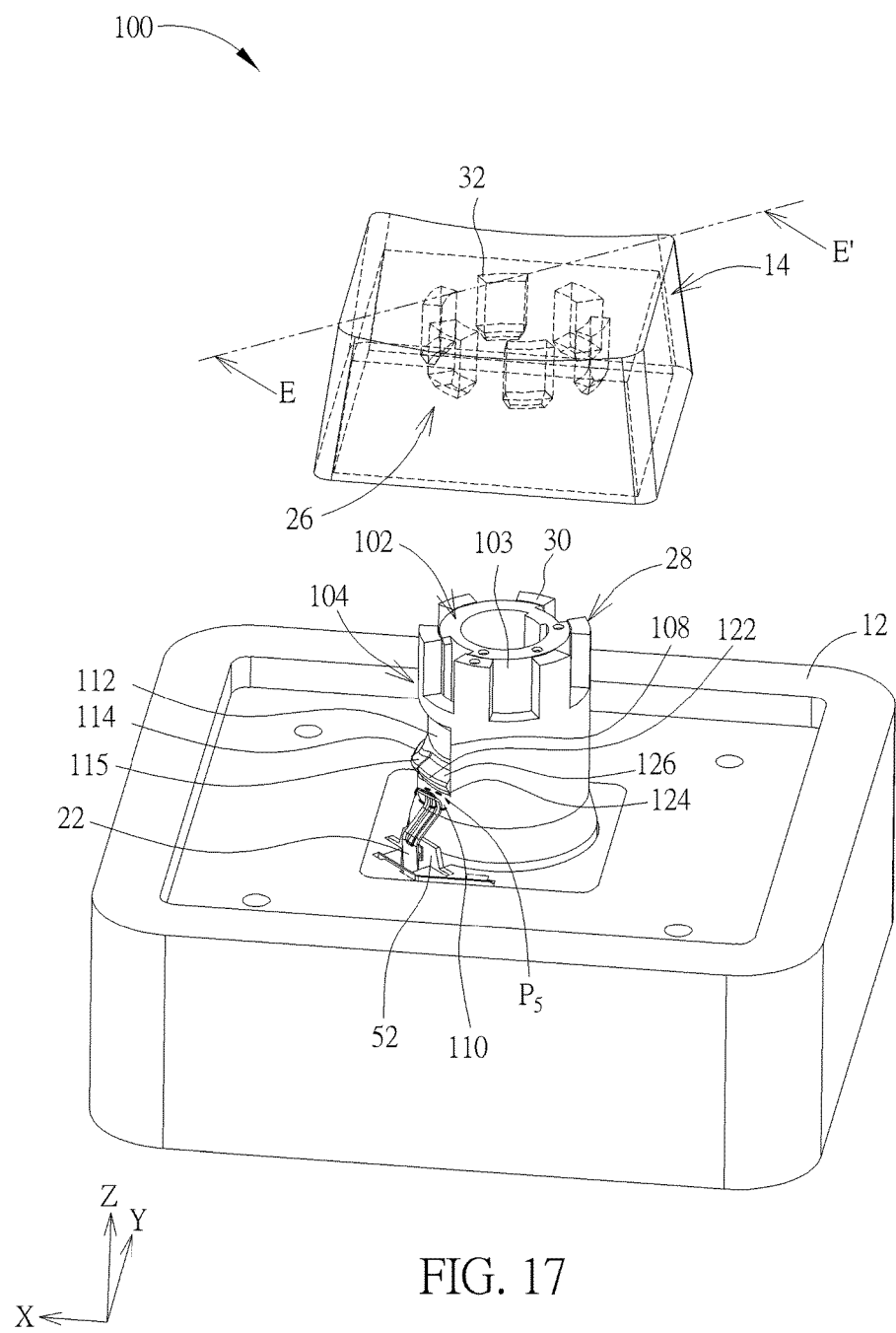
FIG. 17 is a partial exploded diagram of the keyswitch in FIG. 13 when the external sleeve continues rotating (clockwise from a top view) to make the resilient arm abut against a third position on the convex portion.
Figure 18:
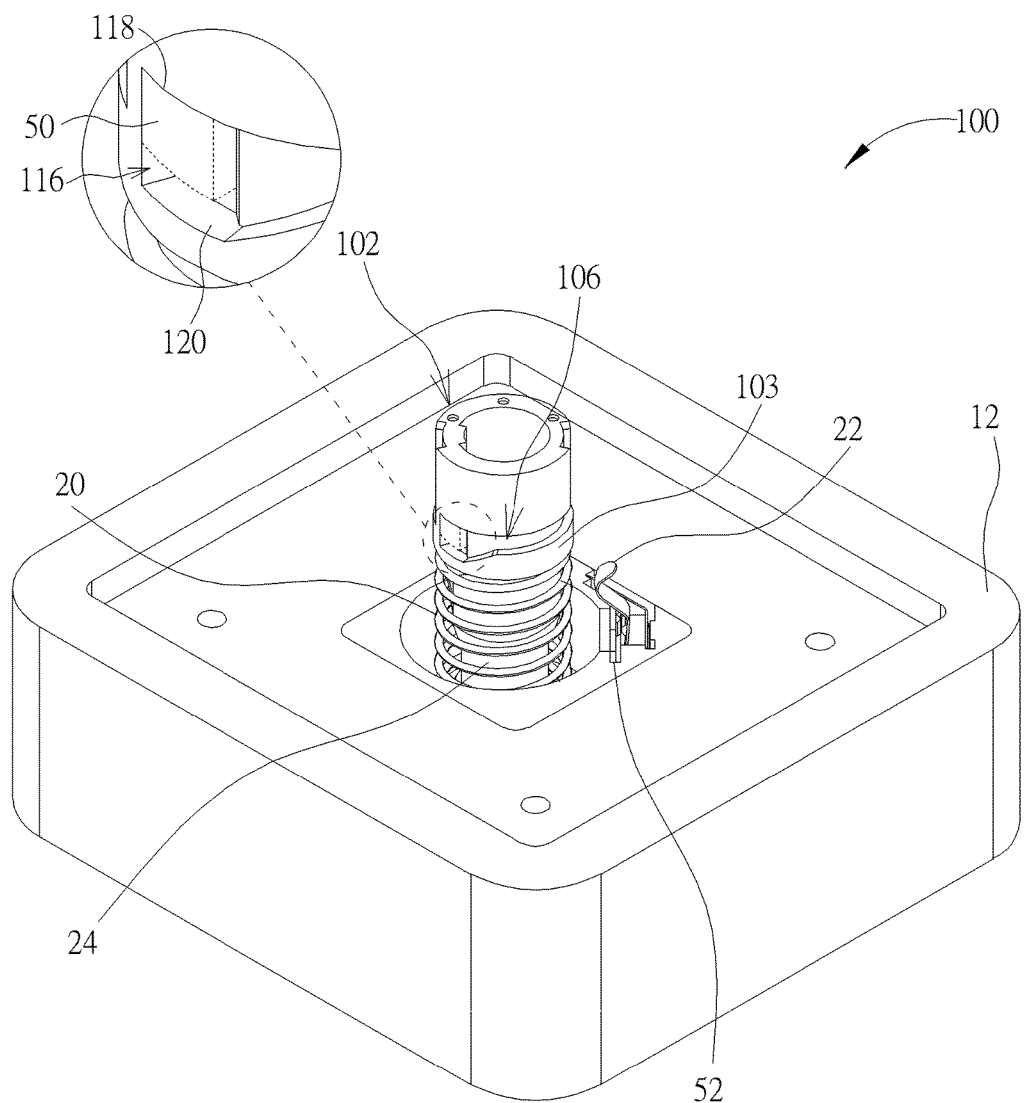
FIG. 18 is an internal diagram of the keyswitch in FIG. 17.
Figure 19:
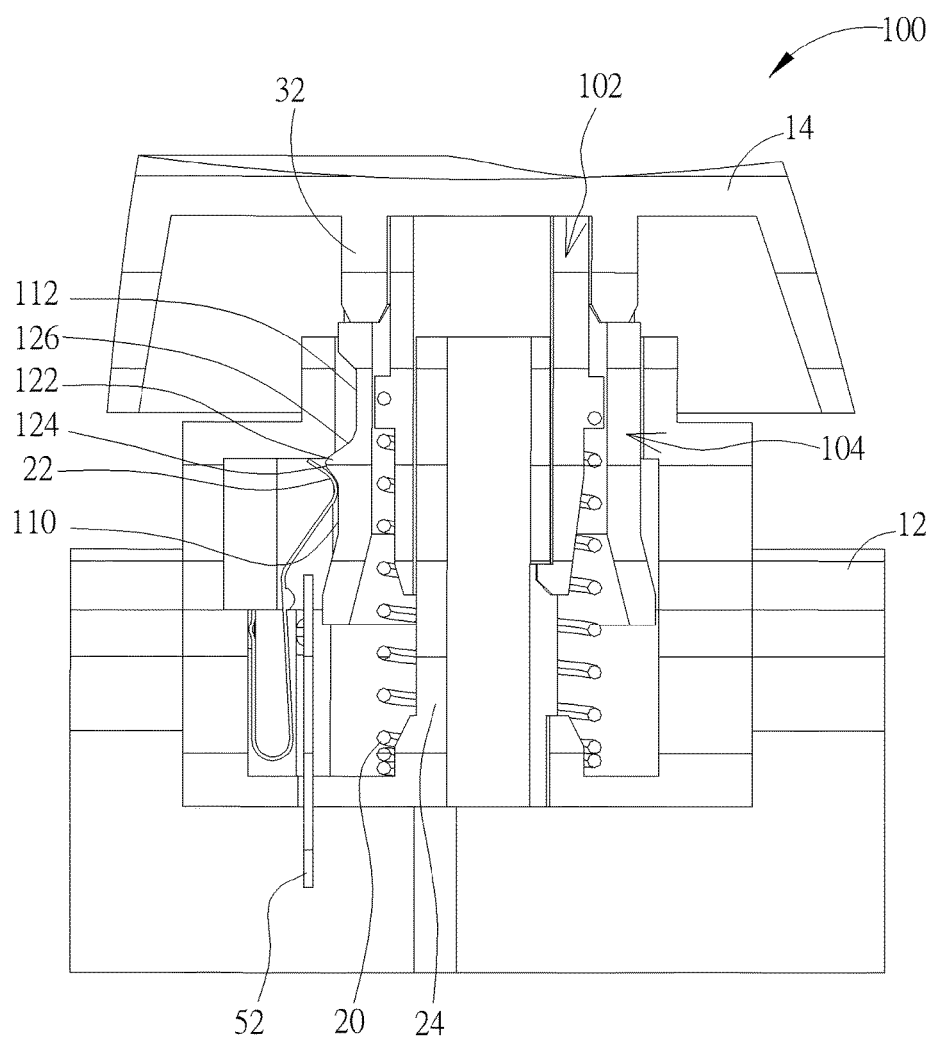
FIG. 19 is a cross-sectional diagram of the keyswitch in FIG. 17 along a cross-sectional line E-E' when the cap is assembled with the base and the resilient arm abuts against a bottom edge surface of a second arc-shaped bar.
Figure 20:
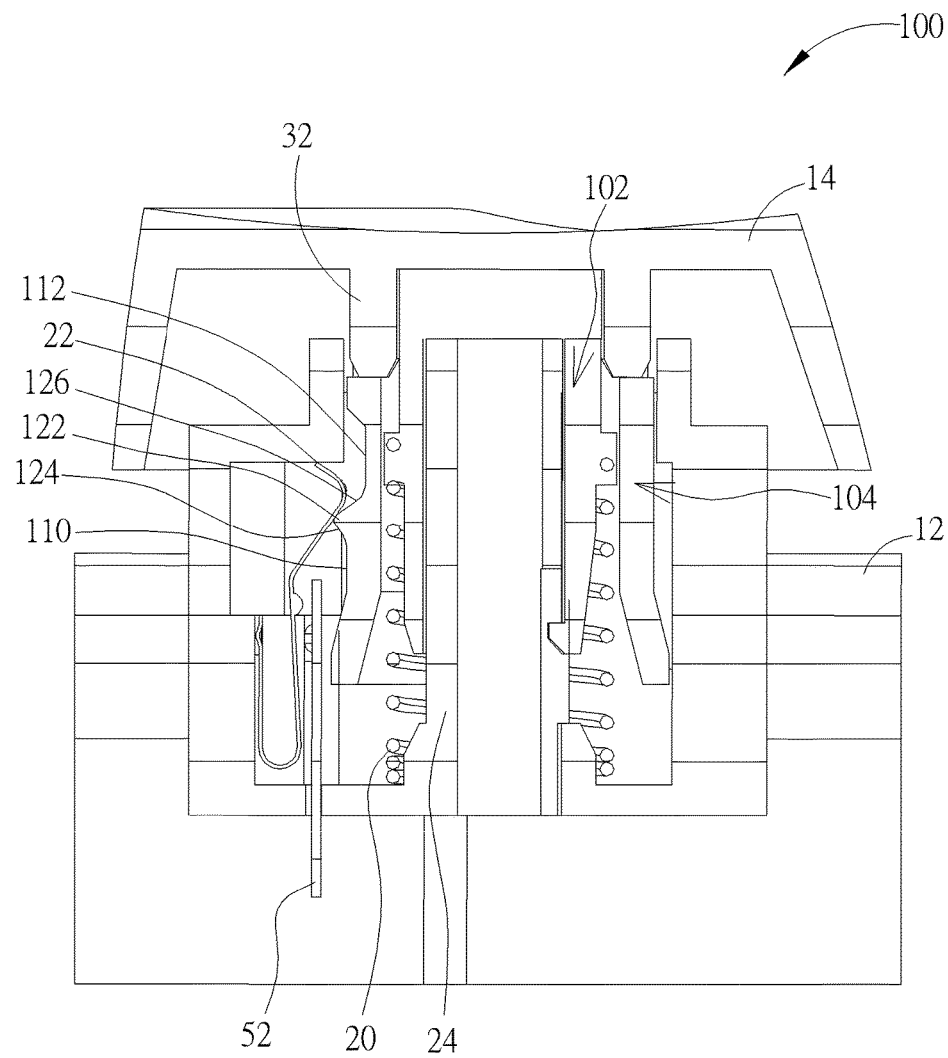
FIG. 20 is a cross-sectional diagram of the cap in FIG. 19 being pressed to make the resilient arm abut against an upper edge surface of the second arc-shaped bar.
Figure 21:
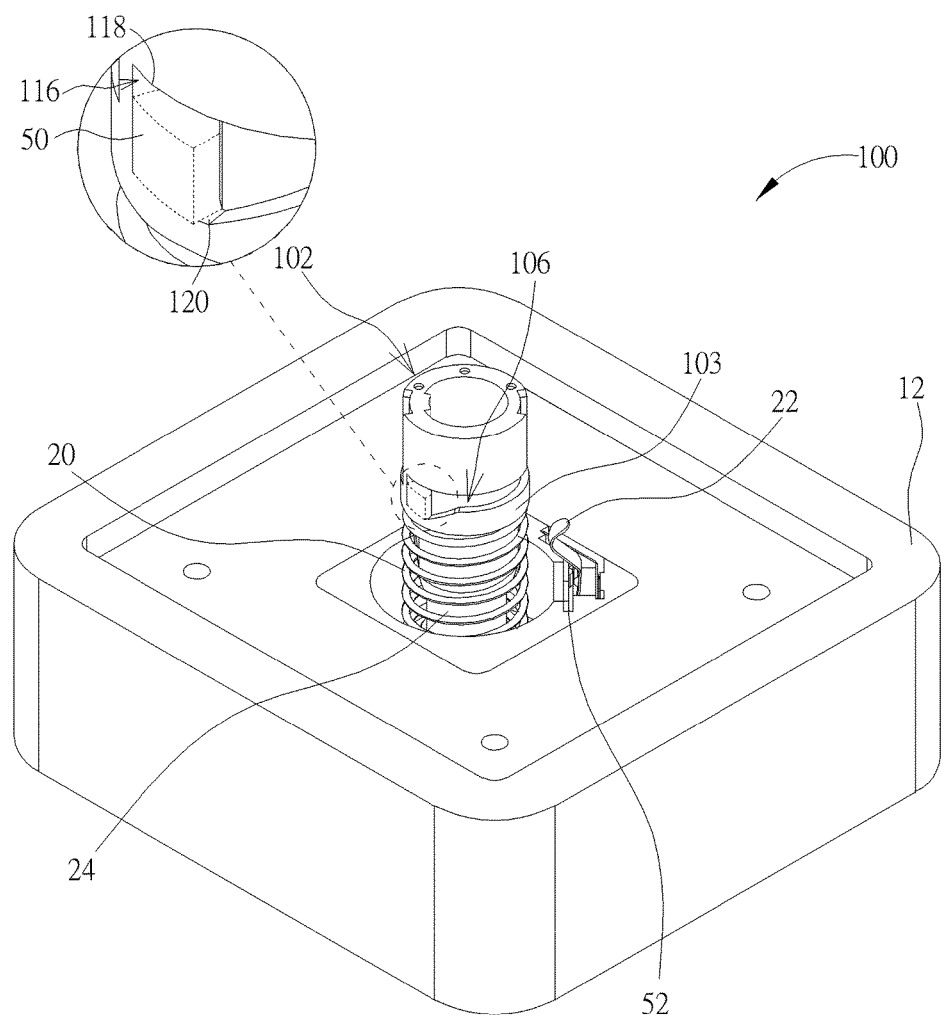
FIG. 21 is a cross-sectional diagram of the resilient arm in FIG. 18 moving the protruding block downward to collide with a bottom portion of a longitudinal slot for making a sound.

Please refer to FIG. 10B, FIG. 13, FIG. 17, FIG. 18, FIG. 19, FIG. 20, and FIG. 21. FIG. 17 is a partial exploded diagram of the keyswitch 100 in FIG. 13 when the external sleeve 104 is rotated (clockwise from a top view) to make the resilient arm 22 abut against a third position $P_5$ on the convex portion 110. FIG. 18 is an internal diagram of the keyswitch 100 in FIG. 17. FIG. 19 is a cross-sectional diagram of the keyswitch 100 in FIG. 17 along a cross-sectional line E-E' when the cap 14 is assembled with the base 12 and the resilient arm 22 abuts against a bottom edge surface 124 of a second arc-shaped bar 122. FIG. 20 is a cross-sectional diagram of the cap 14 in FIG. 19 being pressed to make the resilient arm 22 abut against an upper edge surface 126 of the second arc-shaped bar 122. FIG. 21 is a cross-sectional diagram of the resilient arm 22 in FIG. 18 moving the protruding block 50 downward to collide with a bottom portion 120 of a longitudinal slot 116 for making a sound. For clearly showing the internal mechanical design of the keyswitch 100, only bottom half structure is briefly depicted for the base 12 in FIGS. 17, 18 and 21, and only the protruding block 50 is briefly depicted by dotted lines for the external sleeve 104 in FIGS. 18 and 21.

The first outer annular surface 103 further has the longitudinal slot 116 formed thereon. The longitudinal slot 116 has a top portion 118 and the bottom portion 120. The top portion 118 is interconnected with the transverse slot 106. The second arc-shaped bar 122 is formed on the second outer annular surface 108 and has the bottom edge surface 124 and the upper edge surface 126. The convex portion 110 further has the third position $P_5$, and the second arc-shaped bar 122 extends above the third position $P_5$. Furthermore, in this embodiment, a bridge bar 115 is formed on the second outer annular surface 108. The second arc-shaped bar 122 is higher than the first arc-shaped bar 114 along the Z-axis. The bridge bar 115 extends from the first arc-shaped bar 114 upward and obliquely to be connected to the second arc-shaped bar 122.

Via the aforesaid design, when the user wants to switch the keyswitch 100 to provide a tactile feedback with a clicky sound, the user just needs to continue rotating the external sleeve 104 on the pillar 24 around the Z-axis (clockwise from a top view) to make the resilient arm 22 move from the second position $P_4$ as shown in FIG. 13 to the third position $P_5$ as shown in FIG. 17. During the aforesaid process, the internal sleeve 102 forces the protruding block 50 to move from the position as shown in FIG. 14 to a position as shown in FIG. 18 along the transverse slot 106 since the internal sleeve 10 cannot rotate around the Z-axis with the external sleeve 104. After the aforesaid rotation operation of the external sleeve 104 is completed and the cap 14 is assembled with the base 12, the keyswitch 100 can provide a tactile feedback with a clicky sound during the user presses the cap 14.

As shown in FIG. 17, when the cap 14 is not pressed, the resilient arm 22 abuts against the convex portion 110 to be separate from the contact point 52. Subsequently, when the cap 14 is pressed, the resilient arm 22 can move from the convex portion 110 to the concave portion 1112 across the second arc-shaped bar 122 with downward movement of the external sleeve 104.

As shown in FIG. 18 and FIG. 19, during the aforesaid process, the internal sleeve 102 and the external sleeve 104 can be pushed by the elastic member 20 and the resilient arm 22 respectively to abut against the cap 14 when the resilient arm 22 abuts against the bottom edge surface 124. Accordingly, the protruding block 50 keeps abutting against the top portion 118 of the longitudinal slot 116 since the internal sleeve 102 and the external sleeve 104 move together with the cap 14.

As shown in FIG. 20 and FIG. 21, when the resilient arm 22 crosses the second arc-shaped bar 122 to abut against the upper edge surface 126, the elastic member 20 keeps pushing the internal sleeve 102 to move upward but the resilient arm 22 pushes the external sleeve 104 to move downward. At this time, since the longitudinal slot 116 allows the protruding block 50 to move downward along the Z-axis, relative movement between the internal sleeve 102 and the external sleeve 104 along the Z-axis occurs to drive the protruding block 50 to collide with the bottom portion 120 to make a sound. Accordingly, the keyswitch 100 can provide a tactile feedback with a clicky sound. Finally, when the cap 14 is pressed to the pressed position to make the resilient arm 22 move from the convex portion 110 to the concave portion 112, deformation of the resilient arm 22 can be reduced accordingly to make the resilient arm 22 abut against the contact point 52 so that the keyswitch 100 can perform a corresponding input function.

On the contrary, if the external sleeve 104 is rotated from the position where the resilient arm 22 abuts against the third position $P_5$ on the convex portion 110 as shown in FIG. 17 back to the position where the resilient arm 22 abuts against the first position $P_3$ on the convex portion 110 as shown in FIG. 10 (or the position where the resilient arm 22 abuts against the second position $P_4$ on the convex portion 110 as shown in FIG. 13), the protruding block 50 is mated with the transverse slot 106 without a clearance along the Z-axis. In such a manner, when the cap 14 is pressed, the protruding block 50 abuts against the transverse slot 106 to make the internal sleeve 102 move downward with the external sleeve 104 along the Z-axis, meaning that the external sleeve 104 does not collide with the internal sleeve 102 during the aforesaid process, so as to provide a tactile feedback without a clicky sound when the user presses the cap 14.

The tactile feedback adjusting design provided by the present invention is not limited to the aforesaid embodiments, meaning that the present invention can adopt the design that the external sleeve can have a protruding point to abut against a protruding block or a top surface of the base for changing a travel distance of the cap, or the design that the resilient arm can abut against different triggering positions on the external sleeve.

Figure 22:
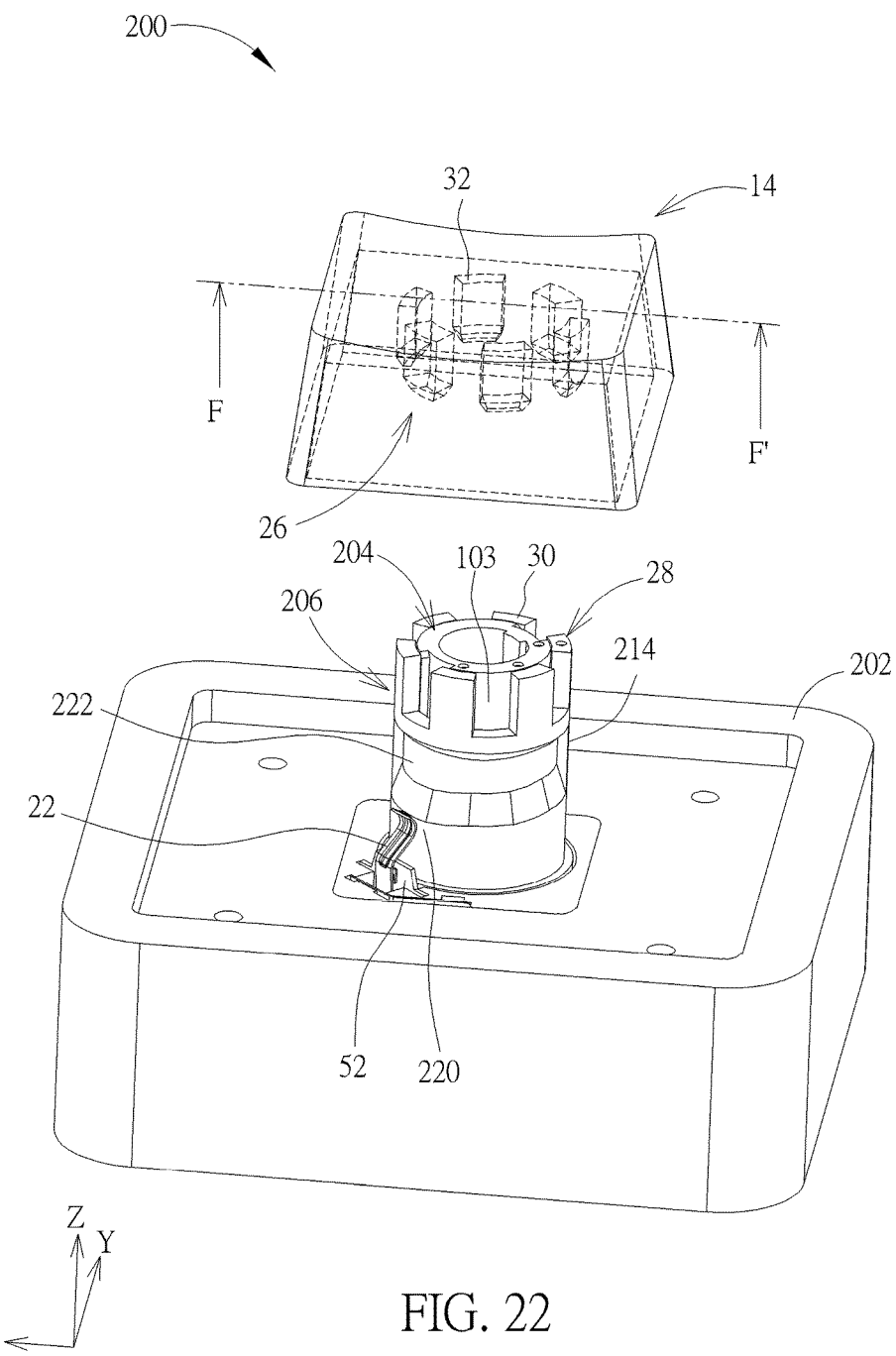
FIG. 22 is a diagram of a keyswitch according to a third embodiment of the present invention.
Figure 23:
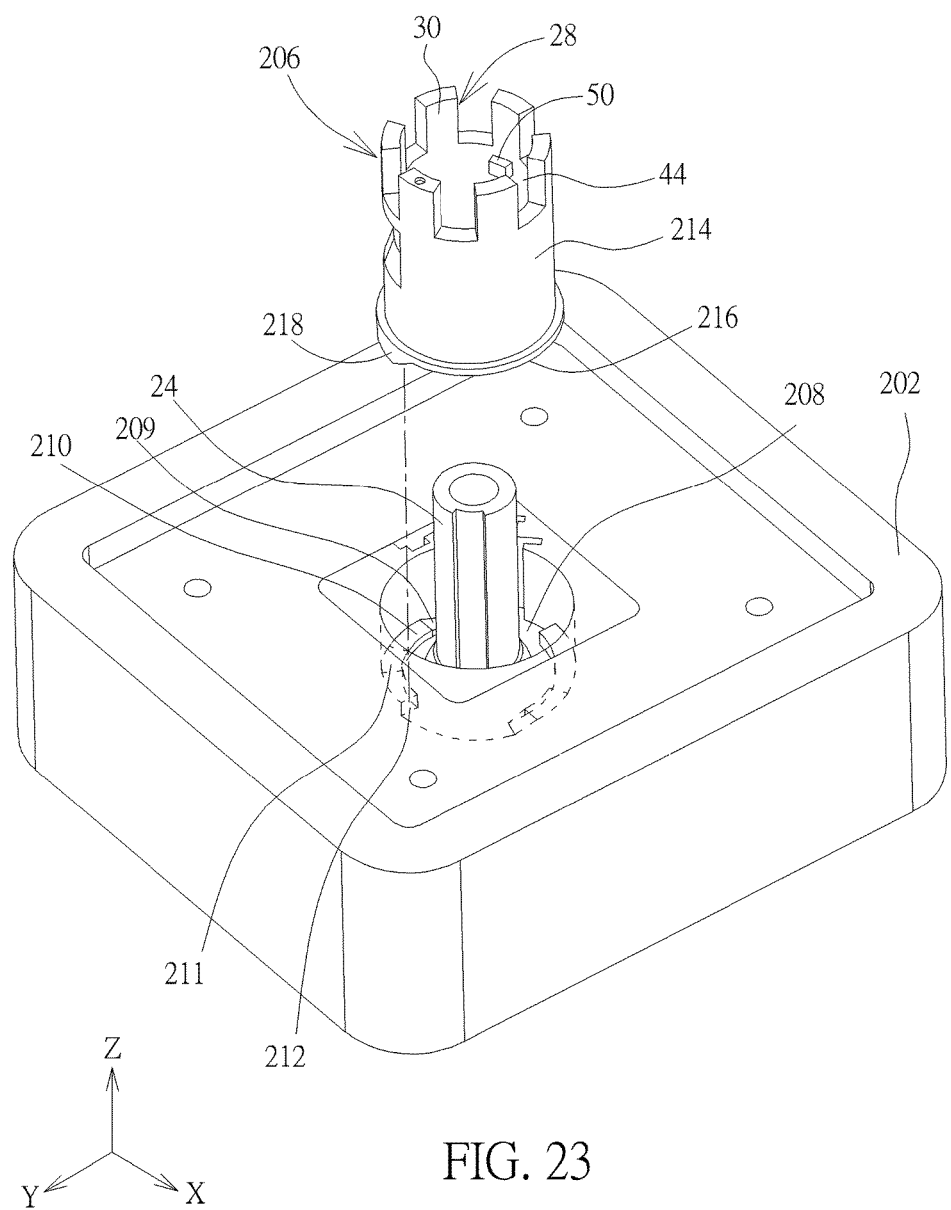
FIG. 23 is an exploded diagram of an external sleeve and a base in FIG. 22.
Figure 23A:
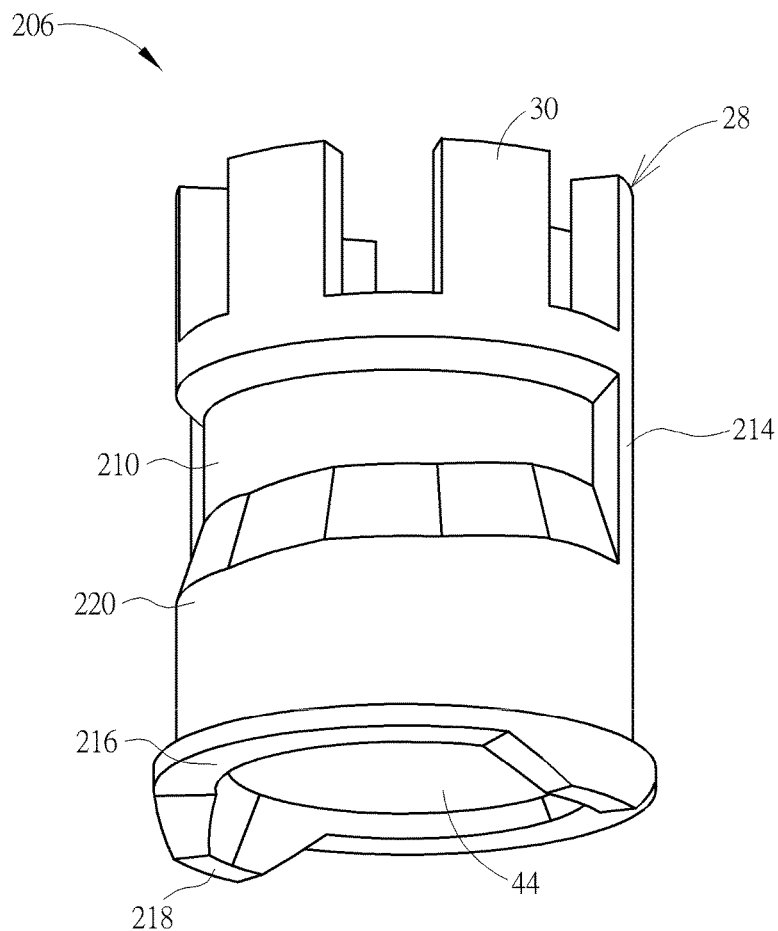
FIG. 23A is an enlarged diagram of the external sleeve in FIG. 22.
Figure 23B:
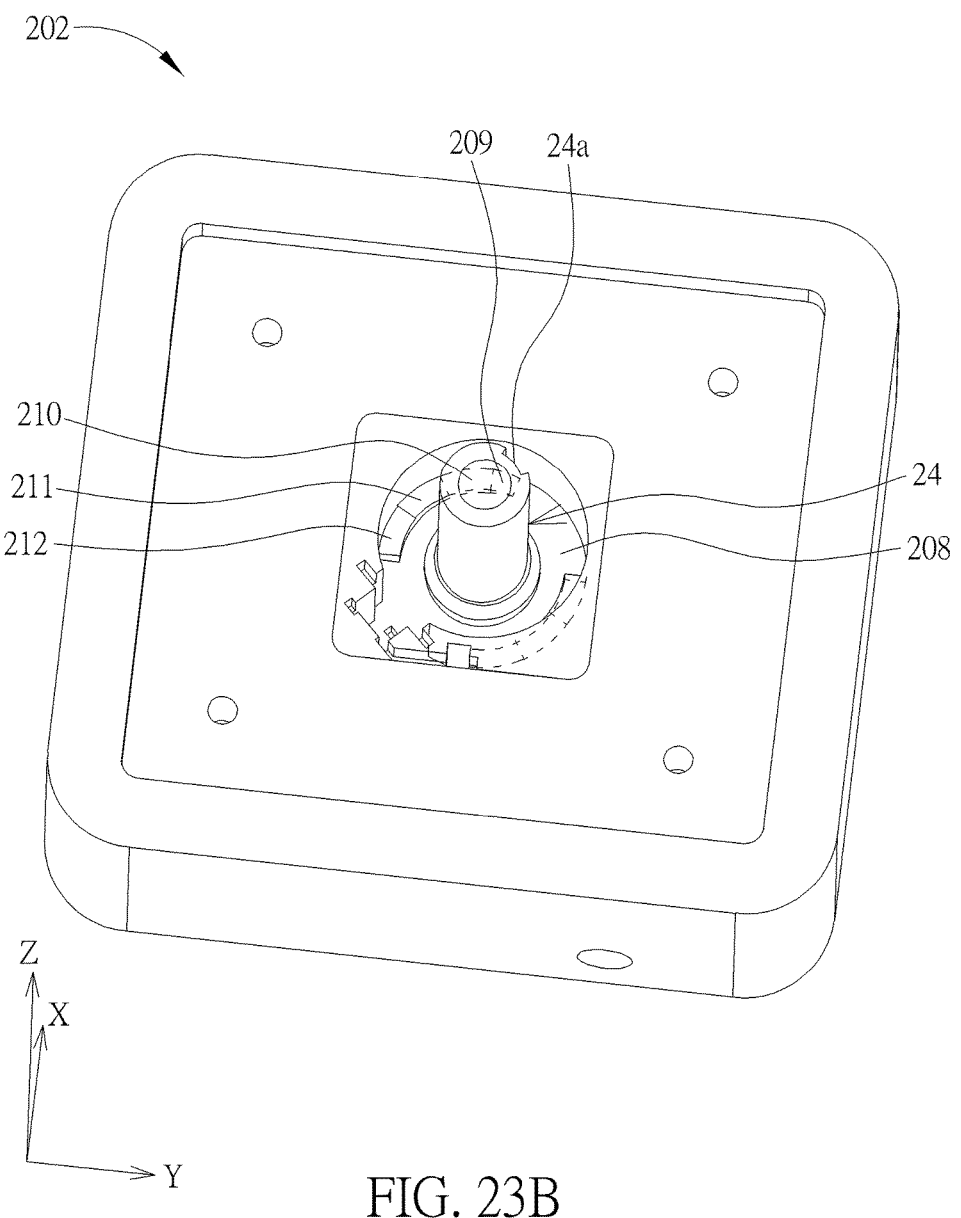
FIG. 23B is an enlarged diagram of the base in FIG. 23B.
Figure 24:
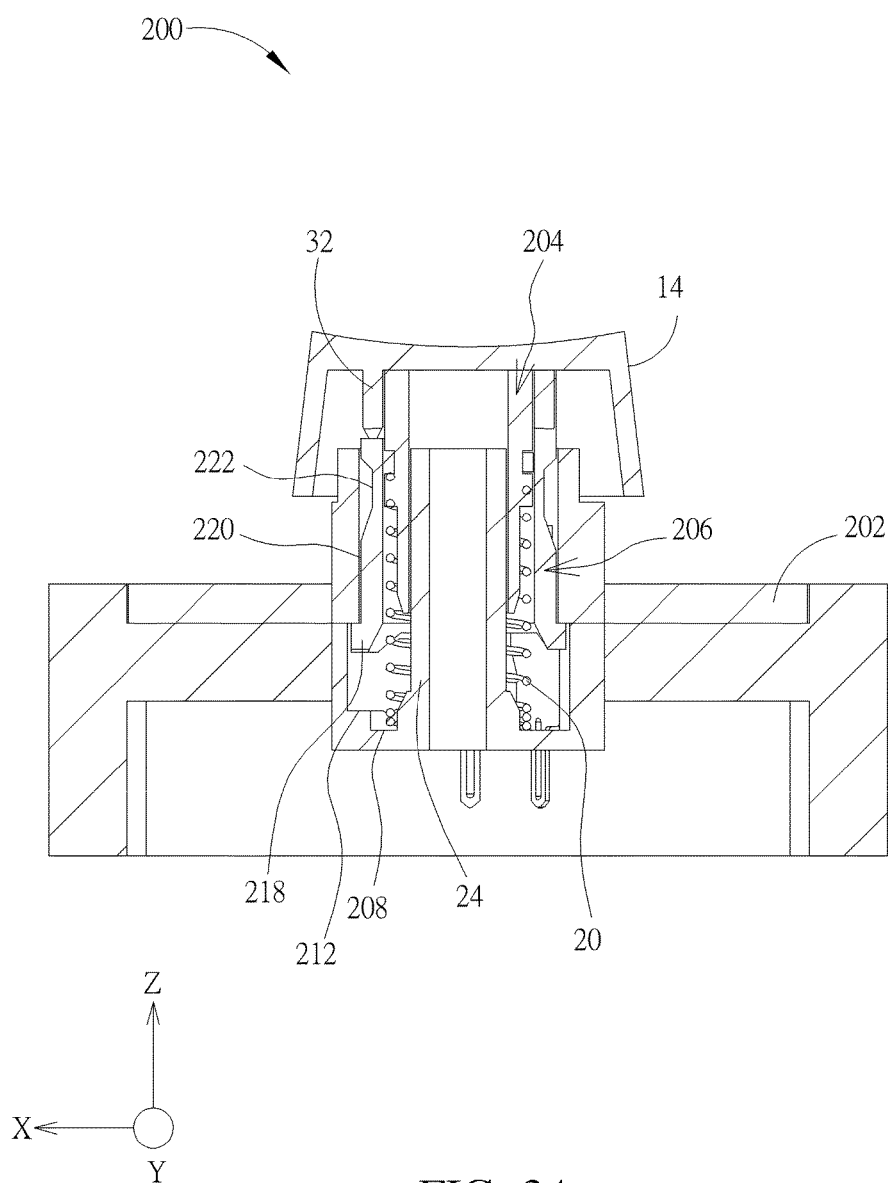
FIG. 24 is a cross-sectional diagram of the keyswitch in FIG. 22 along a cross-sectional line F-F' when the cap is assembled with the base.
Figure 25:
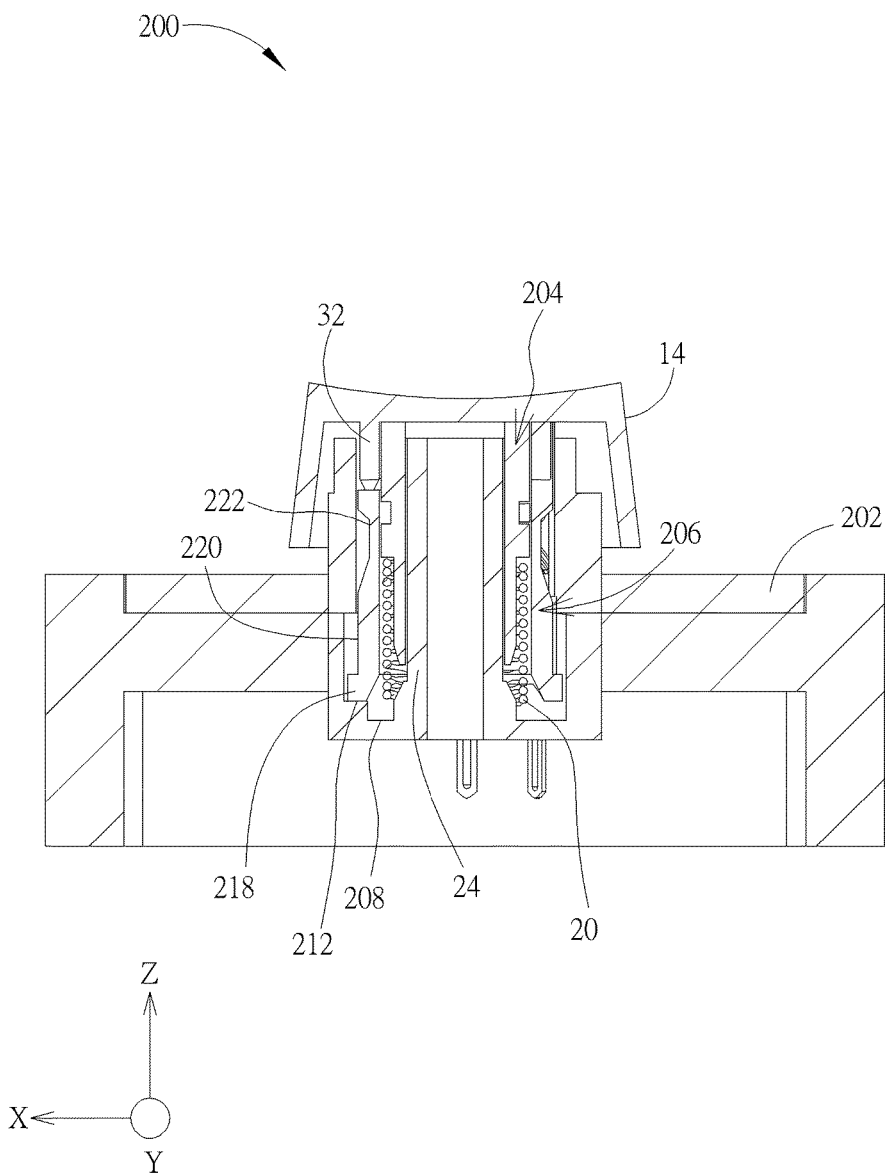
FIG. 25 is a cross-sectional diagram of the cap in FIG. 24 being pressed.
Figure 26:
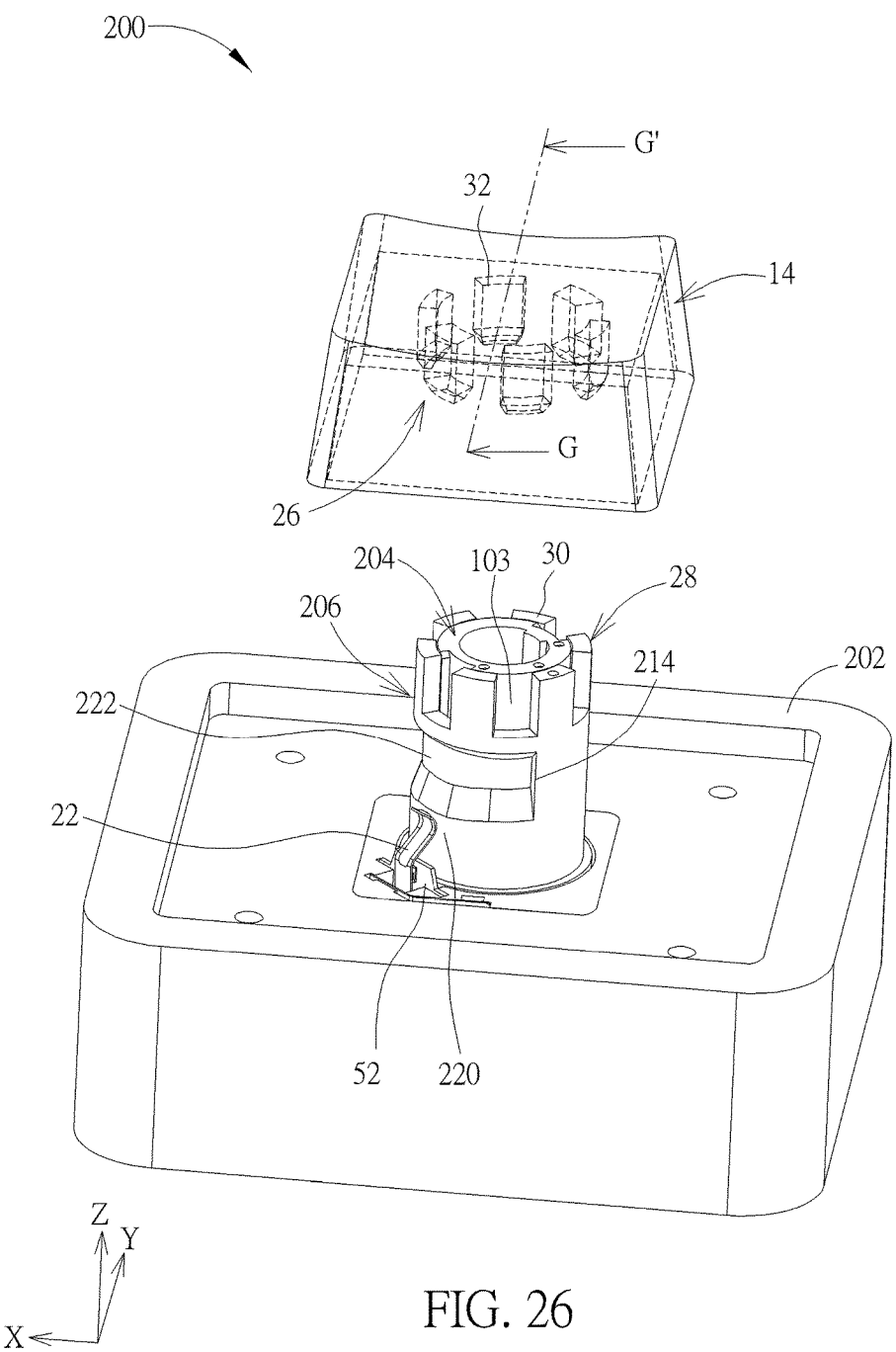
FIG. 26 is a partial exploded diagram of the keyswitch in FIG. 22 when the external sleeve continues rotating (clockwise from a top view) to make a protruding point of the external sleeve be located above a first bock.
Figure 27:
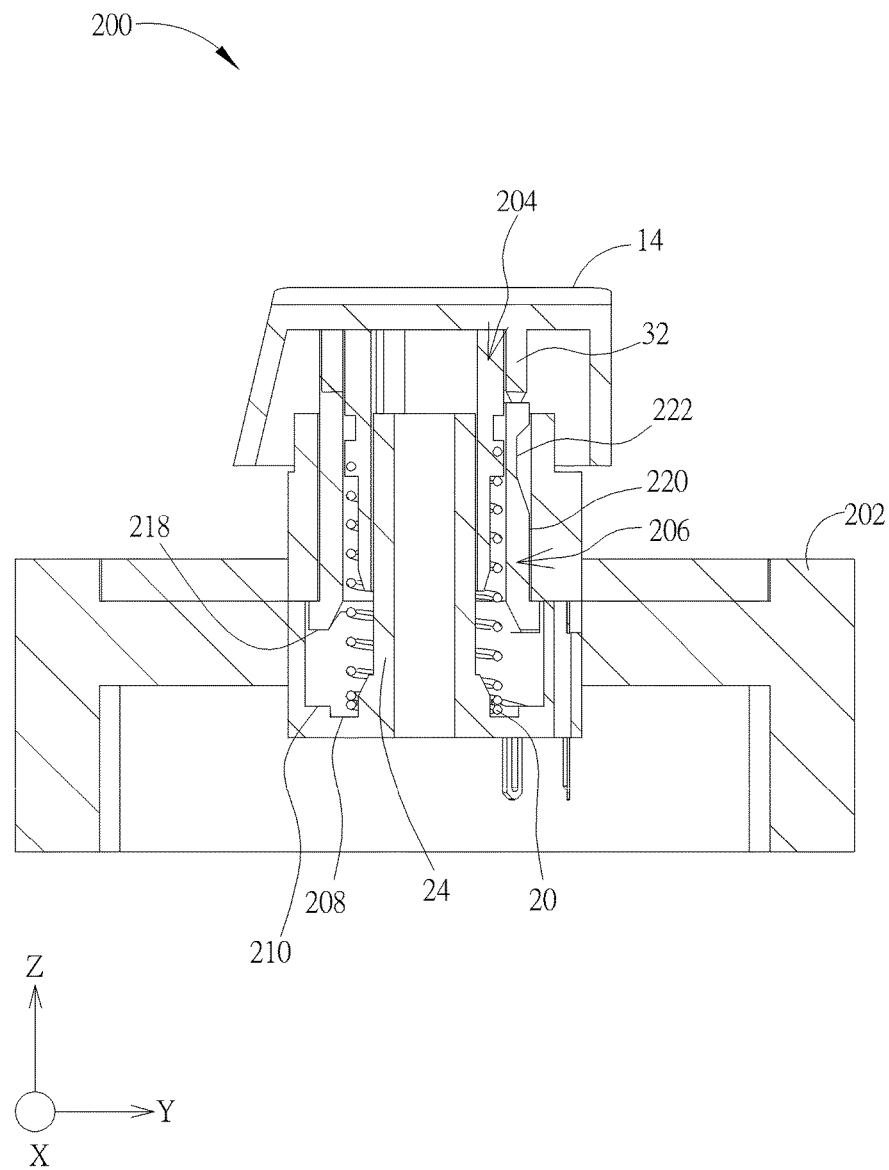
FIG. 27 is a cross-sectional diagram of the keyswitch in FIG. 26 along a cross-sectional line G-G' when the cap is assembled with the base.
Figure 28:
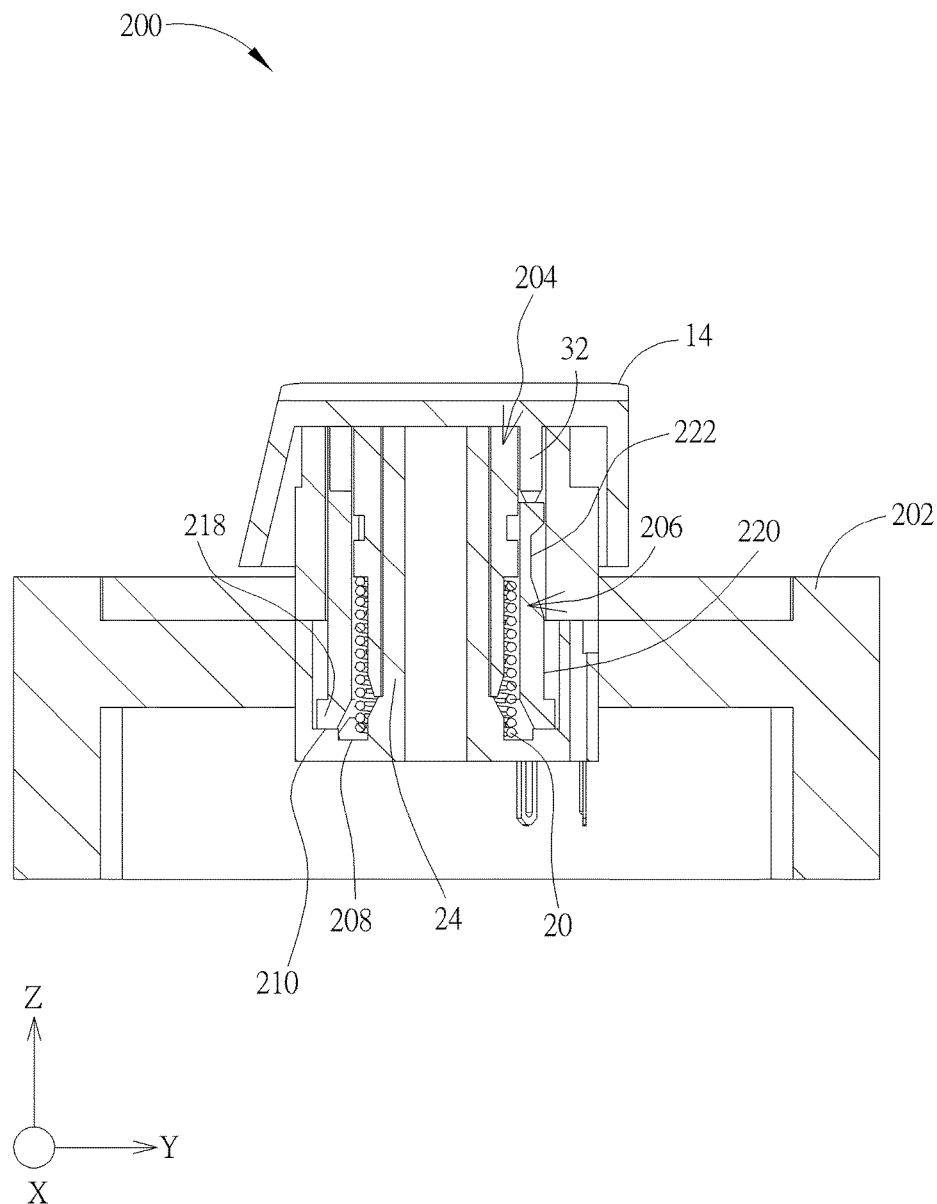
FIG. 28 is a cross-sectional diagram of the cap in FIG. 27 being pressed.
Figure 29:
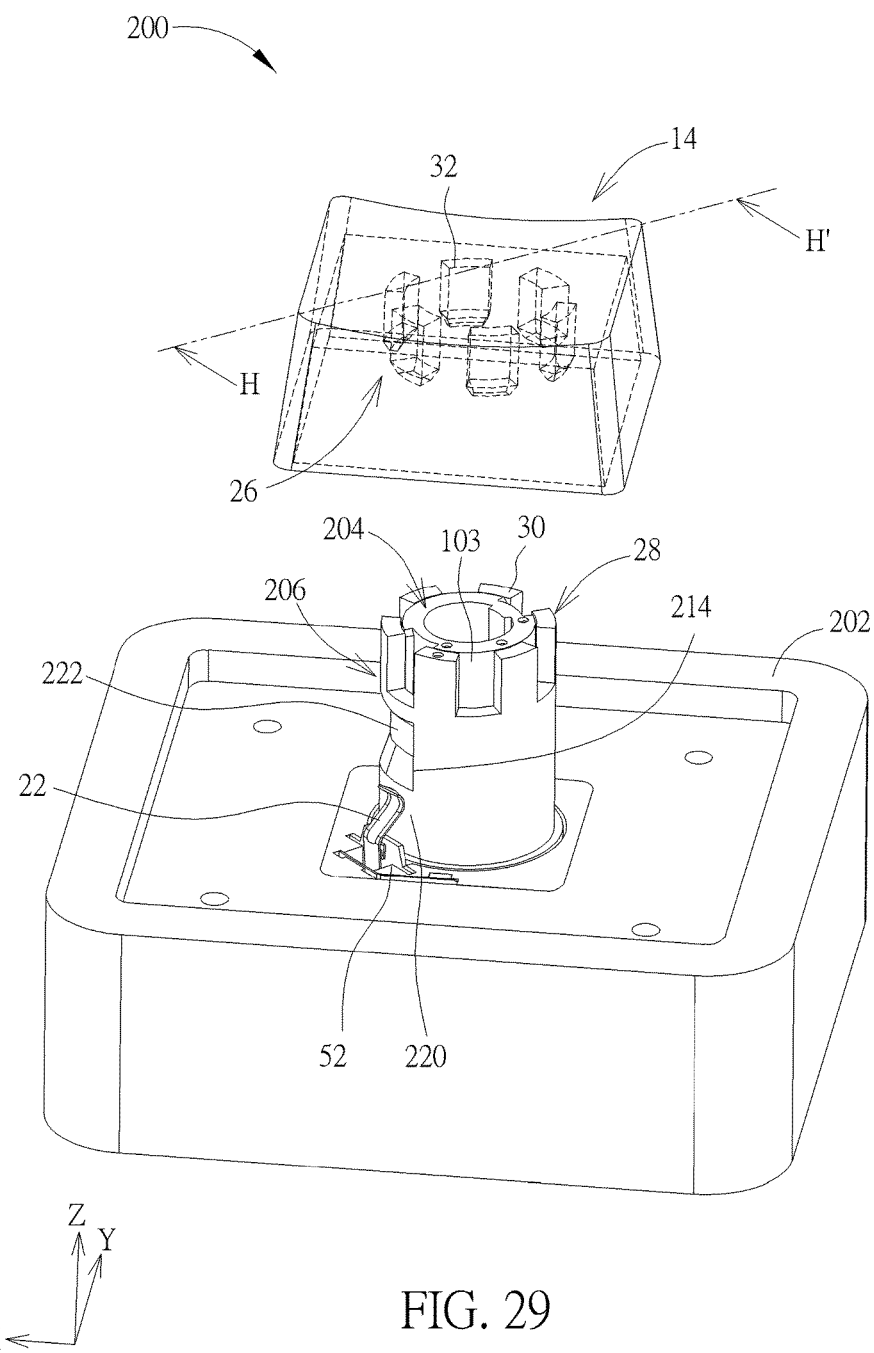
FIG. 29 is a partial exploded diagram of the keyswitch in FIG. 22 when the external sleeve continues rotating (clockwise from a top view) to make the protruding point of the external sleeve be located above a top surface.
Figure 30:
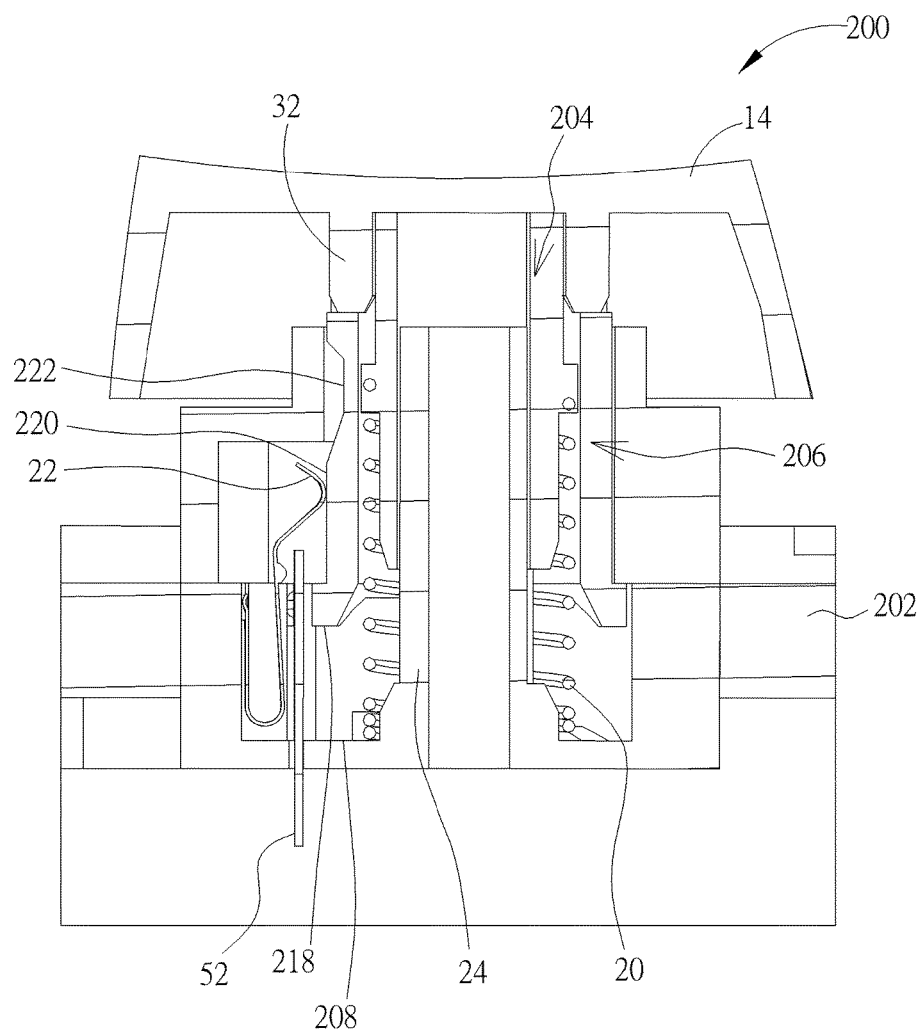
FIG. 30 is a cross-sectional diagram of the keyswitch in FIG. 29 along a cross-sectional line H-H' when the cap is assembled with the base.
Figure 31:
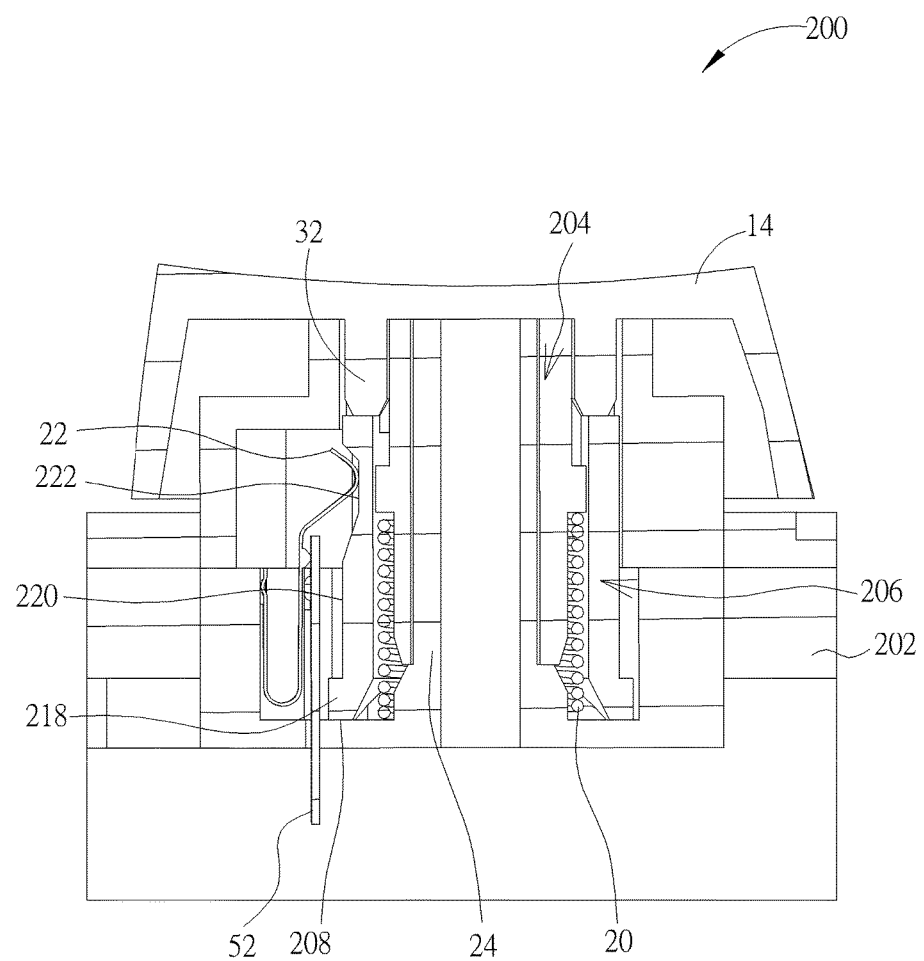
FIG. 31 is a cross-sectional diagram of the cap in FIG. 30 being pressed.

For example, please refer to FIG. 22, FIG. 23, FIG. 23A, FIG. 23B, FIG. 24, FIG. 25, FIG. 26, FIG. 27, FIG. 28, FIG. 28, FIG. 30, and FIG. 31. FIG. 22 is a diagram of a keyswitch 200 according to a third embodiment of the present invention. FIG. 23 is an exploded diagram of the external sleeve 206 and a base 202 in FIG. 22. FIG. 23A is an enlarged diagram of the external sleeve 206 in FIG. 22. FIG. 23B is an enlarged diagram of the base 202 in FIG. 23B. FIG. 24 is a cross-sectional diagram of the keyswitch 200 in FIG. 22 along a cross-sectional line F-F' when the cap 14 is assembled with the base 202. FIG. 25 is a cross-sectional diagram of the cap 14 in FIG. 24 being pressed. FIG. 26 is a partial exploded diagram of the keyswitch 200 in FIG. 22 when the external sleeve 206 continues rotating (clockwise from a top view) to make a protruding point 218 of the external sleeve 206 being located above a first bock 210. FIG. 27 is a cross-sectional diagram of the keyswitch 200 in FIG. 26 along a cross-sectional line G-G' when the cap 14 is assembled with the base 202. FIG. 28 is a cross-sectional diagram of the cap 14 in FIG. 27 being pressed. FIG. 29 is a partial exploded diagram of the keyswitch 200 in FIG. 22 when the external sleeve 206 continues rotating (clockwise from a top view) to make the protruding point 218 of the external sleeve 206 being located above a top surface 208. FIG. 30 is a cross-sectional diagram of the keyswitch 200 in FIG. 29 along a cross-sectional line H-H' when the cap 14 is assembled with the base 202. FIG. 31 is a cross-sectional diagram of the cap 14 in FIG. 30 being pressed. For clearly showing the internal mechanical design of the keyswitch 200, only bottom half structure is briefly depicted for the base 202 in FIGS. 22, 23, 23B, 26, and 29. Components both mentioned in this embodiment and the aforesaid embodiments represent components with similar structures or functions, and the related description is omitted herein.

As shown in FIGS. 22-31, the keyswitch 200 includes the base 202, the cap 14, an internal sleeve 204, the external sleeve 206, the elastic member 20, and the resilient arm 22 adjacent to the pillar 24 (disposal of the contact point 52 can be selectively applied to this embodiment). Since only the longitudinal slot 116 is omitted, the internal sleeve 204 can be regarded as having the same structure design with the internal sleeve 102 in FIG. 10B. The base 202 has the pillar 24, the top surface 208, the first block 210, and a second block 212. The first block 210 and the second block 212 can be in an arc shape and take the pillar 24 as a center of curvature. The first block 210 and the second block 212 protrude from the top surface 208, and the second block 212 is higher than the first block 210 along the Z-axis. Furthermore, in this embodiment, the base 202 can further have bridge blocks 209 and 211. The bridge block 209 extends from the top surface 208 upward and obliquely to be connected to the first block 210. The bridge block 211 extends from the first block 210 upward and obliquely to be connected to the second block 212. Accordingly, the protruding point 218 located at the bottom end of the external sleeve 206 can slide smoothly to the first block 210, the second block 212 and the top surface 208.

In this embodiment, the internal sleeve 204 and the external sleeve 206 moves relatively along the Z-axis or rotates relatively around the Z-axis, and relative movement between the internal sleeve 204 and the external sleeve 206 along the plane containing the X-axis and the Y-axis is constrained. The internal sleeve 204 can have the first outer annular surface 103. The elastic member 20 jackets the pillar 24 and abuts against the internal sleeve 201 and the base 202 respectively for driving the internal sleeve 204 to move away from the base 20 along the Z-axis. The external sleeve 206 has a second outer annular surface 214 and the inner annular surface 44. The external sleeve 206 jackets the internal sleeve 204 via the inner annular surface 44.

A bottom end of the external sleeve 206 has a bottom annular edge 216 formed thereon. A protruding point 218 extends from the bottom annular edge 216 toward the base 202. The second outer annular surface 214 has a convex portion 220 and a concave portion 222. The convex portion 220 and the concave portion 222 substantially extend along the plane containing the X-axis and the Y-axis. The inner annular surface 44 has the protruding block 50, and the protruding bock 50 can be movably inserted into the transverse slot 106 on the first outer annular surface 103 of the internal sleeve 204 (not shown in the figures of this embodiment, and the related description can be reasoned by analogy according to FIG. 11). The protruding block 50 guides the external sleeve 206 to rotate around the Z-axis, so as to make the protruding point 218 selectively located above the top surface 208, the first block 210, or the second block 212.

To be more specific, as shown in FIGS. 23-25, when the external sleeve 206 rotates around the Z-axis to make the protruding point 218 located above the second block 212 and then the cap 14 is pressed along the Z-axis, the external sleeve 206 and the internal sleeve 204 move together until the protruding point 218 abuts against the second block 212 (as shown in FIG. 25). As shown in FIG. 22, during the cap 14 moves downward along the Z-axis, the resilient arm 22 moves upward from the convex portion 220 to the concave portion 222 via an inclined transition portion for triggering the keyswitch 200. At this time, a maximum movable distance of the cap 14 along the Z-axis is set as a third travel distance, so as to provide a tactile feedback with a relatively short travel distance of the cap 14 during the user presses the keyswitch 200.

On the other hand, when the user wants to increase the travel distance of the cap 14, the user just needs to rotate the external sleeve 206 around the Z-axis from a position as shown in FIG. 22 (at this time, the protruding point 218 is located above the second block 212 as shown in FIG. 24) clockwise to a position as shown in FIG. 26 (at this time, the protruding point 218 is located above the first block 210 as shown in FIG. 27). In such a manner, when the protruding point 218 is located above the first block 210 and then the cap 14 is pressed along the Z-axis, the external sleeve 206 and the internal sleeve 204 move together until the protruding point 218 abuts against the first block 210 (as shown in FIG. 28). Accordingly, the maximum movable distance of the cap 14 along the Z-axis is set as a second travel distance. As shown in FIG. 24 and FIG. 27, the second travel distance is larger than the third travel distance, so as to provide a tactile feedback with a relatively longer travel distance of the cap 14 during the user presses the keyswitch 200.

Furthermore, when the user continues rotating the external sleeve 206 around the Z-axis from the position as shown in FIG. 26 clockwise (from a top view) to a position as shown in FIG. 29 (at this time, the protruding point 218 is located above the top surface 208 as shown in FIG. 30). In such a manner, when the protruding point 218 is located above the top surface 208 and then the cap 14 is pressed along the Z-axis, the external sleeve 206 and the internal sleeve 204 move together until the protruding point 218 abuts against the top surface 208 (as shown in FIG. 31). Accordingly, the maximum movable distance of the cap 14 along the Z-axis is set as a first travel distance. As shown in FIGS. 24, 27 and 30, the first travel distance is larger than the second travel distance and the third travel distance to provide a tactile feedback with a relatively longest travel distance of the cap 14 during the user presses the keyswitch 200.

Figure 32:
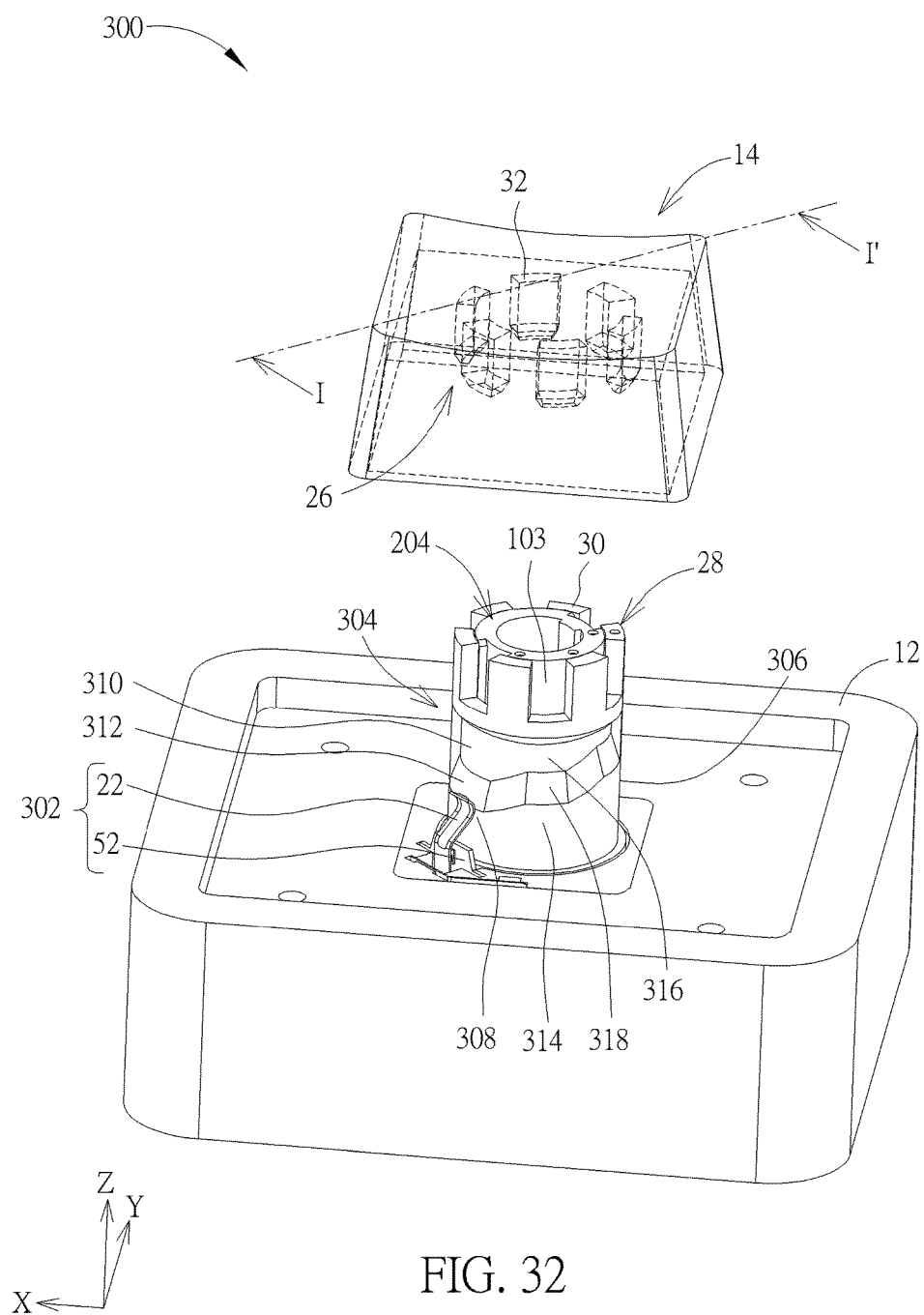
FIG. 32 is an enlarged diagram of a keyswitch according to another embodiment of the present invention.
Figure 32A:
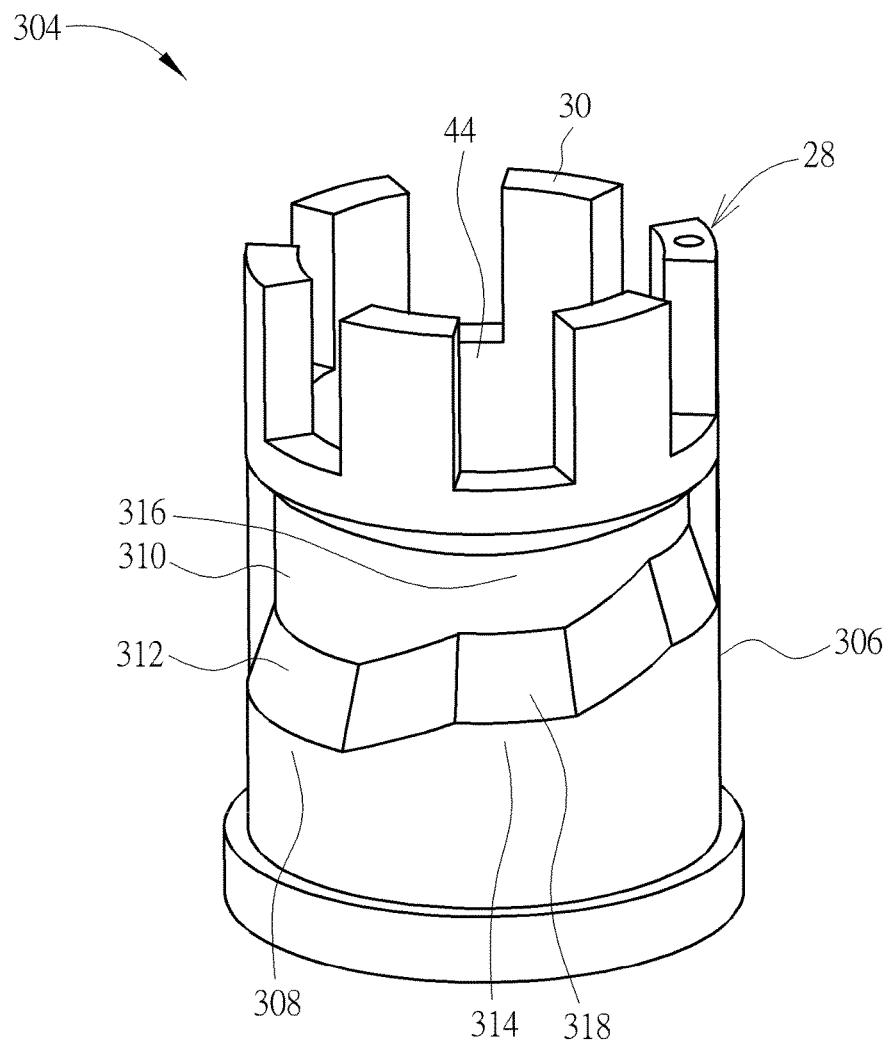
FIG. 32A is an enlarged diagram of an external sleeve in FIG. 32.
Figure 33:
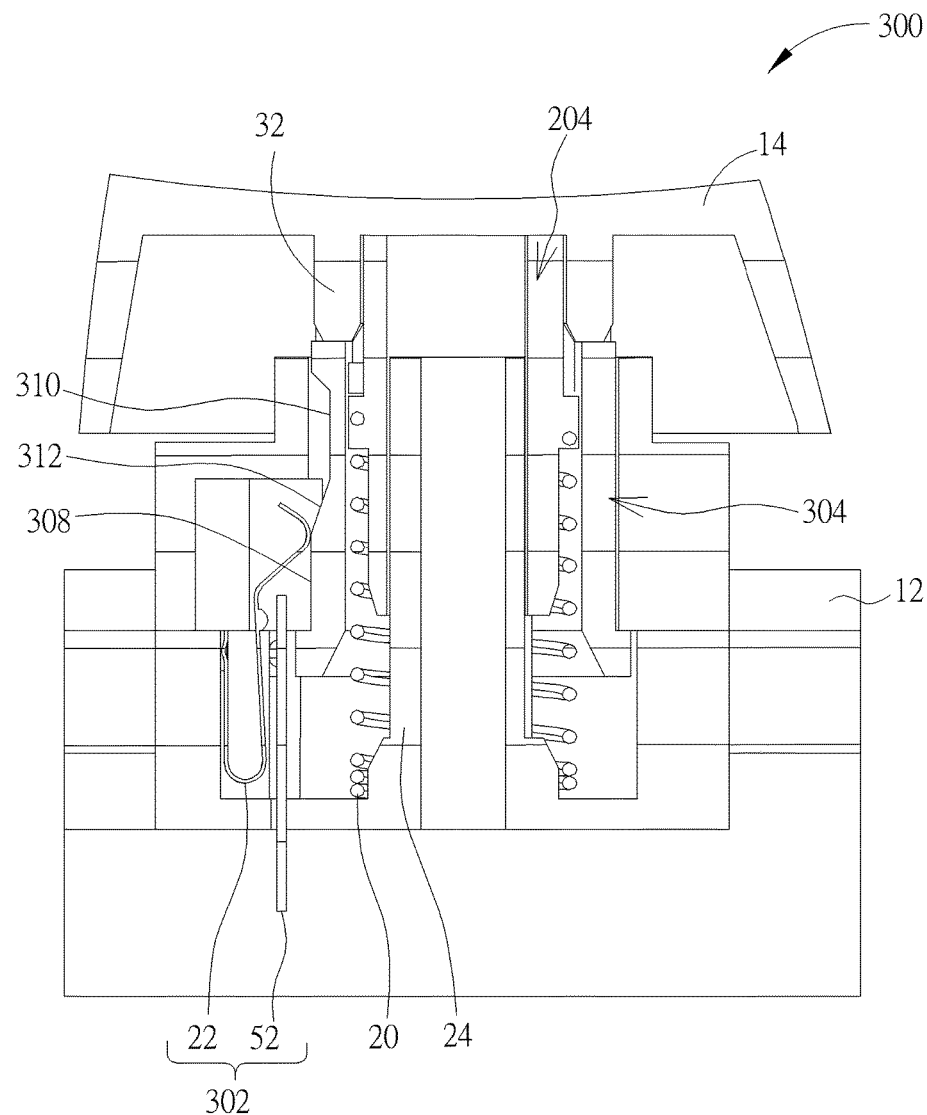
FIG. 33 is a cross-sectional diagram of the keyswitch in FIG. 32 along a cross-sectional line I-I'.
Figure 34:
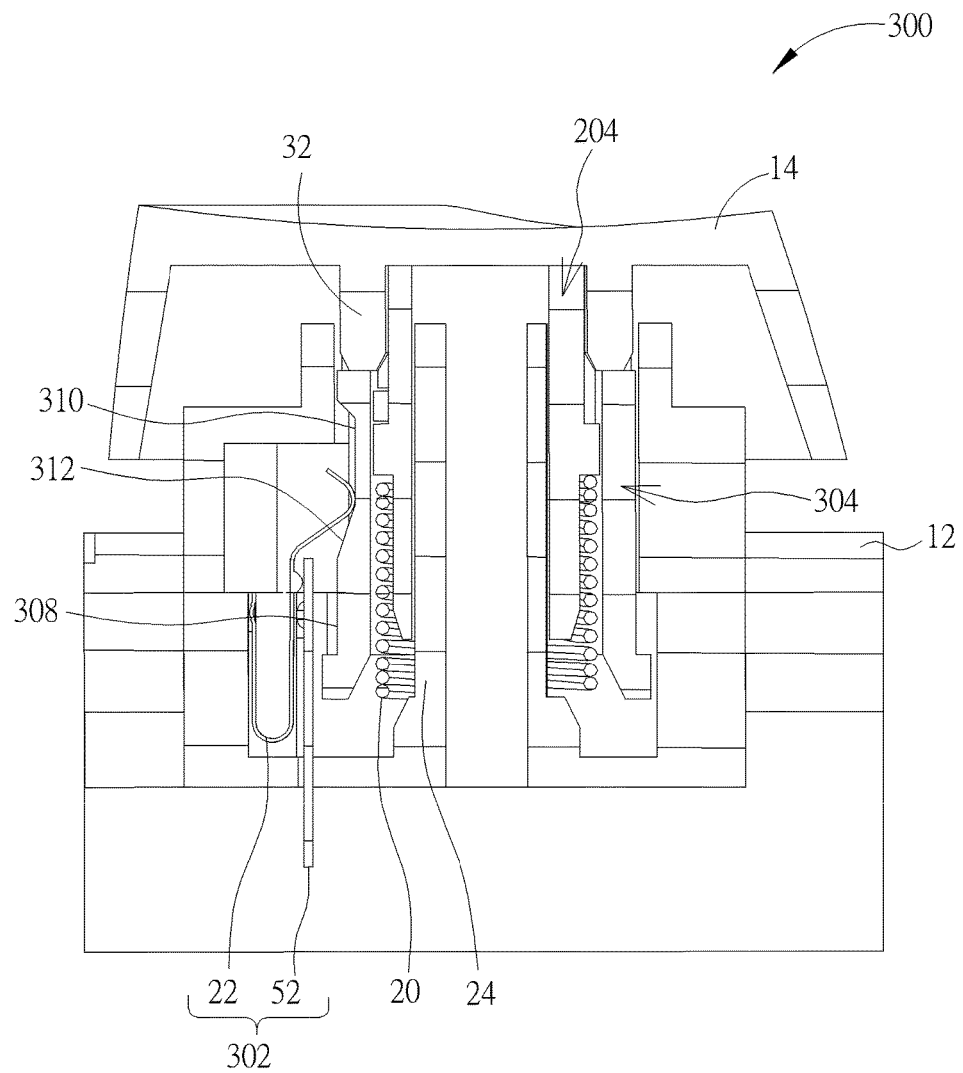
FIG. 34 is a cross-sectional diagram of the cap in FIG. 33 being pressed to make the resilient arm be located at a first triggering position.
Figure 35:
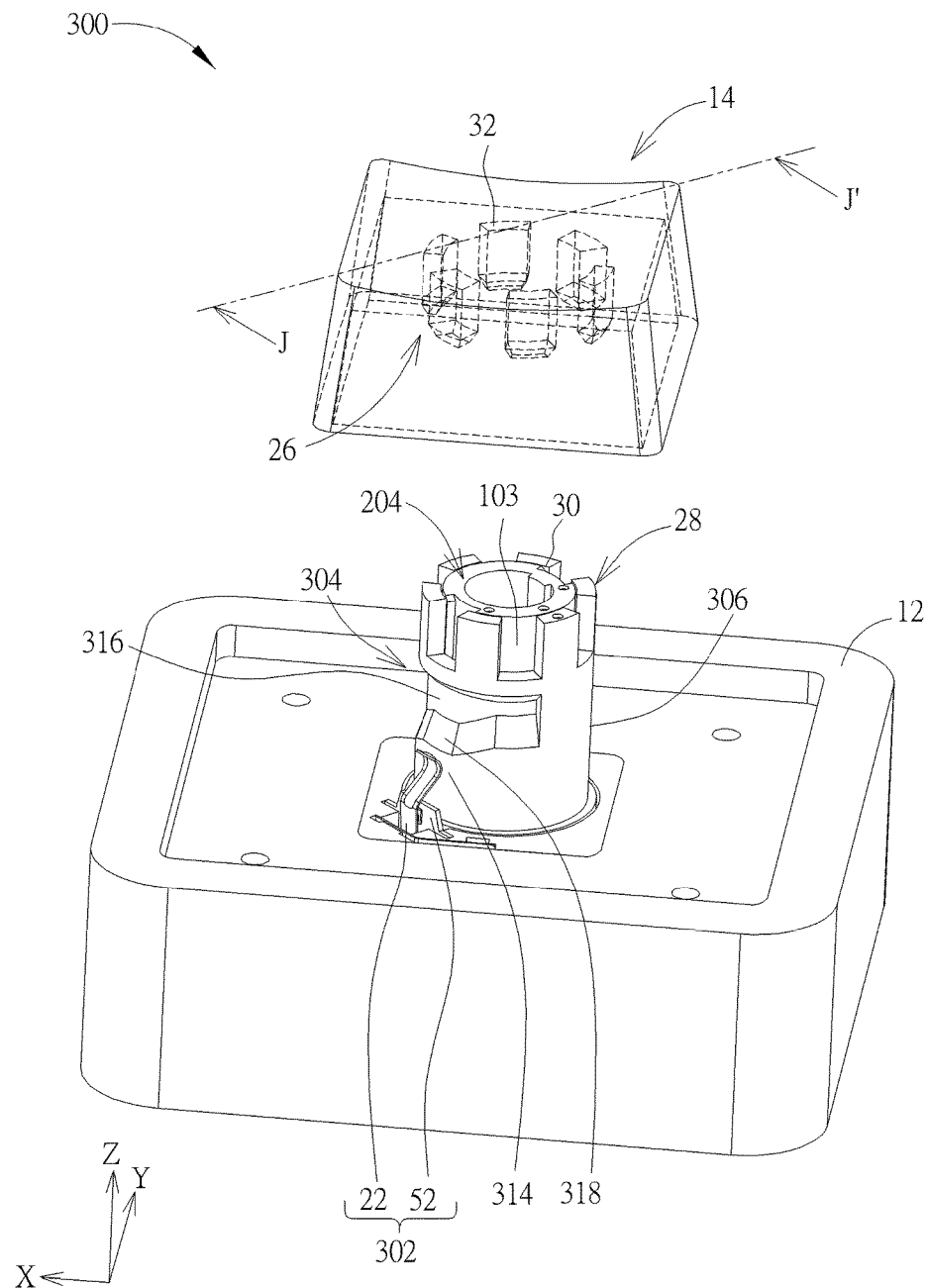
FIG. 35 is a partial exploded diagram of the keyswitch in FIG. 31 when the external sleeve continues rotating (clockwise from a top view) to make the resilient arm abut against a second convex portion.
Figure 36:
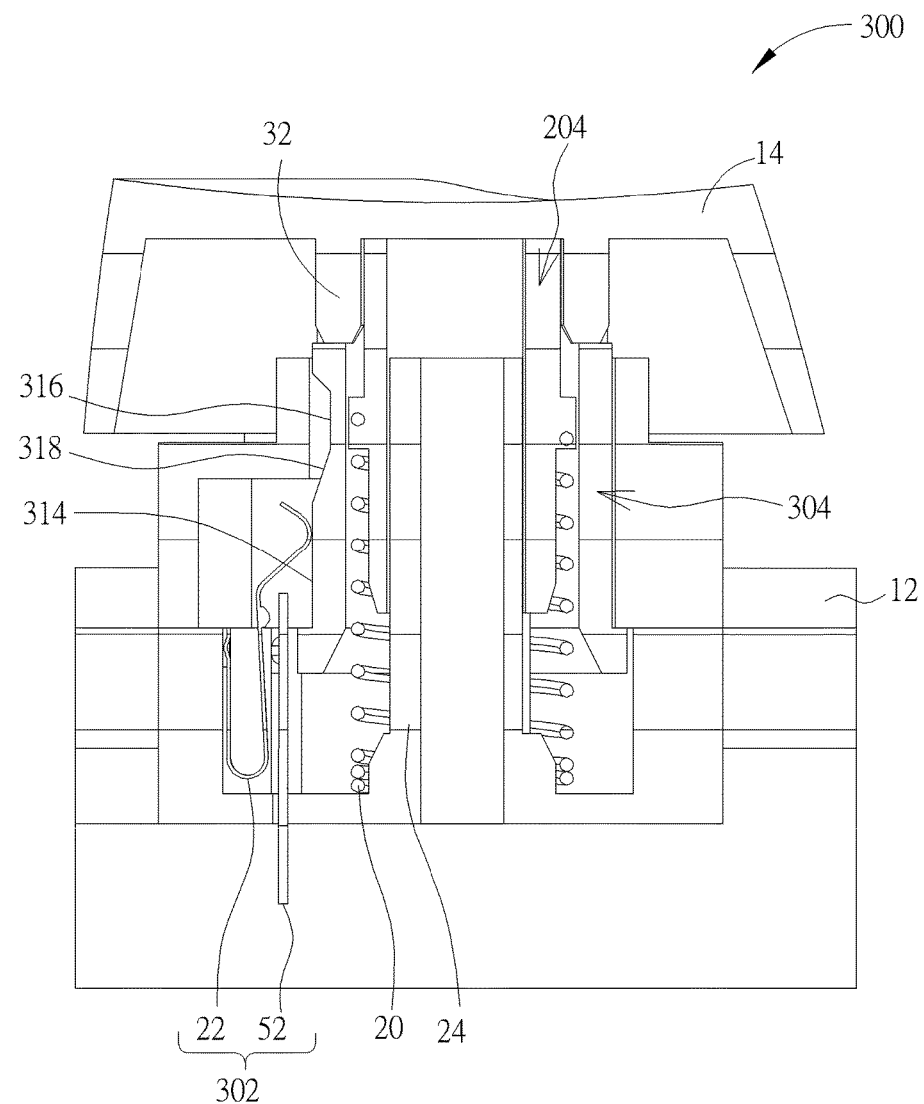
FIG. 36 is a cross-sectional diagram of the keyswitch in FIG. 35 along a cross-sectional line J-J'.
Figure 37:
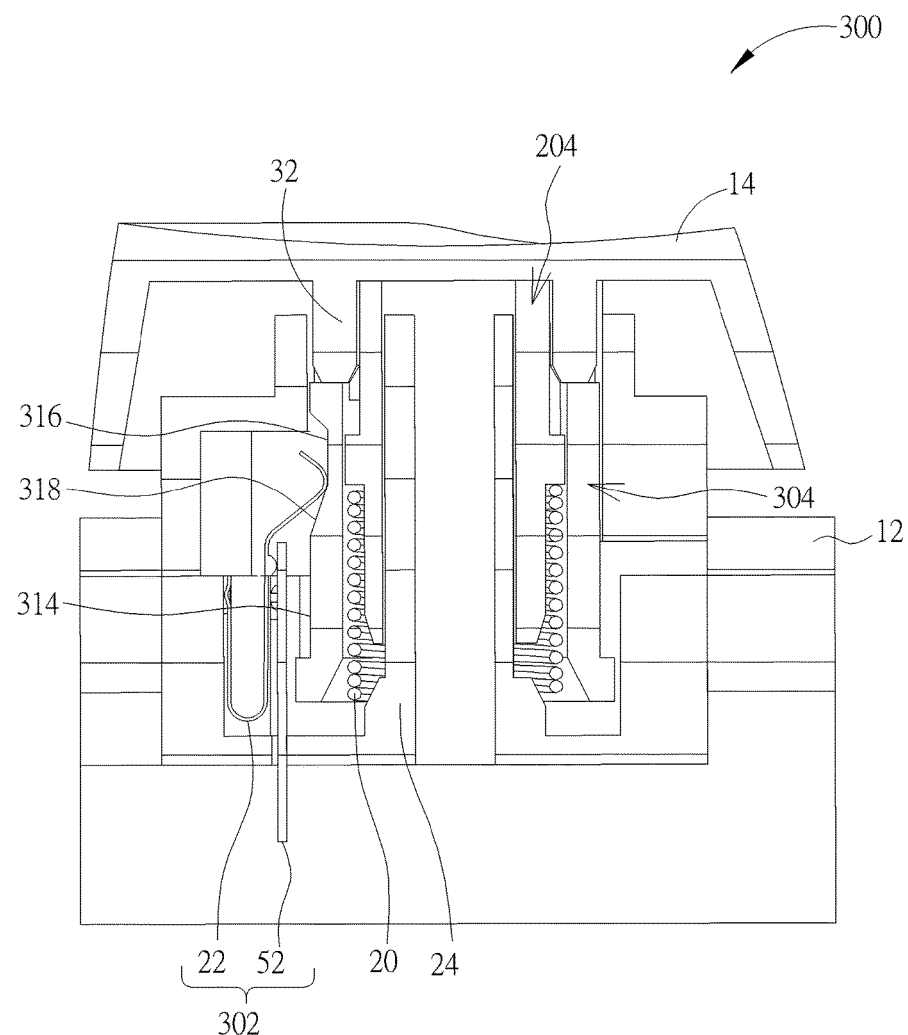
FIG. 37 is a cross-sectional diagram of the cap in FIG. 36 being pressed to make the resilient arm be located at a second triggering position.

Please refer to FIG. 32, FIG. 32A, FIG. 33, FIG. 34, FIG. 35, FIG. 36, and FIG. 37. FIG. 32 is an enlarged diagram of a keyswitch 300 according to another embodiment of the present invention. FIG. 32A is an enlarged diagram of an external sleeve 304 in FIG. 32. FIG. 33 is a cross-sectional diagram of the keyswitch 300 in FIG. 32 along a cross-sectional line I-I'. FIG. 34 is a cross-sectional diagram of the cap 14 in FIG. 33 being pressed to make the resilient arm 22 located at a first triggering position. FIG. 35 is a partial exploded diagram of the keyswitch 300 in FIG. 31 when the external sleeve 304 continues rotating (clockwise from a top view) to make the resilient arm 22 abut against a second convex portion 314. FIG. 36 is a cross-sectional diagram of the keyswitch 300 in FIG. 35 along a cross-sectional line J-J'. FIG. 37 is a cross-sectional diagram of the cap 14 in FIG. 36 being pressed to make the resilient arm 22 located at a second triggering position. For clearly showing the internal mechanical design of the keyswitch 300, only bottom half structure is briefly depicted for the base 12 in FIGS. 32 and 35. Components both mentioned in this embodiment and the aforesaid embodiments represent components with similar structures or functions, and the related description is omitted herein.

As shown in FIGS. 33-37, the keyswitch 300 includes the base 12, the cap 14, a switch unit 302, the internal sleeve 204, the external sleeve 304, and the elastic member 20. The switch unit 302 is adjacent to the pillar 24 and has the resilient arm 22 and the contact point 52. The switch unit 302 is electrically connected to a circuit board (not shown in the figures) of the keyswitch 300. The external sleeve 304 has a second outer annular surface 306 and the inner annular surface 44 and sleeve the internal sleeve 204 via the inner annular surface 44. The second outer annular surface 306 has a first convex portion 308, a first concave portion 310, a first transition portion 312, the second convex portion 314, a second concave portion 316, and a second transition portion 318 higher than the first transition portion 312 along the Z-axis. As shown in FIG. 32, the first convex portion 308, the first transition portion 312 and the first concave portion 310 are arranged from down to up along the Z-axis, and the second convex portion 314, the second transition portion 318 and the second concave portion 316 are arranged from down to up along the Z-axis. The first triggering position is defined by where the first transition portion 312 and the first concave portion 310 meet and the second triggering position is defined by where the second transition portion 318 and the second concave portion 316 meet (but not limited thereto), meaning that the second triggering position is higher than the first triggering position.

To be more specific, as shown in FIG. 32 and FIG. 33, when the cap 14 is located at the non-pressed position, the resilient arm 22 abuts against the first convex portion 308 to be separate from the contact point 52. When the cap 14 is pressed to the position as shown in FIG. 34, the resilient arm 152 moves upward from the first convex portion 308 to the first concave portion 310 via the first transition portion 312. During this process, deformation of the resilient arm 22 is reduced to make the resilient arm 22 located at the first triggering position as shown in FIG. 34 abut against the contact point 52. In such a manner, a corresponding input signal can be transmitted to the circuit board of the keyswitch 300, so that the keyswitch 300 can perform a corresponding input function. Accordingly, since the resilient arm 22 abuts against the contact point 52 at the first triggering position as shown in FIG. 34, the keyswitch 300 can provide a tactile feedback that the cap 14 is triggered at a relatively high triggering position when the user presses the cap 14.

On the other hand, when the user wants to adjust the triggering position of the keyswitch 300, the user just needs to rotate the external sleeve 304 around the Z-axis from a position as shown in FIG. 32 clockwise to a position as shown in FIG. 35. As shown in FIG. 35 and FIG. 36, when the cap 14 is not pressed, the second convex portion 314 abuts against the resilient arm 22 to cause outward deformation of the resilient arm 22 to make the resilient arm 22 separate from the contact point 52.

When the cap 14 is pressed to a position as shown in FIG. 37, the resilient arm 22 moves upward from the second convex portion 314 to the second concave portion 316 via the second transition portion 318. During the aforesaid process, deformation of the resilient arm 22 is reduced gradually so that the resilient arm 22 can abut against the contact point 52 after moving to the second triggering position for generating a corresponding input signal to the circuit board of the keyswitch 300. In such a manner, as shown in FIG. 34 and FIG. 37, since the second transition portion 318 is higher than the first transition portion 312, the cap 14 needs to move a longer distance downward to make the resilient arm 22 abut against the contact point 52 at the second triggering position (at this time, the cap 14 is located at a relatively low triggering position). On the contrary, as shown in FIG. 33 and FIG. 34, the cap 14 needs to move a shorter distance downward to make the resilient arm 22 abut against the contact point 52 at the first triggering position (at this time, the cap 14 is located at a relatively high triggering position). Accordingly, the keyswitch 300 allows that the user can switch the keyswitch 300 to provide a tactile feedback that the cap 14 is located at the relatively high triggering position or the relatively low triggering position when the keyswitch 300 is triggered.

Figure 38:
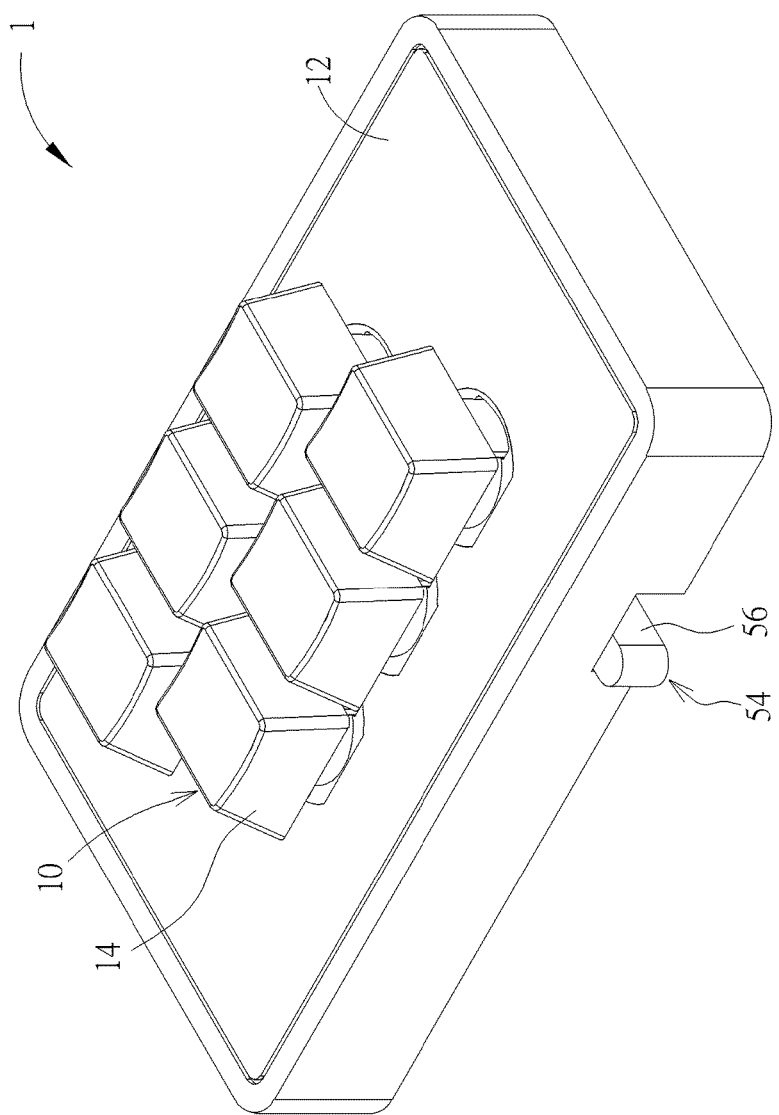
FIG. 38 is a diagram of a keyboard according to another embodiment of the present invention.
Figure 39:
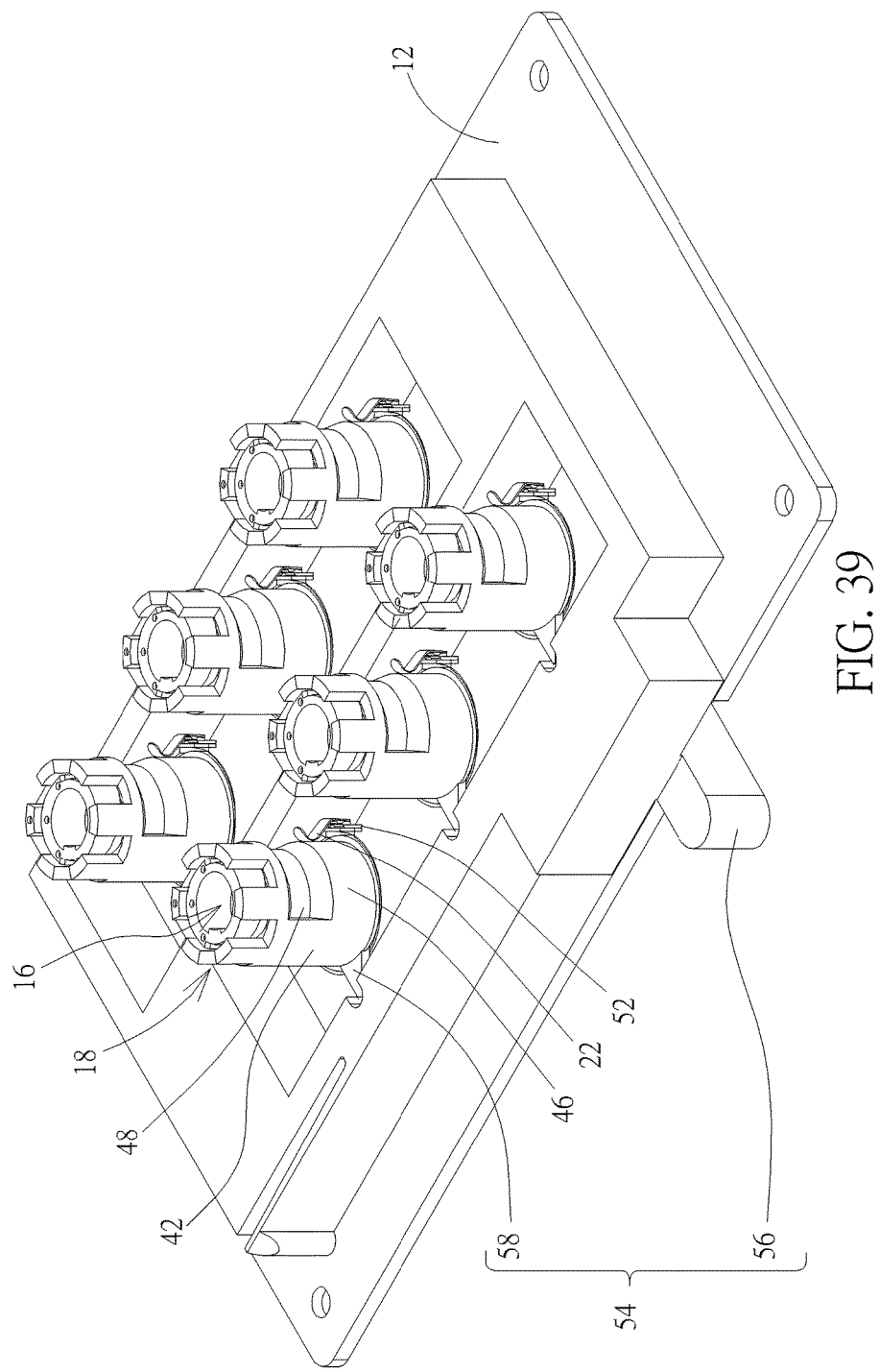
FIG. 39 is an internal enlarged diagram of the keyboard in FIG. 38.
Figure 40:
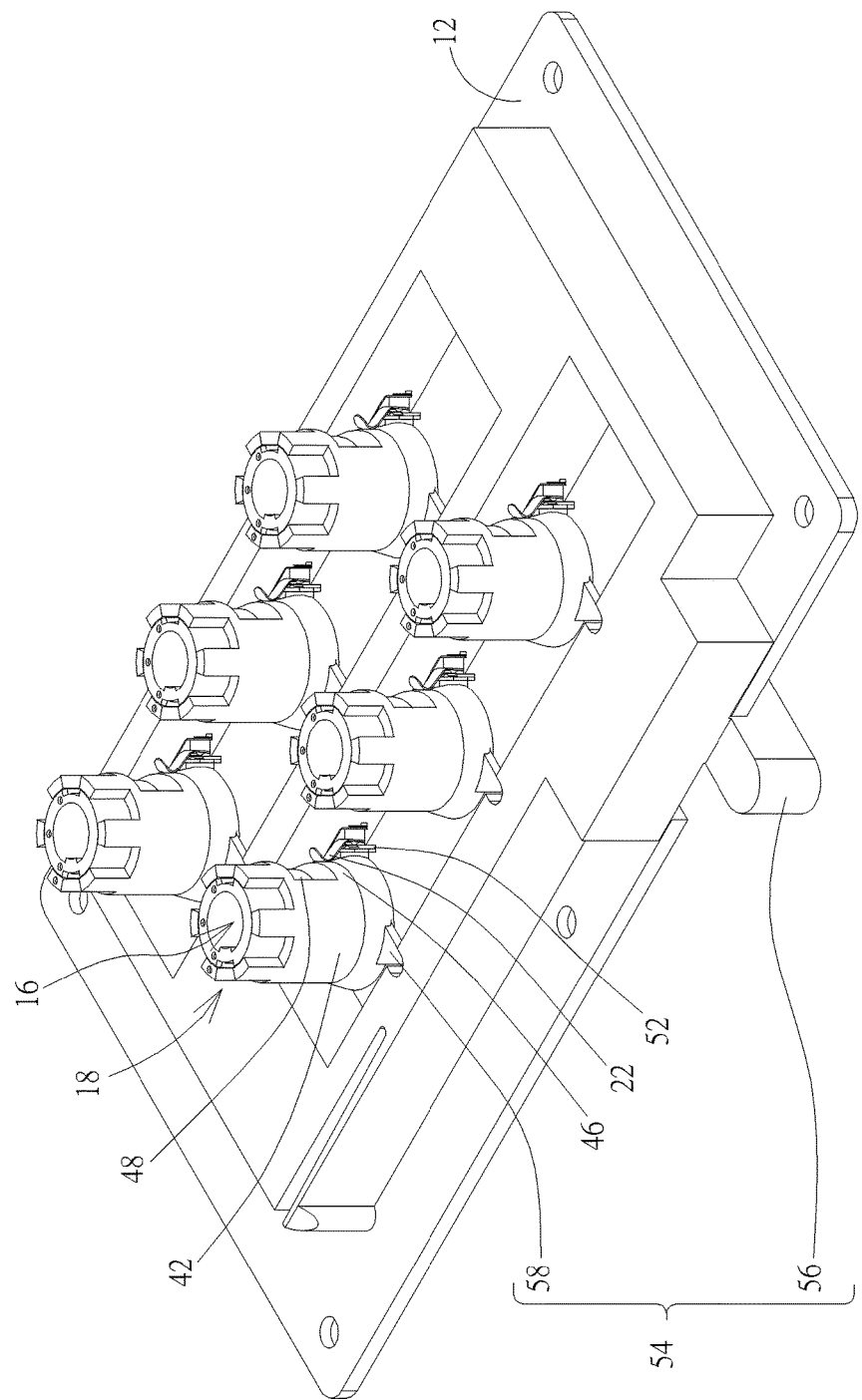
FIG. 40 is a diagram of a sliding plate of a linkage mechanism sliding relative to the base.

In practical application, the sleeve rotating design provided by the present invention is not limited to the aforesaid embodiments. More detailed description for the embodiment that the keyswitch 10 adopts a mechanical linkage design for performing the preload adjusting operation of the keyswitch 10 is provided as follows, but not limited thereto, meaning that the aforesaid mechanical linkage design can be applied to the keyswitch 100, the keyswitch 200, and the keyswitch 300. Please refer to FIG. 38, FIG. 39, and FIG. 40. FIG. 38 is a diagram of a keyboard 1 according to another embodiment of the present invention. FIG. 39 is an internal enlarged diagram of the keyboard 1 in FIG. 38. FIG. 40 is a diagram of a sliding plate 56 of a linkage mechanism 54 sliding relative to the base 12. For clearly showing the internal mechanical design of the keyboard 1, only the bottom half structure is depicted for the base 104 in FIGS. 39 and 40. Components both mentioned in this embodiment and the aforesaid embodiments represent components with similar structures or functions and the related description is omitted herein.

As shown in FIG. 38, FIG. 39, and FIG. 40, the keyboard 1 includes a plurality of keyswitches 10 (six as shown in FIG. 38, but not limited thereto), the base 12, and the linkage mechanism 54 is connected to the external sleeve 18 for rotating the external sleeve 18 relative to the base 12 around the Z-axis. In this embodiment, the linkage mechanism 548 can include the sliding plate 56 and a linkage member 58. The sliding plate 56 can slide relative to the base 12. The linkage member 58 extends outwardly from the second outer annular surface 42 of the external sleeve 18 to be movably connected to the sliding plate 56 (as shown in FIG. 39 and FIG. 40). Via the aforesaid linkage design, when the user wants to perform the preload adjusting operation of the keyswitch 10, the user just needs to drive the sliding plate 56 to slide relative to the base 12 to a position as shown in FIG. 39 or a position as shown in FIG. 40, for rotating the external sleeve 18 around the Z-axis via the linkage member 58. In such a manner, when the user presses the keyswitch 10, the keyswitch 10 can provide a tactile feedback as mentioned in the aforesaid embodiment such as a tactile feedback with a relatively large preload or a relatively small preload.

Furthermore, the design that the protruding block of the external sleeve moves along the oblique slot of the internal sleeve for prepressing the elastic member, the design that the protruding point of the external sleeve abuts against the protruding block or the top surface of the base for adjusting the travel distance of the cap, the design that the resilient arm abuts against different triggering positions on the external sleeve, the design that the resilient arm crosses the arc-shaped bar for generating a clicky tactile feedback, and the design that the external sleeve collides with the internal sleeve to make a sound can be applied to each other, so that the keyswitch provided by the present invention can provide a tactile feedback adjusting function via the multi-stage rotating operation of the external sleeve (e.g. the three-stage or two-stage rotating operation mentioned in the aforesaid embodiment).

For example, in another embodiment, the present invention can adopt the design that the keyswitch can make the protruding block of the external sleeve press the internal sleeve along the oblique slot of the internal sleeve for prepressing the elastic member and make the protruding point of the external sleeve located above the block of the base via the operation of rotating the external sleeve to a specific position relative to the base to provide a tactile feedback with a high preload and a short travel distance of the cap. In another embodiment, the present invention can adopt the design that the keyswitch can make the resilient arm trigger the contact point at a lower triggering position and make the external sleeve collide with the internal sleeve via the operation of rotating the external sleeve to a specific position relative to the base so that the keyswitch can provide a tactile feedback that the cap is triggered at the high triggering position or the low triggering position and can make a clicky sound during the user presses the cap. As for other derived embodiments, the related description can be reasoned by analogy according to the aforesaid embodiments and omitted herein.

In another embodiment, the keyswitch provided by the present invention can include the cap, the base, the resilient arm, the internal sleeve, the elastic member, and the external sleeve. The internal sleeve jackets a positioning structure (e.g. the pillar) of the base, and an upper end of the internal sleeve abuts against the cap. The internal sleeve has the first outer annular surface. A guide slot (e.g. the transverse slot) is formed on the first outer annular surface. The external sleeve has the second outer annular surface and the inner annular surface. The external sleeve jackets the internal sleeve via the inner annular surface. The second outer annular surface has a first large radius portion, a first small radius portion, a second large radius portion, and a second small radius portion (e.g. the first convex portion, the first concave portion, the second convex portion, and the second concave portion). The inner annular surface has the protruding block movably inserted into the guide slot for guiding the external sleeve to rotate around the Z-axis. The external sleeve can move upward and downward along the Z-axis between the high position and the low position. When the external sleeve is located at the high position, the resilient arm can selectively abut against the first large radius portion or the second large radius portion.

In such a manner, when the resilient arm abuts against the first large radius portion and the cap is pressed to move the external sleeve downward, the resilient arm moves from the first large radius portion to the first small radius portion along a first path (e.g. the first transition portion) to make the first path interact with the resilient arm for generating a first tactile feedback (e.g. a tactile feedback that the cap is triggered at the relatively high triggering position during the user presses the cap). When the resilient arm abuts against the second large radius portion and the cap is pressed to move the external sleeve downward, the resilient arm moves from the second large radius portion to the second small radius portion along a second path (e.g. the second transition portion), so as to make the second path interact with the resilient arm for generating a second tactile feedback (e.g. a tactile feedback that the cap is triggered at the relatively low triggering position during the user presses the cap). The first path is different from the second path to make the first tactile feedback different from the second tactile feedback.

On the other hand, when the cap is released, the elastic member drives the internal sleeve to move upward relative to the positioning structure with the external sleeve, to make the resilient arm move back to abut against the first large radius portion or the second large radius portion. As for the related description for other mechanical designs (e.g. disposal of the linkage mechanism, the design for assembling the cap with the external sleeve, etc.) and other derived embodiments (e.g. the design that the resilient arm crosses the arc-shaped bar for generating a clicky tactile feedback, the design that the external sleeve collides with the internal sleeve for making a clicky sound, etc.), it can be reasoned by analogy according to the aforesaid embodiments and omitted herein.

Compared with the prior art only providing one single kind of tactile feedback without a tactile feedback adjusting function, the present invention adopts the design that the sleeve can rotate relative to the base for performing the tactile feedback adjustment operation of the keyswitch to generate the inventive effect that the user can switch the keyswitch to provide a desired tactile feedback, so as to greatly improve flexibility and convenience of the mechanical keyswitch structure in use.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyswitch comprising:
   a cap;
   a base having a pillar extending along a Z-axis, the Z-axis, an X-axis and a Y-axis being perpendicular to each other;
   a resilient arm adjacent to the pillar;
   an internal sleeve jacketing the pillar and having a first outer annular surface, a top end of the internal sleeve abutting against the cap, a transverse slot being formed on the first outer annular surface and extending substantially along a plane containing the X-axis and the Y-axis;
   an elastic member disposed between the internal sleeve and the base for driving the internal sleeve to move away from the base; and
   an external sleeve having a second outer annular surface and an inner annular surface and jacketing the internal sleeve via the inner annular surface, the second outer annular surface having a convex portion, a concave portion, and a first arc-shaped bar, the convex portion, the concave portion, and the first arc-shaped bar extending substantially along the plane containing the X-axis and the Y-axis, a protruding block being formed on the inner annular surface and being movably inserted into the transverse slot for guiding the external sleeve to rotate around the Z-axis to make the resilient arm selectively abutting against a first position or a second position on the convex portion, the first arc-shaped bar extending above the second position without extending above the first position;
   wherein when the resilient arm initially abuts against the second position and the cap is pressed, the cap makes the external sleeve move downward along the Z-axis, and then the resilient arm needs to cross the first arc-shaped bar as the resilient arm moves from the second position to the concave portion;
   when the resilient arm initially abuts against the first position and the cap is pressed, the cap makes the external sleeve move downward along the Z-axis, and then the resilient arm does not need to cross the first arc-shaped bar during movement of the resilient arm from the first position to the concave portion;
   when the cap is released, the elastic member drives the internal sleeve to move upward, and the internal sleeve makes the external sleeve move upward simultaneously to make a location where the resilient arm abuts against the external sleeve return to one of the first position and the second position.

2. The keyswitch of claim 1, wherein a cap engaging structure is formed under the cap, an upper engaging structure is formed on the external sleeve, when the cap engaging structure is engaged with the upper engaging structure, the internal sleeve and the external sleeve are capable of moving relative to each other along the Z-axis, but the relative movement between the internal sleeve and the external sleeve substantially along the plane containing the X-axis and the Y-axis is constrained.

3. The keyswitch of claim 2, wherein the cap engaging structure is a first annular comb structure protruding downward from the cap, the upper engaging structure is a second annular comb structure protruding upward from the external sleeve, and when the first annular comb structure is engaged with the second annular comb structure, the first annular comb structure and the second annular comb structure are movable relatively along the Z-axis.

4. The keyswitch of claim 1, wherein a longitudinal slot is formed on the first outer annular surface, the longitudinal slot has a top portion and a bottom portion, the top portion of the longitudinal slot is interconnected with the transverse slot, the first arc-shaped bar has a bottom edge surface and an upper edge surface; when the resilient arm initially abuts against the second position and then the cap moves the external sleeve downward, the resilient arm moves to abut against the bottom edge surface to make the protruding block temporarily abut against the top portion of the longitudinal slot; when the resilient arm crosses the first arc-shaped bar to abut against the upper edge surface, the resilient arm moves the external sleeve downward to collide with the bottom portion of the longitudinal slot for making a sound.

5. The keyswitch of claim 1, wherein the internal sleeve has a first mark and a second mark, the external sleeve has a third mark; when the third mark is aligned with the first mark, it indicates the resilient arm abuts against the first position; and when the third mark is aligned with the second mark, it indicates the resilient arm abuts against the second position.

6. The keyswitch of claim 1 further comprising:
a linkage mechanism connected to the external sleeve and movably disposed on the base for driving the external sleeve to rotate on the pillar around the Z-axis to make the resilient arm selectively abut against the first position or the second position;
wherein the linkage mechanism comprises a linkage member and a sliding plate slidable relative to the base, and the linkage member extends outwardly from the second outer annular surface of the external sleeve to be movably connected to the sliding plate;
when the sliding plate slides relative to the base, the linkage member swings with sliding of the sliding plate to drive the external sleeve to rotate on the pillar around the Z-axis to make the resilient arm selectively abut against the first position or the second position.

7. A keyswitch comprising:
a cap;
a base having a pillar, a top surface, and a first block, the pillar extending along a Z-axis, the first block being adjacent to the pillar and being higher than the top surface along the Z-axis, the Z-axis, an X-axis and a Y-axis being perpendicular to each other;
a resilient arm adjacent to the pillar;
an internal sleeve jacketing the pillar, an upper end of the internal sleeve abutting against the cap, the internal sleeve having a first outer annular surface, a transverse slot being formed on the first outer annular surface and extending substantially along a plane containing the X-axis and the Y-axis;
an elastic member disposed between the internal sleeve and the base for driving the internal sleeve to move away from the base; and
an external sleeve having a second outer annular surface and an inner annular surface and jacketing the internal sleeve via the inner annular surface, a bottom end of the external sleeve having a bottom annular edge, a protruding point extending from the bottom annular edge toward the base, the second outer annular surface having a convex portion and a concave portion, the convex portion and the concave portion extending substantially along the plane containing the X-axis and the Y-axis, a protruding block being formed on the inner annular surface and being movably inserted into the transverse slot for guiding the external sleeve to rotate around the Z-axis to make the protruding block selectively located above the first block or the top surface;
wherein when the protruding point is located above the first block and the cap is pressed, the protruding block makes the external sleeve move downward with the internal sleeve until the protruding point abuts against the first block so that a maximum movable distance of the cap along the Z-axis is set as a first travel distance;
when the protruding point is located above the top surface and the cap is pressed, the protruding block makes the external sleeve move downward with the internal sleeve until the protruding point abuts against the top surface so that the maximum movable distance of the cap along the Z-axis is set as a second travel distance larger than the first travel distance;
when the cap is released, the elastic member drives the internal sleeve to move upward with the external sleeve along the Z-axis relative to the pillar to make the cap move upward.

8. The keyswitch of claim 7, wherein the internal sleeve has a first mark and a second mark, the external sleeve has a third mark for aligning with the first mark to guide the external sleeve and the internal sleeve to rotate relatively to make the protruding point located above the first block and aligning with the second mark to guide the external sleeve and the internal sleeve to rotate relatively to make the protruding point located above the top surface.

9. The keyswitch of claim 7, wherein a cap engaging structure is formed under the cap, an upper engaging structure is formed on the external sleeve, and the internal sleeve and the external sleeve are movable relatively along the Z-axis and relative movement between the internal sleeve and the external sleeve substantially along the plane containing the X-axis and the Y-axis is constrained after the cap engaging structure is engaged with the upper engaging structure.

10. The keyswitch of claim 9, wherein the cap engaging structure is a first annular comb structure protruding downward from the cap, the upper engaging structure is a second annular comb structure protruding upward from the external sleeve, and when the first annular comb structure is engaged with the second annular comb structure, the first annular comb structure and the second annular comb structure are movable relatively along the Z-axis.

11. The keyswitch of claim 7 further comprising:
a linkage mechanism connected to the external sleeve and movably disposed on the base for driving the external sleeve to rotate on the pillar around the Z-axis to make the protruding point selectively located above the first block or the top surface;
wherein the linkage mechanism comprises a linkage member and a sliding plate slidable relative to the base, and the linkage member extends outwardly from the second outer annular surface of the external sleeve to be movably connected to the sliding plate;
when the sliding plate slides relative to the base, the linkage member swings with sliding of the sliding plate to drive the external sleeve to rotate on the pillar around the Z-axis to make the protruding point selectively located above the first block or the top surface.

12. The keyswitch of claim 7, wherein the base further has a second block, the second block protrudes from the top surface of the base and is adjacent to the pillar, the second block is higher than the first block along the Z-axis, and the protruding block guides the external sleeve to rotate around the Z-axis to make the protruding point selectively located above the second block; when the protruding point is located above the second block, the protruding block makes the external sleeve move downward with the internal sleeve until the protruding point abuts against the second block, so that the maximum movable distance of the cap along the Z-axis is set as a third travel distance less than the first travel distance.

13. A keyswitch comprising:
a cap;
a base having a pillar extending along a Z-axis, the Z-axis, an X-axis and a Y-axis being perpendicular to each other;
a switch unit adjacent to the pillar, the switch unit having a resilient arm and a contact point opposite to the resilient arm, the contact point and the resilient arm extending toward the cap respectively, the switch unit being electrically connected to a circuit board;
an internal sleeve jacketing the pillar, an upper end of the internal sleeve abutting against the cap, the internal sleeve having a first outer annular surface, a transverse slot being formed on the first outer annular surface and extending substantially along a plane containing the X-axis and the Y-axis;
an elastic member disposed between the internal sleeve and the base for driving the internal sleeve to move away from the base; and
an external sleeve having a second outer annular surface and an inner annular surface and jacketing the internal sleeve via the inner annular surface, the second outer annular surface having a first convex portion, a first concave portion, a second convex portion, a second concave portion, a first transition portion, and a second transition portion higher than the first transition portion along the Z-axis, the first convex portion, the first transition portion and the first concave portion being arranged from down to up along the Z-axis, the second convex portion, the second transition portion and the second concave portion being arranged from down to up along the Z-axis, a protruding block being formed on the inner annular surface and being movably inserted into the transverse slot for guiding the external sleeve to rotate around the Z-axis to make the resilient arm selectively abutting against the first convex portion or the second convex portion;
wherein when the resilient arm abuts against the first convex portion and the cap is pressed, the protruding block makes the external sleeve move downward with the internal sleeve to make the resilient arm move from the first convex portion to the first concave portion along the first transition portion for reducing deformation of the resilient arm to make the resilient arm be located at a first triggering position for triggering the contact point;
when the resilient arm abuts against the second convex portion and the cap is pressed, the protruding block makes the external sleeve move downward with the internal sleeve to make the resilient arm move from the second convex portion to the second concave portion along the second transition portion for reducing deformation of the resilient arm to make the resilient arm be located at a second triggering position for triggering the contact point;
when the cap is released, the elastic member drives the internal sleeve to move upward with the external sleeve relative to the pillar to make the resilient arm abut against the first convex portion or the second convex portion to be separate from the contact point.

14. The keyswitch of claim 13, wherein the internal sleeve has a first mark and a second mark, the external sleeve has a third mark for aligning with the first mark to guide the external sleeve and the internal sleeve to rotate relatively to make the resilient arm abut against the first convex portion and aligning with the second mark to guide the external sleeve and the internal sleeve to rotate relatively to make the resilient arm abut against the second convex portion.

15. The keyswitch of claim 13, wherein a cap engaging structure is formed under the cap, an upper engaging structure is formed on the external sleeve, and the internal sleeve and the external sleeve are movable relatively along the Z-axis and relative movement between the internal sleeve and the external sleeve along the plane containing the X-axis and the Y-axis is constrained after the cap engaging structure is engaged with the upper engaging structure.

16. The keyswitch of claim 15, wherein the cap engaging structure is a first annular comb structure protruding downward from the cap, the upper engaging structure is a second annular comb structure protruding upward from the external sleeve, and when the first annular comb structure is engaged with the second annular comb structure, the first annular comb structure and the second annular comb structure are movable relatively along the Z-axis.

17. The keyswitch of claim 13 further comprising:
a linkage mechanism connected to the external sleeve and movably disposed on the base for driving the external sleeve to rotate on the pillar around the Z-axis to make the resilient arm selectively abut against the first convex portion or the second convex portion;
wherein the linkage mechanism comprises a linkage member and a sliding plate slidable relative to the base, and the linkage member extends outwardly from the second outer annular surface of the external sleeve to be movably connected to the sliding plate;
when the sliding plate slides relative to the base, the linkage member swings with sliding of the sliding plate to drive the external sleeve to rotate on the pillar around the Z-axis to make the resilient arm selectively abut against the first convex portion or the second convex portion.

18. A keyswitch comprising:
a cap;
a base having a pillar extending along a Z-axis, the Z-axis, an X-axis and a Y-axis being perpendicular to each other;
a resilient arm adjacent to the pillar;
an internal sleeve jacketing the pillar, an upper end of the internal sleeve abutting against the cap, the internal sleeve having a first outer annular surface, an oblique slot being formed on the first outer annular surface and having a first slot section and a second slot section higher than the first slot section along the Z-axis;
an elastic member disposed between the internal sleeve and the base for driving the internal sleeve to move away from the base; and
an external sleeve having a second outer annular surface and an inner annular surface and jacketing the internal sleeve via the inner annular surface, the second outer annular surface having a convex portion and a concave portion, a protruding block being formed from the external sleeve toward the oblique slot and being movably inserted into the oblique slot for guiding the external sleeve to rotate around the Z-axis to make the resilient arm selectively abutting against a first position or a second position on the convex portion;

wherein when the resilient arm abuts against the first position, the protruding block is located at the first slot section to make the internal sleeve prepress the elastic member at a first length for generating a first preload, and when the cap is pressed along the Z-axis to move the external sleeve downward with the internal sleeve via the protruding block, the resilient arm moves from the first position to the concave portion;

when the resilient arm abuts against the second position, the protruding block is located at the second slot section to make the internal sleeve prepress the elastic member at a second length for generating a second preload, the first length is larger than the second length to make the first preload smaller than the second preload, and when the cap is pressed along the Z-axis to move the external sleeve downward with the internal sleeve via the protruding block, the resilient arm moves from the second position to the concave portion;

when the cap is released, the elastic member drives the internal sleeve to move upward with the external sleeve relative to the pillar, so as to make the resilient arm abut against the first position or the second position on the convex portion.

19. The keyswitch of claim 18, wherein the internal sleeve has a first mark and a second mark, the external sleeve has a third mark for aligning with the first mark to guide the external sleeve and the internal sleeve to rotate relatively to make the protruding point located above the first block and aligning with the second mark to guide the external sleeve and the internal sleeve to rotate relatively to make the protruding point located above the top surface.

20. The keyswitch of claim 18, wherein a cap engaging structure is formed under the cap, an upper engaging structure is formed on the external sleeve, and the internal sleeve and the external sleeve are movable relatively along the Z-axis and relative movement between the internal sleeve and the external sleeve along the plane containing the X-axis and the Y-axis is constrained after the cap engaging structure is engaged with the upper engaging structure.

21. The keyswitch of claim 20, wherein the cap engaging structure is a first annular comb structure protruding downward from the cap, the upper engaging structure is a second annular comb structure protruding upward from the external sleeve, and when the first annular comb structure is engaged with the second annular comb structure, the first annular comb structure and the second annular comb structure are movable relatively along the Z-axis.

22. The keyswitch of claim 18 further comprising:
a linkage mechanism connected to the external sleeve and movably disposed on the base for driving the external sleeve to rotate on the pillar around the Z-axis to make the resilient arm selectively abut against the first position or the second position on the convex portion;
wherein the linkage mechanism comprises a linkage member and a sliding plate slidable relative to the base, and the linkage member extends outwardly from the second outer annular surface of the external sleeve to be movably connected to the sliding plate;
when the sliding plate slides relative to the base, the linkage member swings with sliding of the sliding plate to drive the external sleeve to rotate on the pillar around the Z-axis, so as to make the resilient arm selectively abut against the first position or the second position on the convex portion.

23. A keyswitch comprising:
a cap;
a base having a pillar extending along a Z-axis, the Z-axis, an X-axis and a Y-axis being perpendicular to each other;
a resilient arm adjacent to the pillar;
an internal sleeve jacketing the pillar, an upper end of the internal sleeve abutting against the cap, the internal sleeve having a first outer annular surface, a transverse slot and a longitudinal slot being formed on the first outer annular surface, the transverse slot extending substantially along a plane containing the X-axis and the Y-axis, the longitudinal slot having a top portion and a bottom portion, the top portion of the longitudinal slot being interconnected with the transverse slot;
an elastic member disposed between the internal sleeve and the base for driving the internal sleeve to move away from the base; and
an external sleeve having a second outer annular surface and an inner annular surface and jacketing the internal sleeve via the inner annular surface, the second outer annular surface having a convex portion, a concave portion, and an arc-shaped bar, the convex portion, the concave portion, and the arc-shaped bar extending substantially along the plane containing the X-axis and the Y-axis, a protruding block being formed on the inner annular surface and being movably inserted into the transverse slot for guiding the external sleeve to rotate on the pillar around the Z-axis so as to make the resilient arm selectively abut against a first position or a second position on the convex portion, the arc-shaped bar extending above the second position and having a bottom edge surface and an upper edge surface;
wherein when the resilient arm abuts against the first position and the cap is pressed to move the external sleeve downward along the Z-axis, the protruding block is located in the transverse slot to make the external sleeve and the internal sleeve move downward during the resilient arm moves from the first position to the concave portion, so as to prevent the external sleeve from colliding with the internal sleeve to make a sound;
when the resilient arm abuts against the second position and the cap is pressed to move the external sleeve downward along the Z-axis, the resilient arm abuts against the bottom edge surface to make the protruding block abut against the top portion of the longitudinal slot;
when the resilient arm crosses the arc-shaped bar to abut against the upper edge surface, the resilient arm moves the external sleeve downward to collide with the bottom portion of the longitudinal slot for making a sound;
when the cap is released, the elastic member drives the internal sleeve to move upward with the external sleeve relative to the pillar, so as to make the resilient arm abut against the first position or the second position on the convex portion.

24. A keyswitch comprising:
a cap;
a base having a positioning structure extending along a Z-axis, the Z-axis, an X-axis and a Y-axis being perpendicular to each other;
a resilient arm adjacent to the positioning structure;

an internal sleeve jacketing the positioning structure, an upper end of the internal sleeve abutting against the cap, the internal sleeve having a first outer annular surface, a guide slot being formed on the first outer annular surface;

an elastic member disposed between the internal sleeve and the base for driving the internal sleeve to move away from the base; and an external sleeve having a second outer annular surface and an inner annular surface and jacketing the internal sleeve via the inner annular surface to be movable upward and downward between a high position and a low position along the Z-axis, the second outer annular surface having a first large radius portion, a first small radius portion, a second large radius portion, and a second small radius portion, a protruding block being formed on the inner annular surface and being movably inserted into the guide slot for guiding the external sleeve to rotate on the pillar around the Z-axis, the resilient arm selectively abutting against the first large radius portion or the second large radius portion when the external sleeve is located at the high position;

wherein when the resilient arm abuts against the first large radius portion and the cap is pressed to move the external sleeve downward along the Z-axis, the resilient arm moves from the first large radius portion to the first small radius portion along a first path and the first path interacts with the resilient arm to generate a first tactile feedback;

when the resilient arm abuts against the second large radius portion and the cap is pressed to move the external sleeve downward along the Z-axis, the resilient arm moves from the second large radius portion to the second small radius portion along a second path and the second path interacts with the resilient arm to generate a second tactile feedback, and the second path is different from the first path to make the first tactile feedback different from the second tactile feedback;

when the cap is released, the elastic member drives the internal sleeve to move upward relative to the positioning structure along the Z-axis, so as to make the resilient arm move back to abut against the first large radius portion or the second large radius portion.

* * * * *